United States Patent
Horie et al.

(10) Patent No.: US 9,711,681 B2
(45) Date of Patent: *Jul. 18, 2017

(54) NITRIDE SEMICONDUCTOR

(71) Applicant: MITSUBISHI CHEMICAL CORPORATION, Chiyoda-ku (JP)

(72) Inventors: Hideyoshi Horie, Yokkaichi (JP); Kaori Kurihara, Ushiku (JP)

(73) Assignee: MITSUBISHI CHEMICAL CORPORATION, Chiyoda-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/921,570

(22) Filed: Oct. 23, 2015

(65) Prior Publication Data

US 2016/0043273 A1 Feb. 11, 2016

Related U.S. Application Data

(63) Continuation of application No. 14/087,855, filed on Nov. 22, 2013, now abandoned, which is a
(Continued)

(30) Foreign Application Priority Data

Nov. 20, 2008 (JP) .................................. 2008-297177

(51) Int. Cl.
*H01L 33/06* (2010.01)
*H01L 33/32* (2010.01)
(Continued)

(52) U.S. Cl.
CPC .......... *H01L 33/06* (2013.01); *H01L 21/0254* (2013.01); *H01L 21/0262* (2013.01);
(Continued)

(58) Field of Classification Search
CPC .................................................. H01L 21/0254
See application file for complete search history.

(56) References Cited

U.S. PATENT DOCUMENTS

| 5,253,262 A | 10/1993 | Kurobe et al. |
| 7,208,393 B2 | 4/2007 | Haskell et al. |

(Continued)

FOREIGN PATENT DOCUMENTS

| EP | 2 043 167 | 4/2009 |
| JP | 04-273492 | 9/1992 |

(Continued)

OTHER PUBLICATIONS

International Search Report issued Feb. 9, 2010 in PCT/JP09/069646 filed Jan. 29, 2010.
(Continued)

*Primary Examiner* — Fernando L Toledo
*Assistant Examiner* — Valerie N Newton
(74) *Attorney, Agent, or Firm* — Oblon, McClelland, Maier & Neustadt, L.L.P.

(57) ABSTRACT

To provide a high-quality nitride semiconductor ensuring high emission efficiency of a light-emitting element fabricated. In the present invention, when obtaining a nitride semiconductor by sequentially stacking a one conductivity type nitride semiconductor part, a quantum well active layer structure part, and a another conductivity type nitride semiconductor part opposite the one conductivity type, the crystal is grown on a base having a nonpolar principal nitride surface, the one conductivity type nitride semiconductor part is formed by sequentially stacking a first nitride semiconductor layer and a second nitride semiconductor layer, and the second nitride semiconductor layer has a thickness of 400 nm to 20 μm and has a nonpolar outermost surface. By virtue of selecting the above-described base for crystal
(Continued)

growth, an electron and a hole, which are contributing to light emission, can be prevented from spatial separation based on the QCSE effect and efficient radiation is realized. Also, by setting the thickness of the second nitride semiconductor layer to an appropriate range, the nitride semiconductor surface can avoid having extremely severe unevenness.

14 Claims, 38 Drawing Sheets

Related U.S. Application Data continuation of application No. 13/112,564, filed on May 20, 2011, now Pat. No. 8,624,220, which is a continuation of application No. PCT/JP2009/069646, filed on Nov. 19, 2009.

(51) Int. Cl.
*H01L 33/00* (2010.01)
*H01L 33/18* (2010.01)
H01L 21/02 (2006.01)
H01L 33/02 (2010.01)
H01L 33/16 (2010.01)

(52) U.S. Cl.
CPC .... *H01L 21/02609* (2013.01); *H01L 33/0025* (2013.01); *H01L 33/18* (2013.01); *H01L 33/32* (2013.01); *H01L 33/325* (2013.01); H01L 21/0237 (2013.01); H01L 21/02573 (2013.01); H01L 33/02 (2013.01); H01L 33/16 (2013.01)

(56) References Cited

U.S. PATENT DOCUMENTS

2009/0189186 A1   7/2009   Tanabe et al.

| | | |
|---|---|---|
| 2010/0207136 A1 | 8/2010 | Armitage et al. |
| 2010/0244087 A1 | 9/2010 | Horie et al. |
| 2010/0252835 A1 | 10/2010 | Horie et al. |

FOREIGN PATENT DOCUMENTS

| | | |
|---|---|---|
| JP | 2005-311072 | 11/2005 |
| JP | 2005-347494 | 12/2005 |
| JP | 2007-067454 | 3/2007 |
| JP | 2007-201019 | 8/2007 |
| JP | 2008-078613 | 4/2008 |
| JP | 2008-235803 | 10/2008 |
| WO | 2008/047907 | 4/2008 |
| WO | 2008/126695 | 10/2008 |
| WO | 2009/066464 A9 | 5/2009 |
| WO | 2009/066466 A1 | 5/2009 |

OTHER PUBLICATIONS

K. Nishizuka, et al., "Mechanism of efficient photoluminescence from InGaN single quantum well grown on non-polar M-plane GaN template", Preprints of the 66$^{th}$ Academic Lecture Meeting of the Japan Society of Applied Physics, 11p-N-4, Autumn 2005, 1 page.
C. D. Lee, et al., "Morphology and surface reconstructions of GaN(1100) surfaces", Applied Physics Letters, vol. 82, No. 11, Mar. 17, 2003, pp. 1793-1795.
Colin J. Humphreys, et al., "Applications, Environmental Impact and Microstructure of Light-Emitting Diodes", Microscopy and Analysis, Nov. 2007, pp. 5-8.
Koh Saitoh, "High-resolution Z-contrast Imaging by the HAADF-STEM Method", J. Cryst. Soc. Japan, vol. 47, No. 1, 2005, pp. 9-14 (with English Abstract).
Kazuto Watanabe, "Imaging in High Resolution HAADF-STEM", J. Cryst. Soc. Japan, vol. 47, No. 1, 2005, pp. 15-19 (with English Abstract).
Hajime Matsumoto, et al., "Growth Behaviour of Athermal ω-Phase Crystals in a Ti-15mass%Mo Alloy Studied by In-situ Dark Field and High Resolution Electron Microscopy", Materials Transactions, JIM, vol. 40, No. 12, Dec. 1999, pp. 1436-1443.
Japanese Office Action with English language translation, issued Sep. 24, 2013, in Japanese Patent Application No. 2008-297177.

NITRIDE SEMICONDUCTOR

CROSS REFERENCE TO RELATED APPLICATION

This application is a continuation of U.S. application Ser. No. 14/087,855, filed on Nov. 22, 2013, which is a continuation of U.S. application Ser. No. 13/112,564, filed on May 20, 2011, which is a continuation of PCT/JP2009/069646, filed on Nov. 19, 2009, and claims priority to Japanese patent application 2008-297177, filed on Nov. 20, 2008.

TECHNICAL FIELD

The present invention relates to a high-quality nitride semiconductor excellent in the surface conditions and optical characteristics.

BACKGROUND ART

A blue light-emitting element or an ultraviolet light-emitting element can be used as a white light source by combining it with an appropriate wavelength conversion material. Studies are being aggressively made on the application of such a white light source to, for example, backlight for liquid crystal displays and the like, light-emitting diode illumination, automotive lighting or general lighting to replace a fluorescent lamp, and some of these applications have already been put into practical use. At present, the blue light-emitting element or ultraviolet light-emitting element is produced predominantly by growing a gallium nitride-based semiconductor crystal thin film according to a metal-organic chemical vapor deposition method (MOCVD method), a molecular beam epitaxy method (MBE method) or the like technique, and these elements are collectively referred to as a gallium nitride-based light-emitting diode or a GaN-based LED.

Conventionally, most of the substrates used for the GaN-based LED are a sapphire substrate. Sapphire and GaN greatly differ in the lattice constant and therefore, a considerable number of dislocations on the order of $10^9/cm^2$ are unavoidably introduced into a GaN crystal obtained by epitaxial growth on a sapphire substrate. However, the sapphire substrate is inexpensive compared with a SiC substrate and a GaN substrate and is advantageous. Moreover, the emission efficiency of InGaN in the blue light-emitting region usually used as a quantum well layer of the GaN-based LED is not so much sensitive to the dislocation density. For this reason, the sapphire substrate is currently still a predominant substrate.

However, when the gallium nitride-based semiconductor crystal is viewed as a material for devices used in a high carrier density condition, the above-described high dislocation density incurs serious deterioration of the device characteristics. For example, in a device such as high-power LED or laser, the high dislocation density extremely reduces the device life. Also, when the active layer structure contains absolutely no In (for example, in the case of using an AlGaN layer as the active layer) or when the active layer structure contains an InGaN or InAlGaN layer having the In composition in a relatively small ratio (for example, about 0.2 or less) so as to realize light emission at a short wavelength of approximately the near ultraviolet region or less, the dislocation density dependency of the internal quantum efficiency is increased and if the dislocation density is high, the emission intensity itself decreases.

That is, in the case where the active layer structure does not contain In at all or contains an InGaN or InAlGaN layer relatively small in the In composition, demands for a low dislocation density are strict compared with a case of containing an InGaN layer having a long emission wavelength of blue or more in the active layer structure.

For achieving such a low dislocation density, it is effective to use a GaN substrate as the substrate for epitaxial growth. Use of this substrate is expected to reduce the dislocation density observed in the epitaxial layer to $10^8/cm^2$ or less, or $10^7/cm^2$ or less. Also, when the dislocation or the like of, for example, the substrate is reduced, this is expected to enable realizing a dislocation density as low as $10^6/cm^2$ or less. That is, reduction in the dislocation density by two orders or three or more orders of magnitude is expected to be achieved as compared with a case of using a sapphire substrate. For these reasons, a standing GaN substrate and a standing AlN substrate are suitable as the substrate for epitaxial growth of a gallium nitride-based semiconductor crystal.

In most of conventional attempts to epitaxially grow a gallium nitride-based semiconductor crystal on a GaN substrate that is a nitride substrate, epitaxial growth is effected on a substrate with the epitaxial growth surface being c-plane (that is, (0001) plane), in other words, on a "polar plane". Examples of reports thereon include Patent Document 1 (JP-A-2005-347494 (the term "JP-A" as used herein means an "unexamined published Japanese patent application")), Patent Document 2 (JP-A-2005-311072) and Patent Document 3 (JP-A-2007-67454).

Patent Document 1 discloses a technique where a nitride substrate ((0001)-plane GaN substrate) with a polar plane is used as the substrate for epitaxial growth of a GaN layer, the GaN substrate is cleaned by setting the pressure in the furnace to 30 kilopascals, a 1 μm-thick first n-type GaN buffer layer is grown at a substrate temperature of 1,050° C. while keeping the pressure in the furnace at 30 kilopascals, and after once stopping the supply of raw materials, a 1 μm-thick second n-type GaN buffer layer is further formed by heating the substrate until the substrate temperature reaches 1,100° C. while keeping the pressure in the furnace at 30 kilopascals. This crystal growth method is supposed to provide a semiconductor apparatus having a buffer layer with excellent surface flatness and good crystal quality.

Patent Document 2 discloses an invention of a light-emitting element produced by a method where after a step of removing contamination such as organic material or moisture attached to the surface of a GaN substrate under a flow of hydrogen gas, nitrogen gas and ammonia gas and simultaneously enhancing the surface crystallinity of the substrate, a multilayer structure intermediate layer composed of GaN and InGaN layers is formed on the GaN substrate while flowing nitrogen gas and hydrogen gas, and a reflective layer, an active layer and a gallium nitride-based semiconductor layer are formed on the intermediate layer.

Patent Document 3 discloses in Example 26 an invention of a laser element where a 3 μm-thick Si-doped n-type GaN buffer layer is formed on a GaN substrate and a stack structure is built on the n-type GaN buffer layer. Incidentally, it is stated that a buffer layer of 300 Å or less formed at a low temperature of about 500° C. may be provided between the n-type GaN buffer layer and the GaN substrate.

However, the surface flatness and optical characteristics of the nitride semiconductor crystal obtained by epitaxial growth on a substrate with the principal surface being a polar plane are insufficient, and more studies on the growth conditions are demanded. In addition, a problem inevitably caused by the selection of a polar plane as the growth substrate is also recognized. For example, there is known a problem that in a quantum well active layer structure (for example, a quantum well active layer structure composed of InGaN/GaN) formed on the c+-plane of a hexagonal system including a c-plane GaN substrate, so-called quantum-confined Stark effect (QCSE) causes reduction in the recombination probability between an electron and a hole and the emission efficiency becomes lower than ideal.

Under these circumstances, an attempt to produce a quantum well active layer structure on a substrate with the principal surface being a nonpolar plane is made, but epitaxial growth on the a-plane, r-plane or m-plane, which are a nonpolar plane of a hexagonal III-V nitride crystal, is difficult, and a high-quality hexagonal III-V nitride semiconductor stack structure is not obtained particularly on the m-plane at present.

For example, Non-Patent Document 1 states that "with respect to the nonpolar m-plane, growth is difficult", and on the premise of this difficulty, a special crystal growth method is reported, where a GaN substrate with the principal surface being c-plane is worked in a striped fashion to expose the m-plane as a side wall and a nitride semiconductor crystal is epitaxially grown on the striped side wall surface (m-plane).

Also, Non-Patent Document 2 reports that a GaN layer was grown on a ZnO substrate with the principal surface being m-plane by a plasma-assisted MBE (Molecular Beam Epitaxy) method. However, it is stated that the obtained GaN layer was "slate-like", where the surface unevenness was severe and a single-crystal GaN layer was not obtained.

Furthermore, Patent Document 4 states that in the case of growing a nitride semiconductor crystal on an m-plane substrate, defects are readily generated in the growth initiating interface, and the following technique is described as a technique for reducing the defects. First, a GaN buffer is grown on an m-plane substrate by an H-VPE (Hydride Vapor Phase Epitaxy) method, and the substrate is once taken out of the reacting furnace to form a dielectric mask which is processed in a striped fashion. Then, using the substrate with the formed mask as a new substrate, an epitaxial film is formed by the MOCVD method and flattened through lateral growth (called LEO or ELO growth) from openings of the striped mask.

RELATED ART

Patent Document

Patent Document 1: JP-A-2005-347494
Patent Document 2: JP-A-2005-311072
Patent Document 3: JP-A-2007-67454
Patent Document 4: U.S. Pat. No. 7,208,393

Non-Patent Document

Non-Patent Document 1: Preprints of the 66th Academic Lecture Meeting of the Japan Society of Applied Physics (Autumn 2005), 11p-N-4
Non-Patent Document 2: *Appl. Phys. Lett.*, Vol. 82, No. 11, pp. 1793-1795 (Mar. 17, 2003)
Non-Patent Document 3: C. J. Humphreys et al., "Applications Environmental Impact and Microstructure of Light-Emitting Diodes", *MICROSCOPY AND ANALYSIS*, pp. 5-8 (November, 2007)
Non-Patent Document 4: K. SAITOH, "High-resolution Z-contrast Imaging by the HAADF-STEM Method", *J. Cryst. Soc. Jpn.*, 47(1), 9-14 (2005)
Non-Patent Document 5: K. WATANABE; "Imaging in High Resolution HAADF-STEM", *J. Cryst. Soc. Jpn.*, 47(1), 15-19 (2005)
Non-Patent Document 6: H. Matsumoto, et. al., *Material Transactions, JIM* 40, 1999, pp. 1436-1443

SUMMARY OF THE INVENTION

Problems that the Invention is to Solve

According to the studies by the present inventors, it is confirmed that when the crystal growth method on a c-plane GaN substrate described in the patent documents above on the premise of growth on a polar plane is applied to the crystal growth on a nonpolar plane, a nitride semiconductor with excellent surface flatness can be hardly obtained and moreover, the optical characteristics of the obtained film are utterly insufficient.

Describing the conventional crystal growth method on a nonpolar plane, in the technique of Non-Patent Document 1, a nitride semiconductor crystal on a nonpolar plane can be obtained only in a width of usually few microns on the side wall of a stripe mesa, and large-area growth is extremely difficult, resulting in imposing great restrictions on the fabrication of a device. On the other hand, in the technique of Non-Patent Document 2, although large-area growth is possible, the surface of the obtained nitride semiconductor film exhibits a morphology with severe unevenness and a single-crystal layer cannot be obtained. Furthermore, the technique of Patent Document 4 has a problem that the process is complicated and a location with a large number of defects and a location with a small number of defects are mixed in relation to locations of the underlying stripe.

The present invention has been made in consideration of these problems, and an object of the present invention is to provide a high-quality nitride semiconductor using a nonpolar plane as the growth surface and ensuring good optical characteristics and high emission efficiency of a light-emitting element fabricated.

Means for Solving the Problems

As a result of intensive studies, the present inventors have found that when a specific nitride semiconductor layer is stacked to a specific thickness on a principal nitride surface of a base that is nonpolar nitride, the above-described object can be achieved. Moreover, it has been found that the nitride semiconductor layer having such a structure can prevent the surface from becoming a nitride semiconductor surface with severe unevenness and at the same time, even when a surface imparted with unevenness is formed in a self-forming manner during epitaxial growth so as to enhance the light extraction efficiency of a device fabricated, as long as the unevenness is in an appropriate level, the nitride semiconductor layer can realize a good internal quantum efficiency in the quantum well structure part. Such a technical idea overturns the conventional technical ideas aiming at good surface morphology, and this is a great characteristic feature of the present invention.

That is, the nitride semiconductor of the present invention is a nitride semiconductor comprising: a one conductivity type nitride semiconductor part; a quantum well active layer structure part; and a another conductivity type nitride semiconductor part opposite to said one conductivity type, which are stacked in this order on a nitride principal surface of a base having nonpolar nitride at least on one of principal surface, wherein said one conductivity type nitride semiconductor part comprises a first nitride semiconductor layer and a second nitride semiconductor layer, which are stacked in this order, and said second nitride semiconductor layer has a thickness of 400 nm to 20 µm and has a substantially nonpolar outermost surface.

The first nitride semiconductor layer and the second nitride semiconductor layer preferably differ from each other in the composition.

The base is, for example, a self-supporting substrate comprising GaN, AlN, InN, BN or a mixed crystal thereof. The nitride on the principal surface in the base is, for example, a GaN film, an AlN film, an InN film, a BN film or a mixed crystal film thereof formed by growing the crystal on any of a sapphire substrate, an SiC substrate, a ZnO substrate, an Si substrate, a GaN substrate, an AlN substrate, an InN substrate, a BN substrate, and a self-supporting substrate comprising a mixed crystal thereof.

The nitride principal surface of the base is preferably a crystal plane within ±10° or less from the (1-100) plane (m-plane).

Also, at least one of the first nitride semiconductor layer and the second nitride semiconductor layer is preferably a Group III-V nitride semiconductor comprising GaN, AlN, InN, BN or a mixed crystal thereof.

The thickness $L_1$ of the first nitride semiconductor layer is preferably from 0.1 to 300 nm. The silicon (Si) concentration in the first nitride semiconductor layer is preferably $1 \times 10^{21}$ cm$^{-3}$ or less. Furthermore, the silicon concentration in the second nitride semiconductor layer is preferably from $1 \times 10^{17}$ to $6 \times 10^{19}$ cm$^{-3}$.

In the present invention, the quantum well active layer structure part may emit light having a center wavelength of 400±30 nm. The dislocation density in the quantum well active layer structure part is preferably $1 \times 10^9$ cm$^{-2}$ or less.

In the present invention, the internal quantum efficiency of the quantum well active layer structure part as determined by CW-PL measurement under low excitation density condition may be 20% or more.

Also, in the present invention, the internal quantum efficiency of the quantum well active layer structure part as determined by pulsed PL measurement under low excitation density condition may be 20% or more.

Furthermore, in the present invention, the photoluminescence lifetime ($\tau$(PL)) of the quantum well active layer structure part as determined by time-resolved PL measurement at room temperature under low excitation density condition may be 1.0 ns or more.

Advantage of the Invention

In the present invention, when obtaining a nitride semiconductor where a one conductivity type nitride semiconductor part, a quantum well active layer structure part, and a another conductivity type nitride semiconductor part opposite the one conductivity type are stacked in this order, the crystal is grown on a base with the principal being nonpolar nitride and not only the one conductivity type nitride semiconductor part is formed by sequentially stacking a first nitride semiconductor layer and a second nitride semiconductor layer but also the second nitride semiconductor layer is designed to have a thickness of 400 nm to 20 µm and have a substantially nonpolar outermost surface.

By selecting a nonpolar plane as the base for crystal growth, spatial separation of an electron and a hole contributing to light emission, attributable to the QCSE effect, is suppressed and effective radiation is realized. Also, the second nitride semiconductor layer is set to an appropriate thickness, whereby the surface can be prevented from becoming a nitride semiconductor surface with extremely severe unevenness and even when the surface is moderately roughened, as long as its level is adequate, the light-emitting element fabricated can exhibit good optical characteristics.

Thanks to these effects, according to the present invention, a high-quality nitride semiconductor using a nonpolar plane as the growth surface and ensuring high internal quantum efficiency, good light extraction efficiency and in turn, high emission efficiency of a light-emitting element fabricated, can be provided.

MODE FOR CARRYING OUT THE INVENTION

Figure 1:
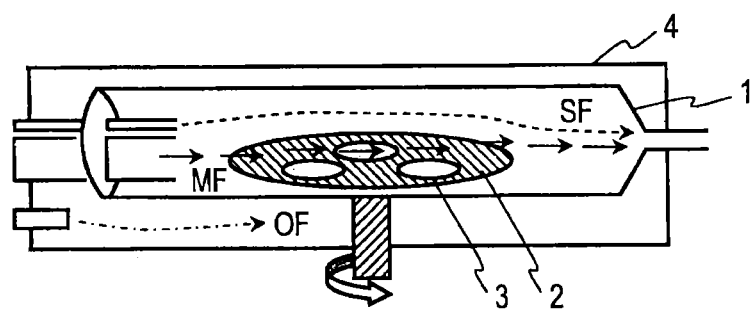
FIG. 1(A) A diagram conceptually illustrating the main flow stream in a horizontal MOCVD reacting furnace.
FIG. 1(B) A diagram conceptually illustrating the main flow stream in a vertical MOCVD reacting furnace.
Figure 1:
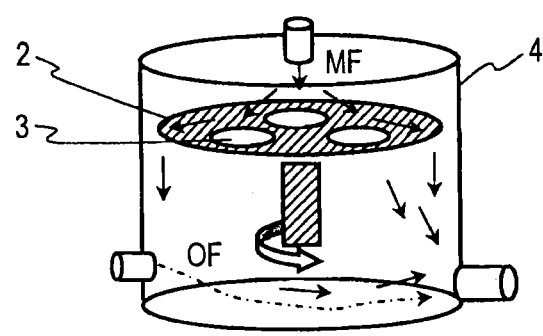

As described above, the nitride semiconductor of the present invention is a nitride semiconductor obtained by sequentially stacking a one conductivity type nitride semiconductor part, a quantum well active layer structure part, and a another conductivity type nitride semiconductor part opposite the one conductivity type, on the principal nitride surface of a base with at least one principal surface thereof being nonpolar nitride, wherein the one conductivity type nitride semiconductor part is formed by sequentially stacking a first nitride semiconductor layer and a second nitride semiconductor layer, and the second nitride semiconductor layer has a thickness of 400 nm to 20 μm and has a substantially nonpolar outermost surface.

Here, the "substantially nonpolar plane" means that the crystal plane of the outermost surface contains a nonpolar plane but when a light-emitting element is fabricated, appropriate fine irregularities or facets are formed therein. The nitride semiconductor of the present invention is formed on the principal nitride surface of a base that is nonpolar nitride, but as described later, in the crystal growth process, appropriate unevenness is sometimes intentionally formed in a self-forming manner on the interface of respective crystal layers of first nitride semiconductor layer, second nitride semiconductor layer and quantum well active layer, or on the outermost surface of the nitride semiconductor layer. Accordingly, the term "substantially nonpolar plane" as used in the present invention means that the crystal plane of the principle base surface for epitaxial growth is not necessarily a uniform nonpolar plane or although the outermost surface of the epitaxial layer contains a nonpolar plane, the surface is not entirely a nonpolar plane and may partially contain a semipolar plane or a polar plane.

The nitride semiconductor of the present invention is described in detail below by illustrating an example of its production process in sequence. Incidentally, as long as the nitride semiconductor of the present invention has the above-described configuration, its production method is not limited to the following production method.

The epitaxial growth method includes various growth methods, but the method which can be mainly applied to the method used for the crystal growth of the nitride semiconductor of the present invention (hereinafter, this is referred to as "the crystal growth method of the nitride semiconductor of the present invention" or "the epitaxial growth method of the present invention") is a vapor-phase growth method. Above all, an H-VPE method and an MOCVD method can be preferably applied, and an MOCVD method is most preferred.

For example, in the MOCVD method, apparatus modes of various configurations are applicable and according to respective apparatus modes, a gas constituting the main atmosphere during temperature rise/temperature drop, a gas constituting the main atmosphere during growth, a raw material gas, a gas used as a carrier for realizing the supply of an organic metal or a part of dopants, a gas for diluting the raw material, an auxiliary gas for efficiently realizing the introduction of a raw material gas or the contact or supply of an atmosphere-constituent gas on the base, a gas for adjusting the flow to, for example, convert the entire gas flow into a laminar flow, a gas for the stabilization/life prolongation of a constituent member (e.g., heater, various ports), a gas introduced for purging the reacting furnace, and the like are appropriately introduced.

In the present invention, for the sake of convenience, the flow created by an auxiliary gas for efficiently realizing the introduction of a raw material gas/an atmosphere-constituent gas to the base or their contact or supply on the base, and the flow of a gas for adjusting the flow to, for example, convert the entire gas flow into a laminar flow are referred to as a "subflow". Also, for the sake of convenience, the flows created by a gas which does not directly contribute to epitaxial growth, such as gas used for the stabilization/life prolongation of a constituent member (e.g., heater, various ports) and gas introduced for purging the reacting furnace, are referred to as a "growth-irrelevant flow".

On the other hand, in the present invention, for the sake of convenience, all gas flows except for subflows supplied to the crystal growth apparatus and growth-irrelevant flows are referred to as a "main flow". Accordingly, the main flow is a general term for flows of a gas constituting the main atmosphere during temperature rise/temperature drop, a gas constituting the main atmosphere during growth, a raw material gas, a gas used as a carrier for realizing the supply of an organic metal or a part of dopants, a gas for diluting the raw material, and the like. This main flow is the atmosphere itself to which the base surface for epitaxial growth of a nitride semiconductor or the crystal surface of a nitride semiconductor during epitaxial growth is exposed. In this way, the main flow is indispensable for vapor-phase growth and the subflow or growth-irrelevant flow is optional.

FIGS. 1(A) and 1(B) illustrate examples of horizontal and vertical MOCVD reacting furnaces, respectively, and conceptually show the main flow stream. For example, the horizontal reacting furnace (FIG. 1(A)) is an apparatus configured such that the surface of a base 3 placed on a susceptor 2 housed in a quartz reaction tube 1 is exposed to a main flow MF and this main flow MF constitutes an effective "atmosphere" for the base 3. The main flow MF is pressed against the surface of the base 3 by a subflow SF, whereby the introduction of a raw material gas/an atmosphere-constituent gas into the base 3 or their contact or supply on the base 3 is efficiently effected and the entire gas flow is converted into a laminar flow.

On the other hand, in the configuration of FIG. 1(B) illustrating an example of a vertical reacting furnace, a gas for subflow is not supplied, and the gas flowing in the quartz reaction tube 1 is only a gas creating the main flow MF. Incidentally, in both the horizontal reacting furnace (FIG. 1(A)) and vertical the reacting furnace (FIG. 1(B)), a flow of a gas creating a growth-irrelevant flow OF is produced due to gas supply for heater purge, viewport purge or the like.

Furthermore, in the context of the present invention, for the sake of convenience, a flow mainly containing a gas working out to a nitrogen raw material or a flow for forming an atmosphere to prevent escape of nitrogen from the base/epitaxial layer surface in the process of epitaxially growing a nitride semiconductor, including temperature rise/temperature drop steps, is sometimes referred to as a "first main flow". In this case, for the sake of convenience, the flow of a gas used mainly for supplying other raw materials or forming other atmospheres is sometimes referred to as a "second main flow". In addition, a part of the gas constituting the main flow can be used also as a carrier gas for supplying an organic metal raw material and therefore, a part of the gas constituting the main flow is sometimes referred to as a carrier gas.

The term "active gas" as used in the present invention indicates a gas capable of decomposing or reacting under the temperature and pressure conditions in a series of epitaxial crystal growth steps such as temperature rise, temperature drop, waiting and growth steps and generating an active hydrogen species such as atomic or molecular hydrogen radical, atomic or molecular hydrogen ion, or atomic hydrogen. In the present invention, out of gases constituting the main flow, the amount of the "active gas" introduced as a major constituent gas exceeds 1% in terms of the flow rate ratio of constituent gas species in the main flow, at least at any timing in the epitaxial growth step.

In this meaning, examples of the major active gas include a hydrogen ($H_2$) gas and an ammonia ($NH_3$) gas (and a mixture thereof). These gases have an etching effect on nitride crystal, and in particular, this effect by the $H_2$ gas is very high. Therefore, when the nitride crystal surface is excessively exposed to such a gas (particularly, $H_2$ gas) under inappropriate conditions, excessive nitrogen desorption from the nitride surfaces is liable to occur, and atomic level defects are readily introduced, causing excessively macroscopic surface roughening. Once thus roughened, the nitride semiconductor obtained according to the present invention is excessively reduced in the internal quantum efficiency of the quantum well active layer structure part and is unsuited for device fabrication.

On the other hand, when the major active gas such as hydrogen ($H_2$) gas and ammonia ($NH_3$) gas (including a mixed gas thereof) is used under appropriate conditions, adequate unevenness can be intentionally formed in a self-forming manner on the nitride semiconductor while keeping the internal quantum efficiency of the quantum well active layer structure part to an adequate range, and this is preferred in the present invention, because high light extraction efficiency from the nitride semiconductor can be achieved.

The term "inactive gas" as used in the present invention indicates a gas incapable of generating a hydrogen active species in a series of epitaxial crystal growth steps such as temperature rise, temperature drop, waiting and growth steps. In the present invention, out of gases constituting the main flow, the amount of the "inactive gas" introduced as a major constituent gas exceeds 1% in terms of the flow rate ratio of constituent gas species in the main flow, at least at any timing in the epitaxial growth step.

Major examples of such an inactive gas include nitrogen ($N_2$), helium (He), argon (Ar), xenon (Xe) and krypton (Kr). Other examples of the gas that satisfies the above-described conditions as an inactive gas include acetonitrile, azoisobutane, a hydrazine compound such as 1,1-dimethylhydrazine, an amine compound such as dimethylamine, diethylamine, trimethylamine, triethylamine, triallylamine and triisobutylamine, and an azide compound such as methyl azide, ethyl azide, phenyl azide, diethylaluminum azide, diethylgallium azide and trisdimethylaminoantimony. A mixed gas thereof is also included in the inactive gas.

Although details are described later, in the present invention, the main flow may be arbitrarily composed of mainly an inactive gas or mainly an active gas in all steps of temperature rise step (particularly, the period $t_A$), first growth step and second growth step.

Here, in order to obtain a relatively high internal quantum efficiency of the quantum well active layer structure part of the present invention, it is preferred to constitute the main flow mainly by an inactive gas and control the atmosphere so that the base surface or the outermost surface layer during growth can be prevented from being exposed to an excessively active gas (particularly, hydrogen gas having a large etching effect on nitride). Above all, in the temperature rise step (particularly, the period $t_A$) and the first growth step, the gas constituting the main flow is preferably controlled not to excessively contain hydrogen gas.

On the other hand, in order to increase the light extraction efficiency from the nitride semiconductor of the present invention while keeping the internal quantum efficiency of the quantum well active layer structure part to an adequate range, it is also preferred to constitute the main flow mainly by an active gas.

Figure 2:
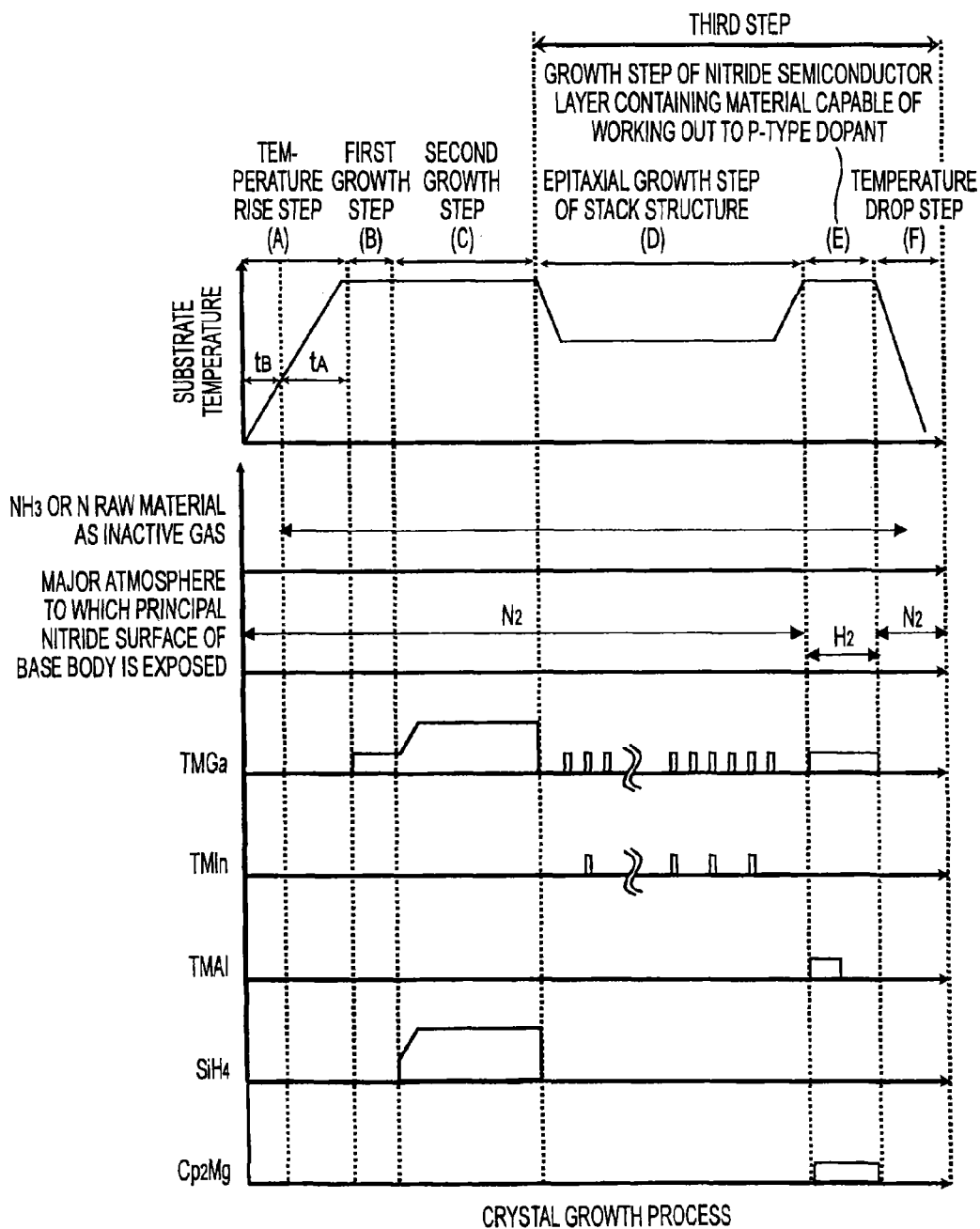
FIG. 2(A) A diagram for explaining a sequence example of the crystal growth method of the nitride semiconductor of the present invention.
FIG. 2(B) A diagram illustrating a sequence example for explaining the crystal growth method of the nitride semiconductor of Example 4.
FIG. 2(C) A diagram illustrating a sequence example for explaining the crystal growth method of the nitride semiconductor of Example 6.
FIG. 2(D) A diagram illustrating a sequence example for explaining the crystal growth method of the nitride semiconductor of Example 7.
FIG. 2(E) A diagram illustrating a sequence example for explaining the crystal growth method of the nitride semiconductor of Example 9.
FIG. 2(F) A diagram illustrating a sequence example for explaining the crystal growth method of the nitride semiconductor of Example 11.
FIG. 2(G) A diagram illustrating a sequence example for explaining the crystal growth method of the nitride semiconductor of the present invention.
FIG. 2(H) A diagram illustrating a sequence example for explaining the crystal growth method of the nitride semiconductor of Comparative Example 1.
FIG. 2(I) A diagram illustrating a sequence example for explaining the crystal growth method of the nitride semiconductor of Example 13.
FIG. 2(J) A diagram illustrating a sequence example for explaining the crystal growth method of the nitride semiconductor of Example 14.
FIG. 2(K) A diagram illustrating a sequence example for explaining the crystal growth method of the nitride semiconductor of Comparative Example 2.
FIG. 2(L) A diagram illustrating a sequence example for explaining the crystal growth method of the nitride semiconductor of Reference Example 2.
FIG. 2(M) A diagram illustrating a sequence example for explaining the crystal growth method of the nitride semiconductor of Example 15.
FIG. 2(N) A diagram illustrating a sequence example for explaining the crystal growth method of the nitride semiconductor of Example 16.
FIG. 2(O) A diagram illustrating a sequence example for explaining the crystal growth method of the nitride semiconductor of Example 17.
Figure 2:
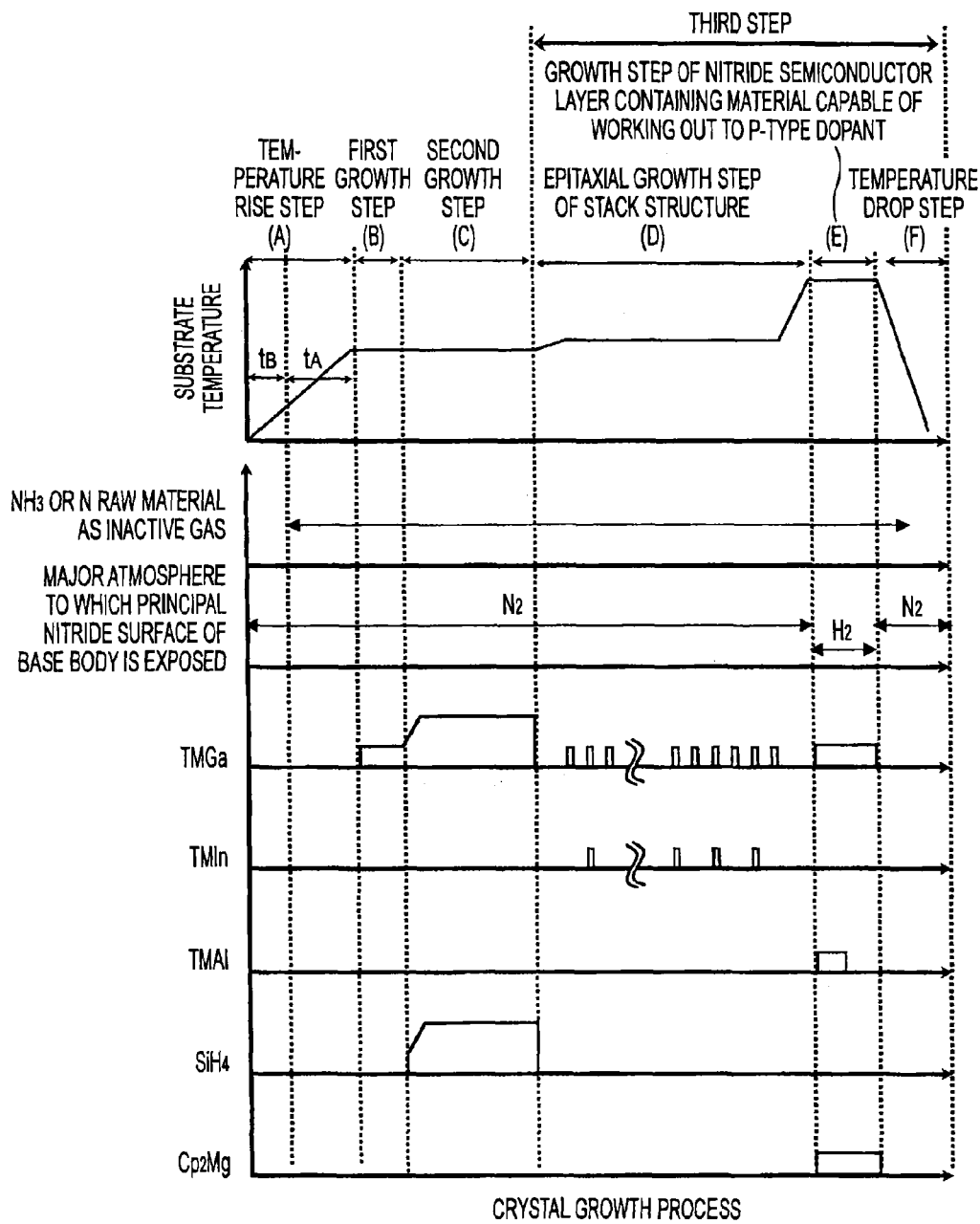
Figure 2:
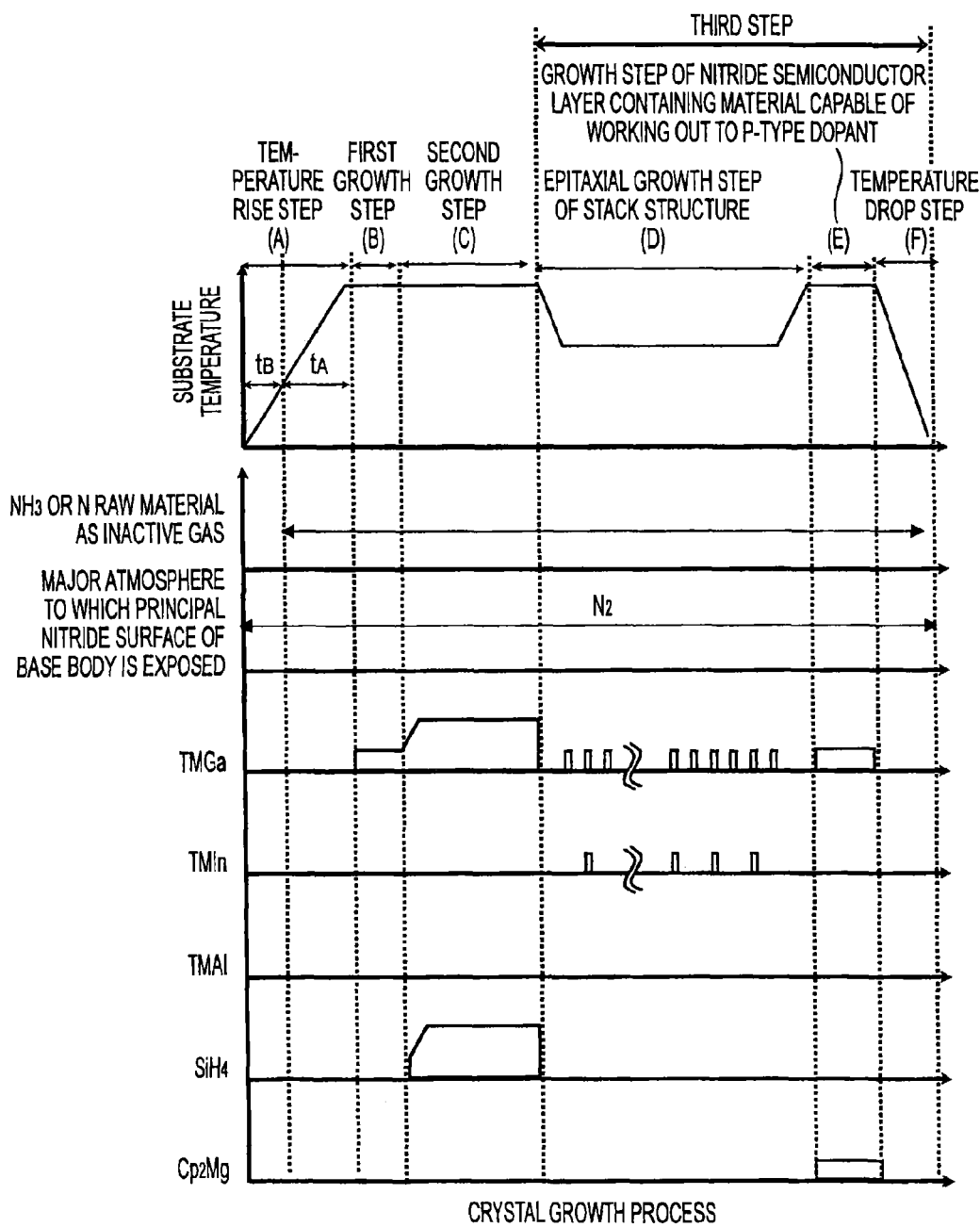
Figure 2:
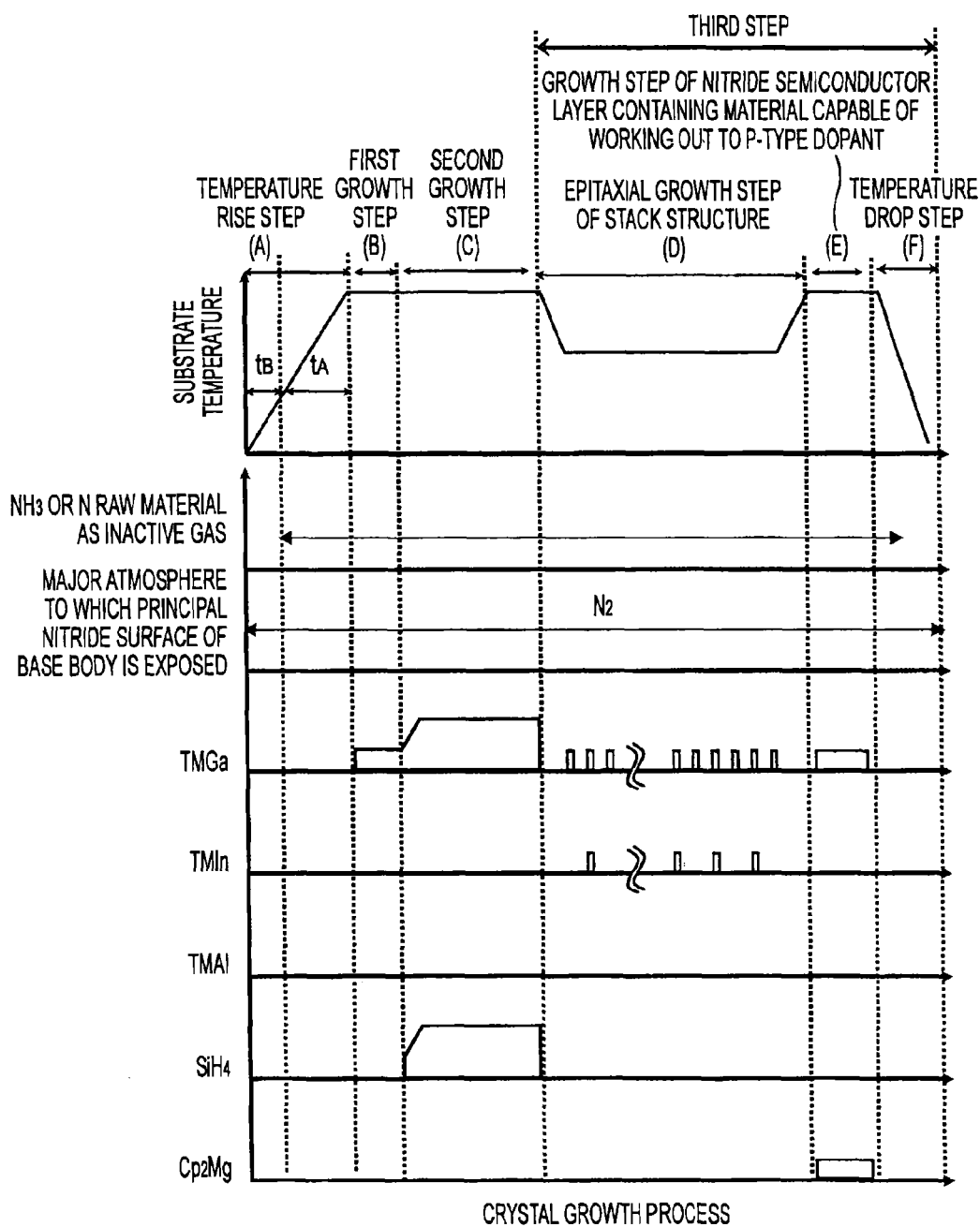
Figure 2:
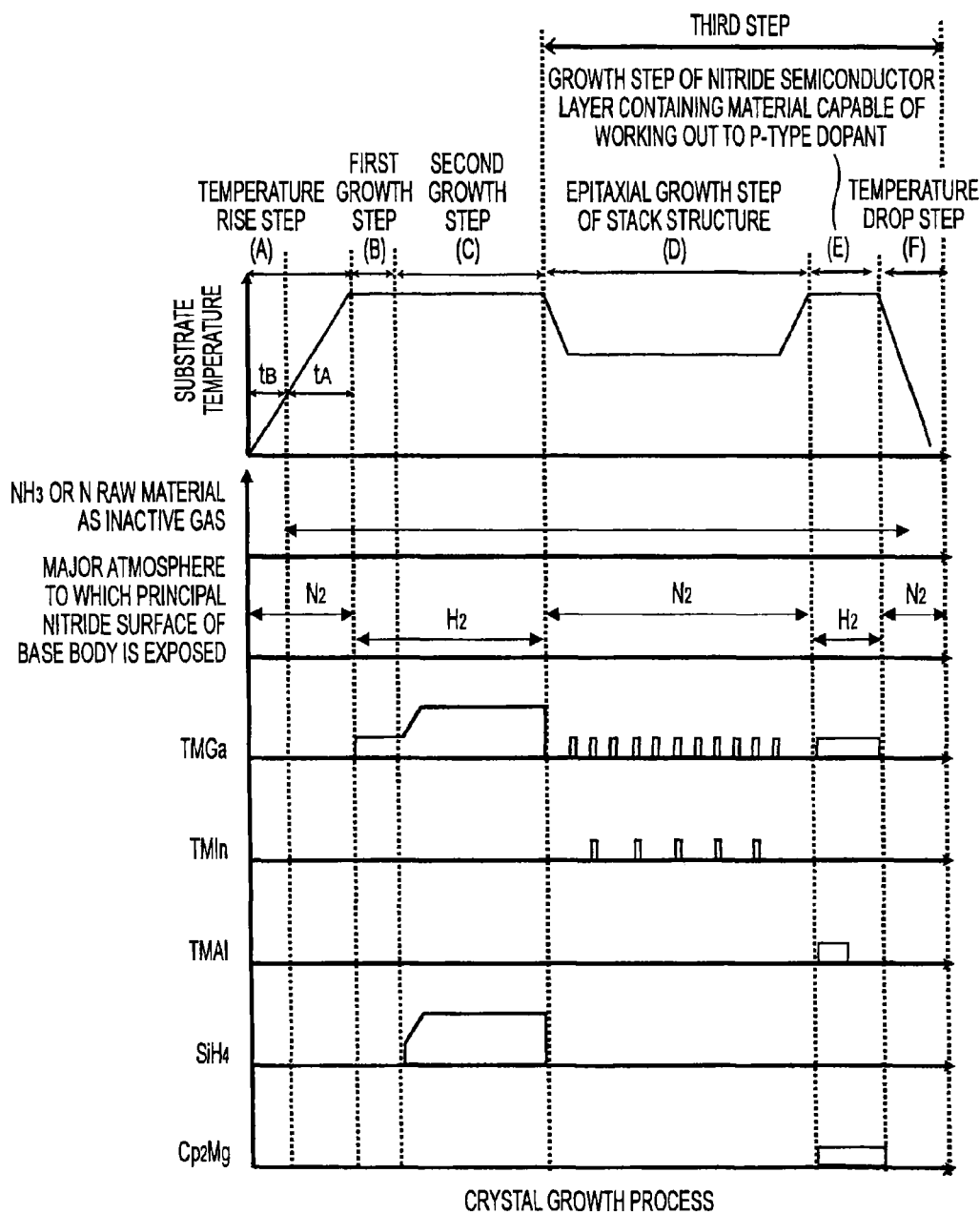
Figure 2:
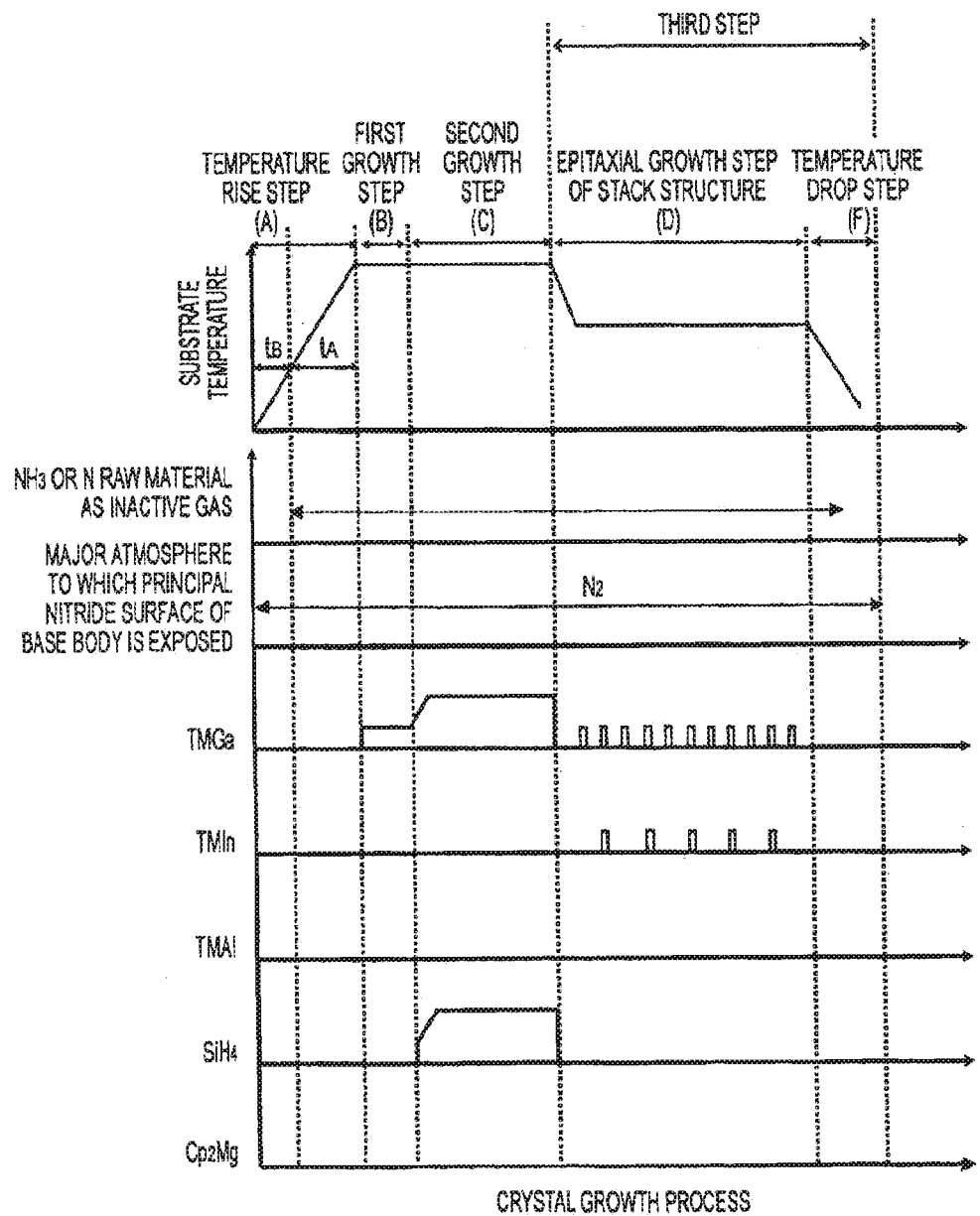
Figure 2:
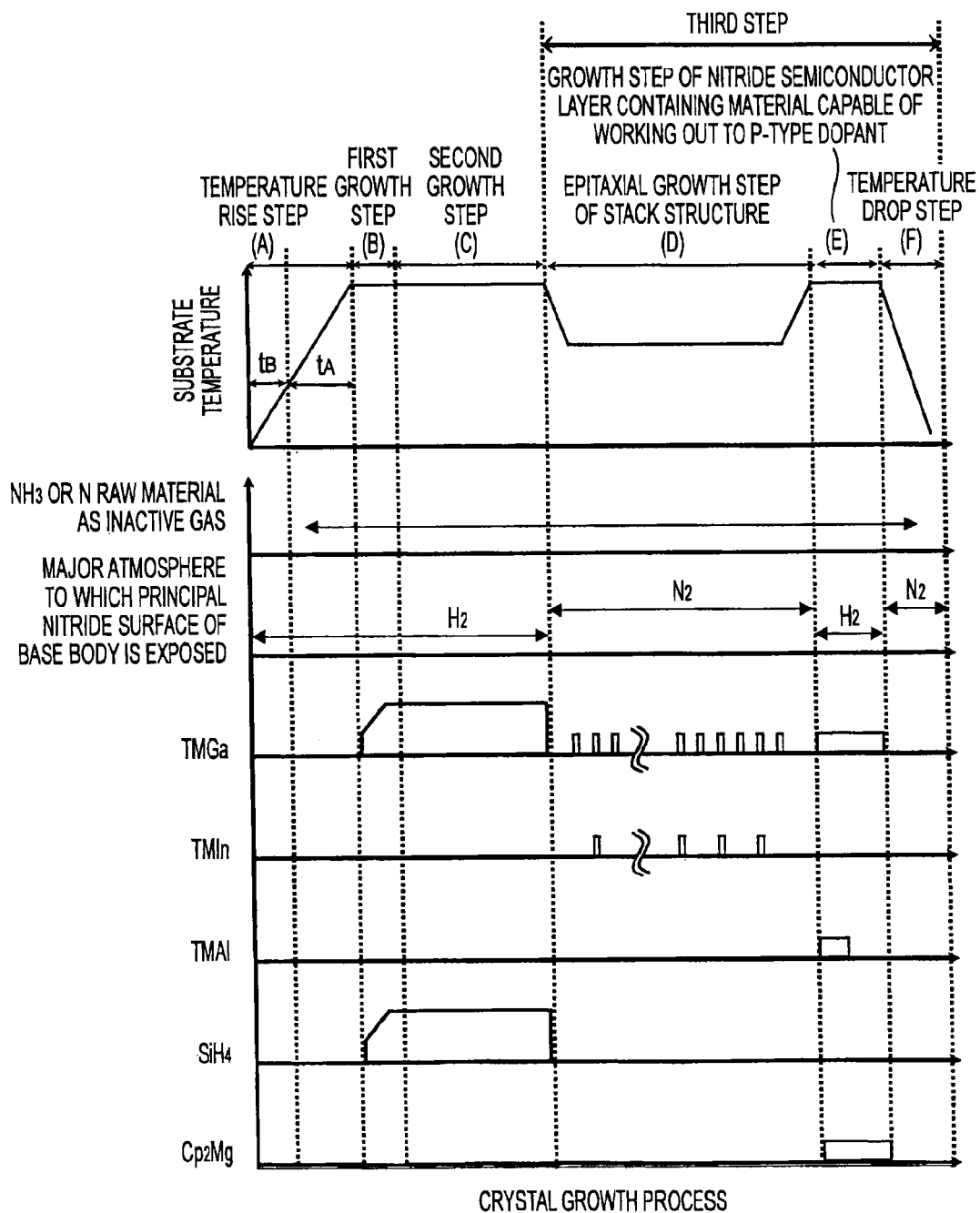
Figure 2:
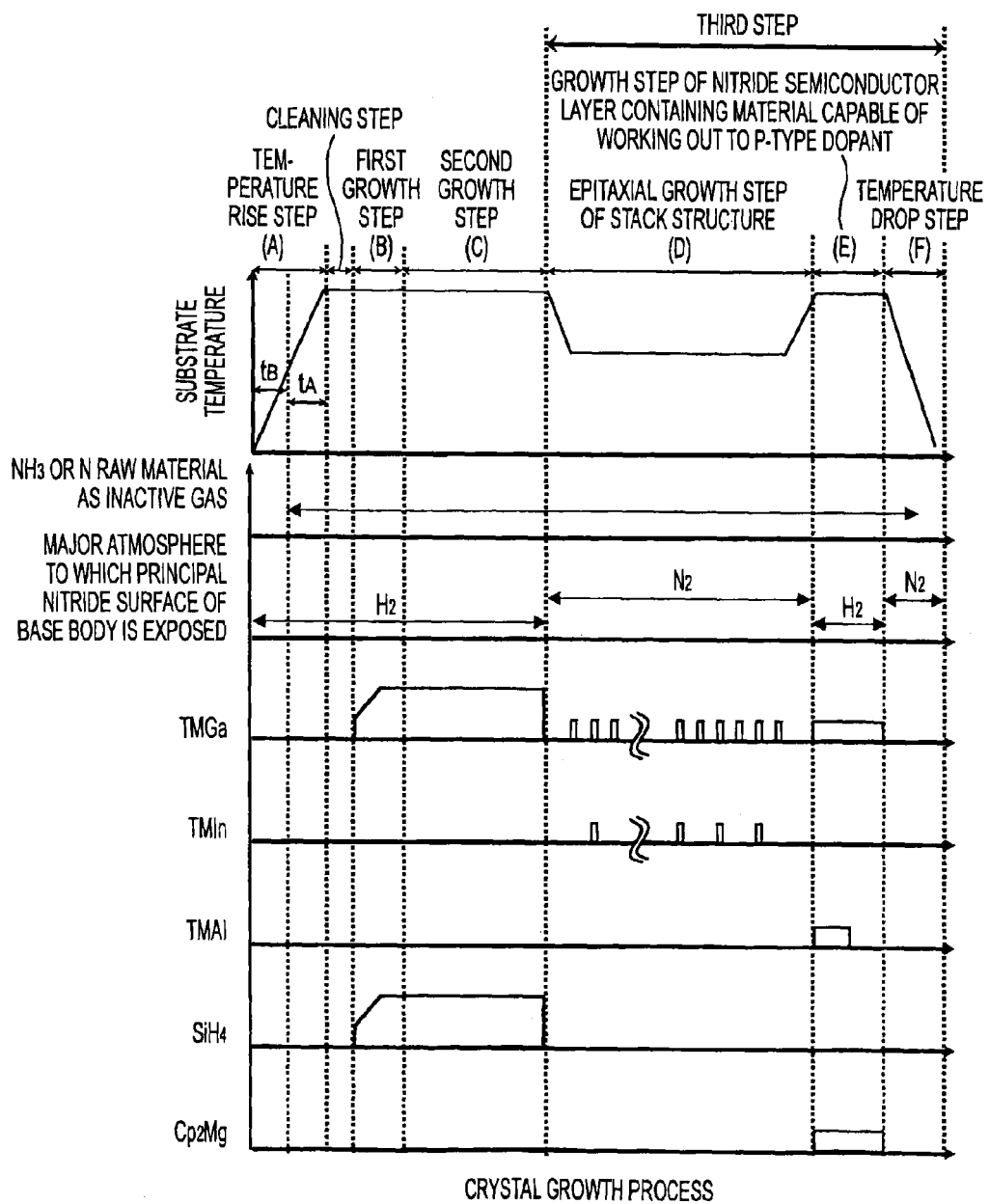
Figure 2:
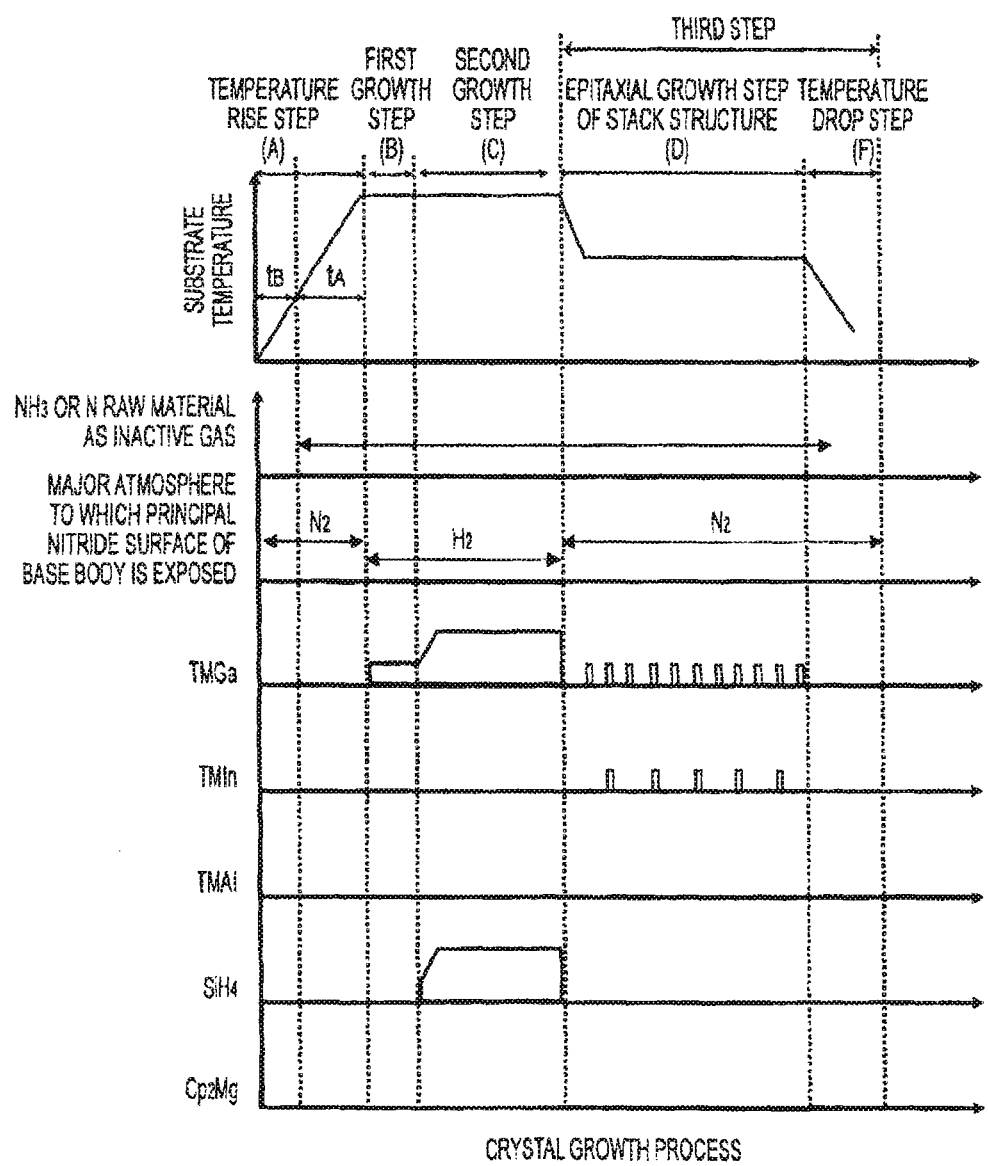
Figure 2:
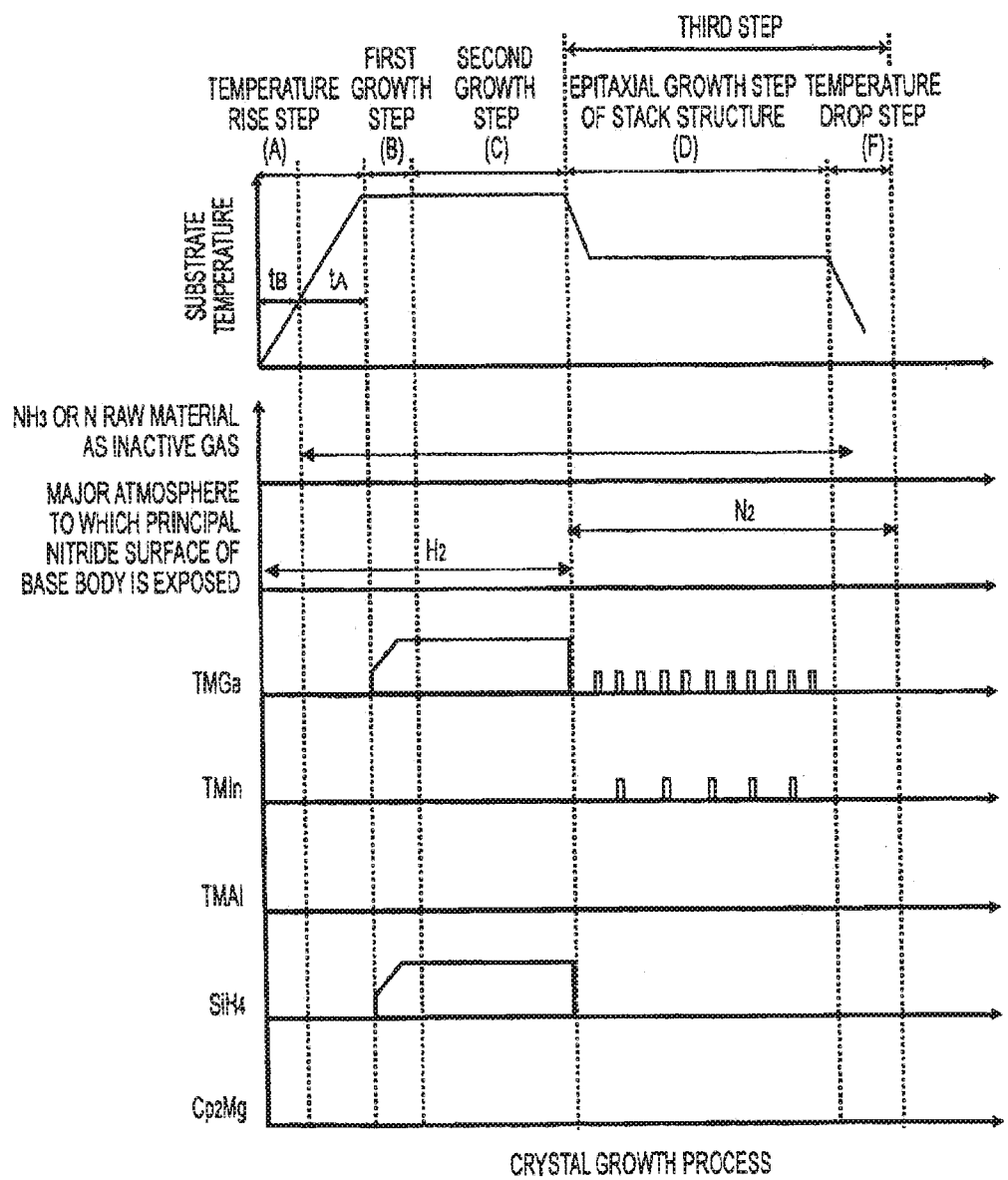
Figure 2:
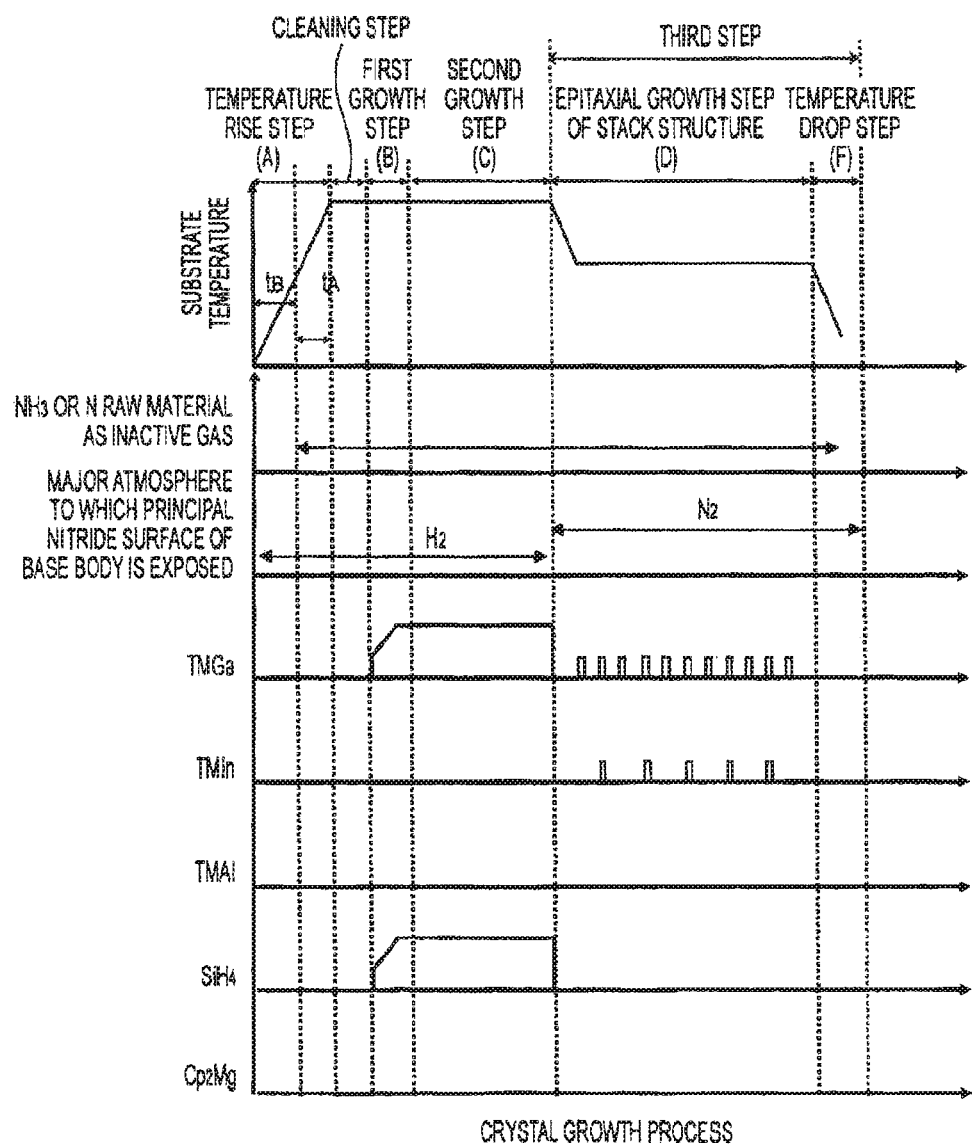
Figure 2:
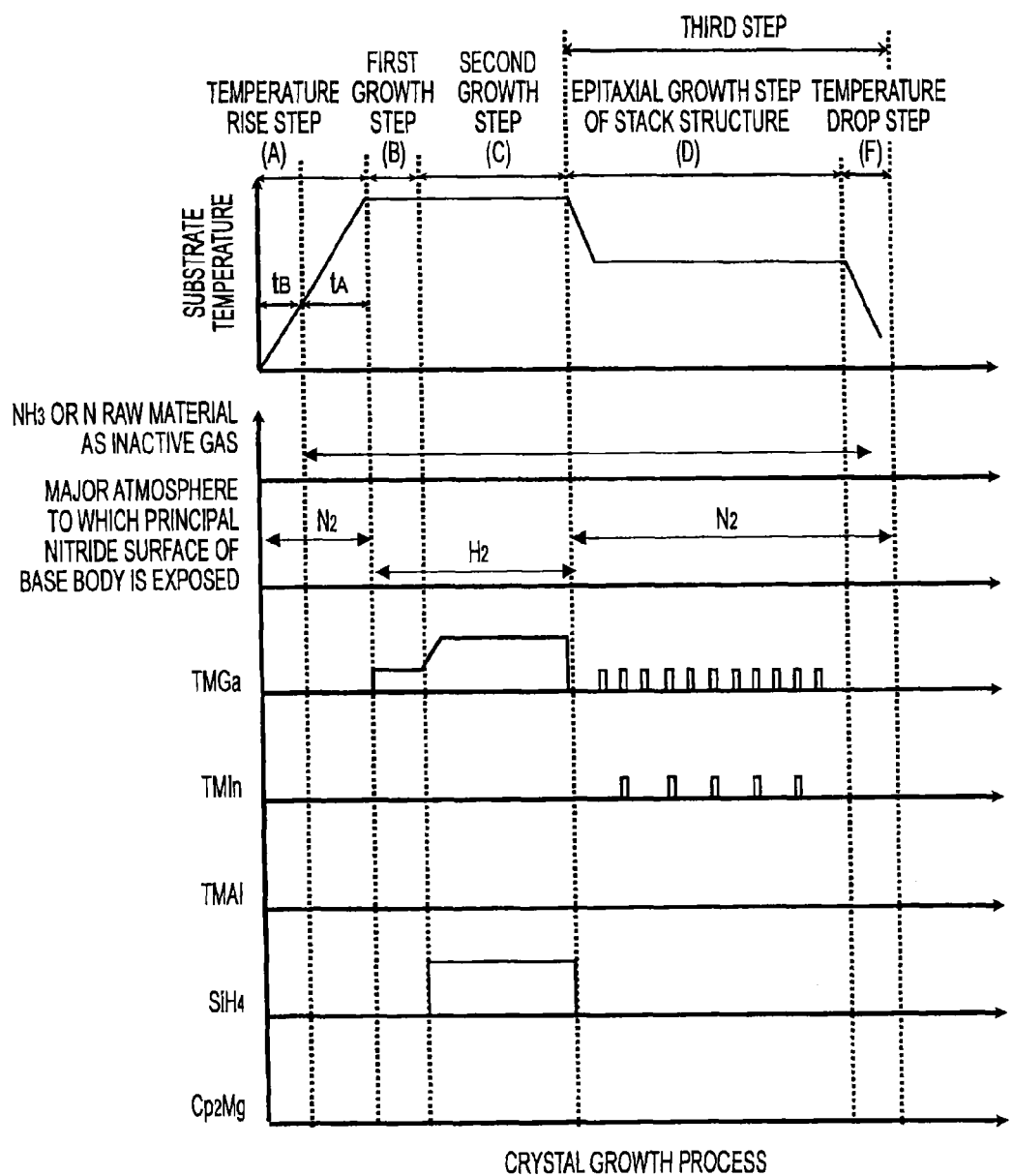
Figure 2:
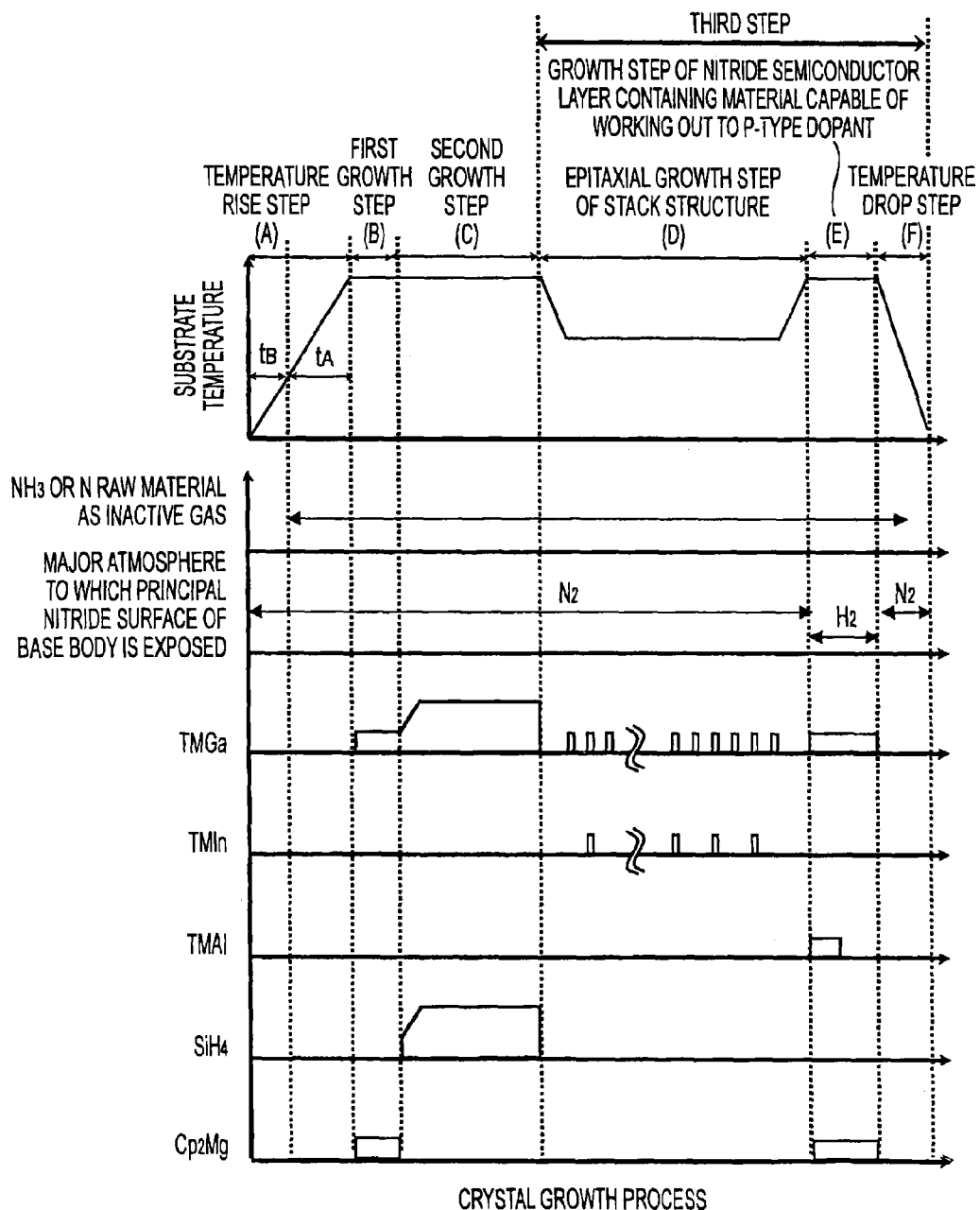
Figure 2:
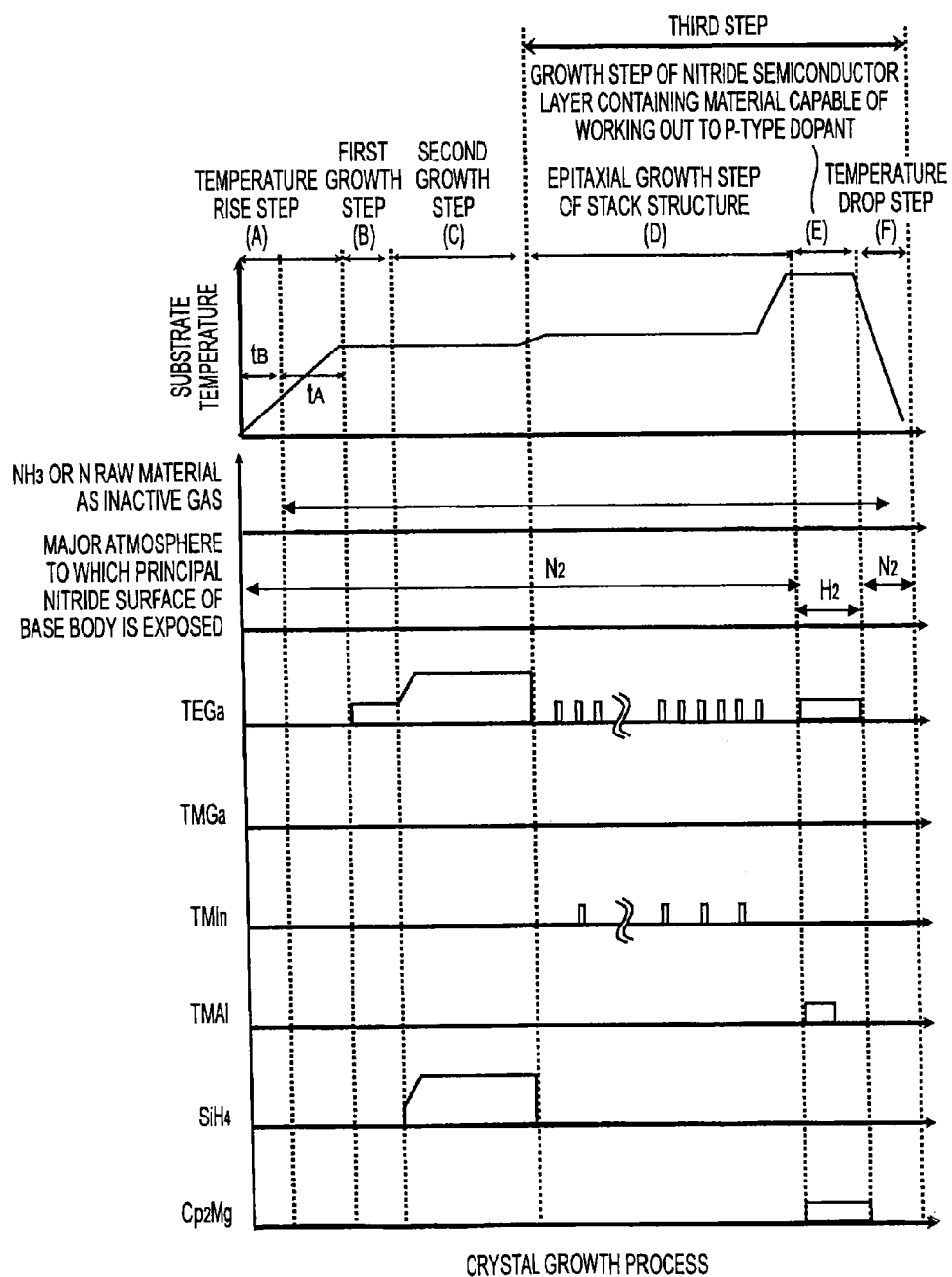
Figure 2:
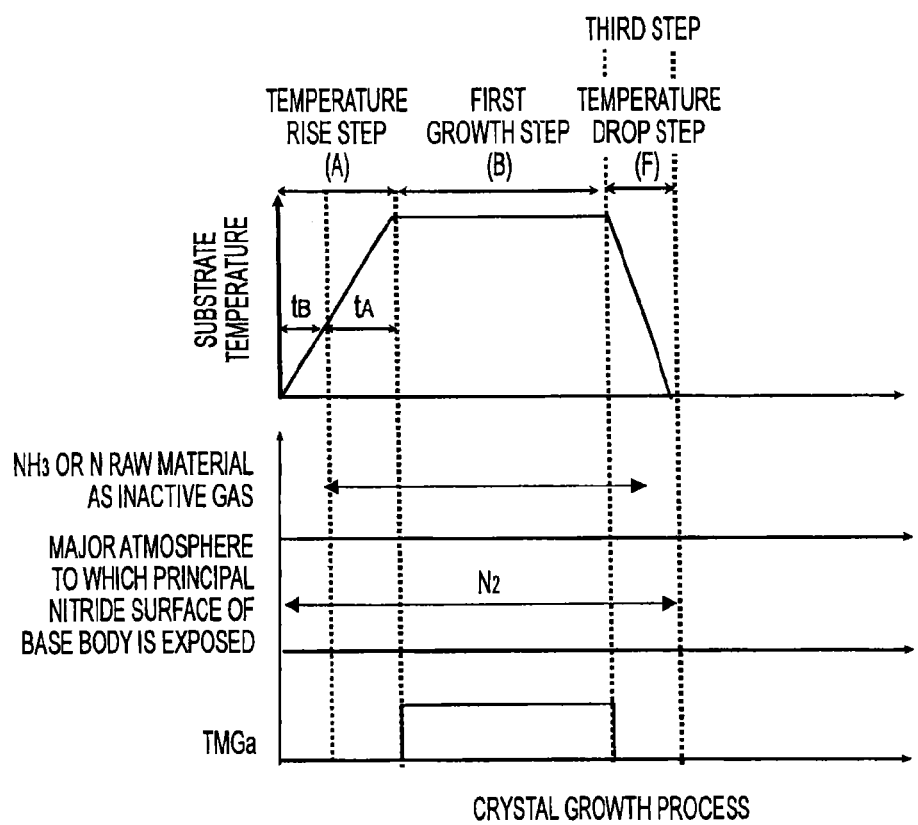

FIG. 2(G) and FIG. 2(A) are diagrams illustrating two representative sequence examples for explaining the crystal growth method of the nitride semiconductor of the present invention.

FIG. 2(G) is one example of the sequence capable of forming a most preferred nitride semiconductor layer in the present invention, and this is a sequence example where adequate unevenness can be intentionally formed in a self-forming manner, for example, on the surface of the nitride semiconductor layer while keeping the internal quantum efficiency of the quantum well active layer structure part to an adequate range. For example, the nitride semiconductor formed by such a method is enhanced in the light extraction efficiency due to unevenness or the like, so that a light-emitting element fabricated using the nitride semiconductor can exhibit high emission efficiency.

On the other hand, FIG. 2(A) is an example of the sequence capable of forming a preferred nitride semiconductor layer in the present invention, and this is a sequence example where the internal quantum efficiency of the quantum well active layer structure part can be made relatively high. For example, the nitride semiconductor formed by such a method does not necessarily ensure high light extraction efficiency of a device fabricated but the internal quantum efficiency is relatively high, so that a light-emitting element fabricated using the nitride semiconductor can exhibit high emission efficiency.

Here, the Figures show an example of epitaxially growing a GaN film on a standing GaN substrate with the principal surface being a (1-100) plane (m-plane) out of nonpolar planes. The reacting furnace for epitaxial growth is, for example, a metal-organic vapor-phase growth apparatus, and examples thereof include a horizontal three-flow quartz-made reacting furnace where the normal conditions are growth under atmospheric pressure, a rotation/revolution-type reacting furnace (planetary reactor) where the normal conditions are growth under reduced pressure, and a vertical SUS-made reacting furnace where the normal conditions are growth under reduced pressure.

First, a base with at least one principal surface thereof being nitride is prepared as the base for epitaxial growth, and this base is placed on a susceptor in the reacting furnace for epitaxial growth and heated to a predetermined temperature (step A). The nitride on the principal base surface is GaN, AlN, InN, BN or a self-supporting substrate of a mixed crystal thereof, or is a GaN film, an MN film, an InN film, a BN film or a mixed crystal film thereof formed by crystal growth on any substrate of a sapphire substrate, an SiC substrate, a ZnO substrate, an Si substrate, a GaN substrate, an AlN substrate, an InN substrate, a BN substrate and a self-supporting substrate of a mixed crystal thereof.

In the epitaxial growth method of the present invention, mask formation, concave-convex treatment and the like on the base surface are not essential but optional unlike the epitaxial growth method on a nonpolar side wall by, for example, so-called ELO (Epitaxial Lateral Overgrowth; lateral growth). Accordingly, in the present invention, it is preferred that the direction of the principal base surface nearly coincides with the direction in which the epitaxial growth proceeds. In the present invention where lateral growth is not an essential requirement, a problem that, for example, large-area growth of an epitaxial layer on a nonpolar side wall is difficult or an extremely high dislocation density portion corresponding to a mask structure is generated in the epitaxial layer, is not caused. As a result, large-area growth and reduced dislocation density of the epitaxial layer using a nonpolar plane (for example, m-plane) as a growth plane can be achieved.

In this way, according to the present invention, an epitaxial layer ensuring excellent light emission characteristics of a device fabricated can be formed on a nonpolar plane substrate, particularly an m-plane substrate, and therefore, the area of the outermost surface of the nitride semiconductor orthogonal to the epitaxial growth direction is preferably from 30 mm$^2$ to 500 cm$^2$, more preferably from 50 mm$^2$ to 225 cm$^2$, still more preferably from 4 to 120 cm$^2$.

The lower limit for the area of the outermost surface of the nitride semiconductor is specified so that the crystal growth process (and the subsequent device fabrication process) can be easily implemented. On the other hand, the upper limit is specified particularly to ensure in-plane uniformity of the obtained epitaxial layer.

Describing the upper limit, first, the range (region) allowing for homogeneous supply of a raw material gas in an MOCVD apparatus or the like when forming a homogeneous epitaxial layer in the MOCVD apparatus is considered to be approximately 500 cm$^2$. This is the reason why the area of the outermost surface of the nitride semiconductor set to 500 cm$^2$ or less.

Second, in the base with its principal surface being a nonpolar plane such as m-plane, the crystal axes in the principal surface are more anisotropic than in a base having a polar plane such as c-plane. For example, a c-plane substrate has a-axes at 120° intervals in the plane, but an m-plane substrate has an a-axis and a c-axis in the plane and these axis directions are utterly differing in the property. Therefore, the base tends to be heterogeneously "distorted" or "warped" at a high temperature. In such a case, for forming a relatively uniform epitaxial layer on the base, the area is preferably 225 cm$^2$ or less, more preferably 120 cm$^2$ or less.

According to the studies by the present inventors, in consideration of atomic arrangement on the base surface, the crystal growth method of the present invention is suitably applicable to a so-called "nonpolar plane" as typified by, for example, a (11-20) plane (a-plane), a (1-102) plane (r-plane) and a (1-100) plane (m-plane), and among these nonpolar planes, the method is particularly suitable for epitaxial growth on a base with its principal surface being, in terms of crystal plane orientation, a (1-100) plane (m-plane) or a plane equivalent thereto. For example, a standing GaN substrate with its principal surface being a (1-100)-plane is preferably used for the base, and when a GaN-based nitride semiconductor crystal is grown thereon by the crystal growth method of the present invention, a good-quality epitaxial growth film is obtained.

In order to increase the light extraction efficiency from the nitride semiconductor of the present invention while keeping the internal quantum efficiency of the quantum well active layer structure part to an adequate range, it is also preferred to positively use a base having a slightly tilted surface. In this case, the principal surface is preferably a crystal plane whose tilt angle just from the m-plane is ±10.0° or less, preferably ±7.0° or less, more preferably ±5.0° or less, still more preferably ±3.0° or less, and most desirably about ±1.5°, in both the a-axis direction and the c-axis direction.

Incidentally, in the present invention, when adequate unevenness is formed in a self-forming manner, for example, on the nitride semiconductor layer surface, the outermost surface is a substantially nonpolar plane, and the outermost surface preferably has Ra of usually 100 nm or more, preferably 150 nm or more, and usually 300 nm or less, preferably 250 nm or less.

On the other hand, in order to obtain a relatively high internal quantum efficiency of the quantum well active layer structure part in the present invention, the so-called "off-angle" from each plane is usually ±10.0° or less, preferably ±5.0° or less, more preferably ±3.0° or less, still more preferably ±1.0° or less, and most preferably ±0.5° or less. With such an off-angle, a nitride semiconductor crystal having good quality particularly in terms of the internal quantum efficiency can be epitaxially grown on the base by the technique of the present invention. Also in the case of using an m-plane base, the principal surface is preferably a crystal plane whose tilt angle just from the m-plane is usually ±10.0° or less, preferably ±5.0° or less, more preferably ±3.0° or less, still more preferably ±1.0° or less, and most preferably ±0.5° or less, in both the a-axis direction and the c-axis direction.

For example, when the outermost surface of the one conductivity type nitride semiconductor part is the nearly m-plane or when the outermost surface of the later-described another conductivity type nitride semiconductor part is the nearly m-plane, the outermost surface is usually within ±5.0° or less, preferably ±3.0° or less, more preferably ±1.0° or less, still more preferably ±0.5° or less, from the (1-100) plane.

The temperature rise in the step A is provided to raise the base temperature to 600° C. to 1,350° C. which is a growth temperature of the later-described first nitride semiconductor layer, and this temperature rise is performed, for example, by supplying a gas constituting the main flow so that the pressure in the reacting furnace can become from 35 to 120 kilopascals. In the case of forming a stack structure as described later on the nitride semiconductor layer, in order to obtain good optical characteristics of the stack structure governing the optical device characteristics, the achieving temperature $T_A$ in the temperature rise of the step A is preferably from 600° C. to 1,350° C., more preferably from 650° C. to 1,200° C., still more preferably from 800° C. to 1,100° C., and most preferably from 900° C. to 970° C.

The achieving temperature range in the temperature rise of the step A preferably coincides with the temperature range in the subsequent film deposition of the first nitride semiconductor layer and, for example, in the case of depositing the first nitride semiconductor layer at 800° C. to 1,100° C., the achieving temperature in temperature rise of the step A is also from 800° C. to 1,100° C.

The temperature rise step illustrated in FIG. 2(G) consists of two stages, that is, a temperature rise stage in a period $t_A$ of raising the base temperature to a predetermined temperature in an atmosphere of main flow composed of an active gas (high-temperature stage), and a temperature rise stage in a period $t_B$ of raising the base temperature in an atmosphere of main flow composed of a gas differing in the composition from the main flow in the temperature rise period $t_A$, in a relatively low temperature region before the temperature rise period $t_A$ (low-temperature stage). Hereinafter, the temperature rise stage in the period $t_B$ (low-temperature stage) is sometimes referred to as a "first temperature rise step" for the sake of convenience, and the temperature rise stage in the period $t_A$ (high-temperature stage) is sometimes referred to as a "second temperature rise step" for the sake of convenience.

The temperature rise step illustrated in FIG. 2(A) consists of two stages, that is, a temperature rise stage in a period $t_A$ of raising the base temperature to a predetermined temperature in an atmosphere of main flow comprising an inactive gas and optionally containing an active gas (high-temperature stage), and a temperature rise stage in a period $t_B$ of raising the base temperature in an atmosphere of main flow composed of a gas differing in the composition from the main flow in the temperature rise period $t_A$, in a relatively low temperature region before the temperature rise period $t_A$ (low-temperature stage).

Out of gases illustrated in FIG. 2(A), the $NH_3$ gas that is an active gas other than hydrogen gas is an optional configuration, but when supplied in the later-described appropriate amount, this gas can be a good-quality raw material gas for nitrogen constituting the nitride semiconductor layer. In the present invention, instead of using $NH_3$ gas, an inactive gas such as 1,1-dimethyl hydrazine (1,1-DMHy), acetonitrile, azoisobutane, dimethylamine, diethylamine, trimethylamine, triethylamine, triallylamine, triisobutylamine, methyl azide, ethyl azide, phenyl azide, diethylaluminum azide, diethylgallium azide and trisdimethylamino antimony can also be used as the raw material of nitrogen constituting the nitride semiconductor layer.

Accordingly, the main flow in the later-described first and second growth steps contains at least a first main flow containing mainly a nitrogen raw material supply gas (for example, $NH_3$ gas in FIG. 2(G) and FIG. 2(A) illustrated) and a second main flow mainly containing a raw material gas for an element other than nitrogen constituting the nitride semiconductor layer.

The temperature rise stage of the period $t_B$ in a relatively low temperature region is a temperature rise stage in a temperature region where nitrogen desorption from nitride constituting the principal base surface needs not be positively suppressed. On the other hand, the temperature rise stage of the period $t_A$ in a relatively high temperature region is a temperature rise stage in a temperature region where nitrogen desorption from nitride constituting the principal base surface needs to be positively suppressed.

Although this depends on the pressure in the reacting furnace where the base is placed, in view of the atomic arrangement, nitrogen desorption on the nonpolar plane is considered to occur at a lower temperature than from a polar plane, and it is estimated that nitrogen desorption from the nitride surface needs to be positively suppressed in a temperature region of generally about 450° C. or more. Accordingly, in a lower temperature region than this temperature, the main flow may contain either gas of an active gas and an inactive gas in any ratio as the constituent gas. For example, the main flow may be entirely composed of $N_2$ gas that is an inactive gas, or may be composed of only $NH_3$ gas that is an active gas.

In the period $t_A$ of performing temperature rise in a high-temperature stage, an attention is required to adequately suppress nitrogen desorption from the nitride surface. In this case, in order to obtain a high light extraction efficiency from the nitride semiconductor of the present invention while keeping the internal quantum efficiency of the quantum well active layer structure part to an adequate range, it is also preferred to raise the temperature by using only an inactive gas, for example, by using only $H_2$ gas and $NH_3$ gas. This configuration is preferred because adequate unevenness can be intentionally formed in a self-forming manner on the nitride semiconductor layer surface or the like.

On the other hand, in order to obtain a relatively high internal quantum efficiency of the quantum well active layer structure part in the present invention, the temperature rise is preferably effected by using only an inactive gas, and it is important to contain a nitrogen raw material gas such as dimethylhydrazine in the inactive gas. In the case of raising the temperature in an atmosphere of main flow comprising an inactive gas and optionally containing an appropriate amount of an active gas, a nitrogen raw material gas is preferably contained in at least either the inactive gas or the active gas. for example, $NH_3$ gas can be a nitrogen raw material gas that is an active gas.

In that case, as the active gas, excessive introduction of $H_2$ is not preferred, but supply of $NH_3$ gas in an appropriate amount is preferred, because this gas can be a nitrogen raw material for a good-quality nitride semiconductor. Although details are described later, the flow rate ratio of the active gas occupying in all gas species constituting the main flow in the temperature rise step is preferably less than 0.5. Incidentally, the base temperature may be raised in a fixed atmosphere throughout the entire temperature rise step, and in this case, the period $t_A$ coincides with the period of the temperature rise step.

The pressure in the reacting furnace in this temperature rise stage is preferably adjusted to be from 35 to 120 kilopascals. If the base surface is exposed to an atmosphere in an excessively reduced pressure state, optical characteristics are greatly deteriorated. For this reason, the lower limit of the pressure in the reacting furnace is set to 35 kilopascals. This point is described later.

In the case of forming the later-described stack structure on the nitride semiconductor layer, in order to obtain good optical characteristics of the stack structure governing the optical device characteristics, the film deposition temperature of the first and second nitride semiconductor layers is preferably from 600° C. to 1,350° C., more preferably from 650° C. to 1,200° C., still more preferably from 800° C. to 1,100° C., and most preferably from 900° C. to 970° C. The temperature range in the film deposition of the nitride semiconductor layer preferably coincides with the achieving temperature range in the temperature rise of the step A and, for example, in the case of depositing the nitride semiconductor layer at 800° C. to 1,100° C., the achieving temperature in the temperature rise of the step A is also from 800° C. to 1,100° C.

In the sequence example shown in FIG. 2(G), the first temperature rise step is started while creating a second main flow by supplying hydrogen gas as an active gas working out to the major atmosphere to which the principal nitride surface of the base is exposed in a reacting furnace, and when the base temperature reaches 400° C., $NH_3$ gas that is an active gas is additionally supplied as a gas constituting a first main flow, whereby the second temperature rise step is started. In this mixed gas, the temperature is further raised to the achieving temperature of 1,000° C. In the second temperature rise step, $NH_3$ gas is supplied so as to prevent escape of nitrogen from the base surface during the temperature rise step and thereby prevent excessive reduction in the crystallinity of the epitaxial growth surface.

In this way, in order to achieve high light extraction efficiency from the nitride semiconductor of the present invention while keeping the internal quantum efficiency of the quantum well active layer structure part to an adequate range, the temperature is preferably raised by using only an inactive gas, for example, by using only $H_2$ gas and $NH_3$ gas. This configuration is preferred because adequate unevenness can be intentionally formed in a self-forming manner on the nitride semiconductor layer surface or the like.

In the sequence example shown in FIG. 2(A), the first temperature rise step is started while creating a second main flow by supplying nitrogen gas as an inactive gas working out to the major atmosphere to which the principal nitride surface of the base is exposed in a reacting furnace, and when the base temperature reaches 400° C., $NH_3$ gas that is an active gas is additionally supplied as a gas constituting a first main flow, whereby the second temperature rise step is started. In this mixed gas, the temperature is further raised to the achieving temperature of 1,000° C. In the second temperature rise step, $NH_3$ gas is supplied so as to prevent escape of nitrogen from the base surface during the temperature rise step and thereby prevent excessive reduction in the crystallinity of the epitaxial growth surface.

In the second temperature rise step, the component ratio of the inactive gas (nitrogen gas) to all gases constituting the main flow (in this case, the sum of the first main flow and the second main flow) is preferably from 0.5 to 1.0 in terms of flow rate ratio, so as to achieve a relatively high internal quantum efficiency of the quantum well active layer structure part in the present invention. The mixed gas components are set as above because if an active gas is excessively contained in the atmosphere to which the base surface is exposed during temperature rise of the base in a relatively high temperature region, defects are readily introduced into the nitride crystal on the base surface. Accordingly, in the second temperature rise step, hydrogen gas particularly having an excessive etching effect and inducing escape of nitrogen is preferably not contained excessively in the atmosphere.

Following this temperature rise step (step A), the process proceeds to a growth step (step B) of the first nitride semiconductor layer, where when the principal nitride surface of the base is m-plane according to the present invention and when a thermal cleaning step is not provided, adequate unevenness for increasing the light extraction efficiency from the nitride semiconductor of the present invention while keeping the internal quantum efficiency of the quantum well active layer structure part to an adequate range is preferably formed in a self-forming manner.

In the step B shown in FIG. 2(G), $NH_3$ gas as a gas constituting the first main flow and nitrogen gas as a gas constituting the second main flow are continuously supplied and after the atmosphere in the reacting furnace is stabilized, raw materials for epitaxial growth are supplied to the reacting furnace by using a part of the hydrogen gas constituting the second main flow as a carrier gas for supplying Group III element and dopant raw materials, whereby crystal growth of the nitride semiconductor layer is started.

In the step B shown in FIG. 2(A), $NH_3$ gas as a gas constituting the first main flow and nitrogen gas as a gas constituting the second main flow are continuously supplied and after the atmosphere in the reacting furnace is stabilized, raw materials for epitaxial growth are supplied to the reacting furnace by using a part of the nitrogen gas constituting the second main flow as a carrier gas for supplying Group III element and dopant raw materials, whereby crystal growth of the nitride semiconductor layer is started.

The first nitride semiconductor layer formed in this way is preferably a crystal containing no polycrystalline component and is more preferably composed of a single crystal itself. A second nitride semiconductor layer is further formed on the first nitride semiconductor layer. The layer formed here is a nitride semiconductor layer formed on a nonpolar plane but according to the present invention, this can be a layer crystallographically keeping a sufficient long-term order.

In the step B, in order to obtain a high light extraction efficiency from the nitride semiconductor of the present invention while keeping the internal quantum efficiency of the quantum well active layer structure part to an adequate range, as shown in FIG. 2(G), it is preferred to appropriately introduce an Si dopant. In the case of intentionally introducing the dopant in an appropriate amount, adequate unevenness is formed on the surface, whereby the light extraction efficiency and in turn, the emission efficiency of a light-emitting element fabricated using the nitride semiconductor of the present invention are increased.

Particularly, in the nitride semiconductor of the present invention, roughness to the same extent as the wavelength of ultraviolet light, near ultraviolet light or visible light, that is, Ra of about 200 nm, is preferably formed intentionally in a self-generating manner, because this is expected to ensure a light extraction effect especially in the emission wavelength region that is preferably realized in the present invention. The Si concentration in which the light extraction effect can be expected and furthermore, excessive decrease in the internal quantum efficiency can be prevented is usually $3\times10^{17}$ cm$^{-3}$ or more, preferably $5\times10^{18}$ cm$^{-3}$ or more, and usually $1\times10^{21}$ cm$^{-3}$ or less, preferably $6\times10^{19}$ cm$^{-3}$ or less.

In the case of intentionally introducing a dopant such as Si, if its concentration is excessively large, unevenness is extremely generated in the surface and this disadvantageously causes excessive reduction in the internal quantum efficiency of the quantum well active layer structure part.

In the step B, in the case of obtaining a relatively high internal quantum efficiency of the quantum well active layer structure part of the present invention, epitaxial growth of the first nitride semiconductor layer is preferably performed in an environment where a silicon (Si) raw material is not intentionally supplied to the principal nitride surface of the base.

That is, it is preferred to epitaxially grow the first nitride semiconductor layer without intentionally supplying an Si raw material to the principal nitride surface of the base in a state of the principal nitride surface of the base being exposed to an atmosphere containing an inactive gas and optionally containing an appropriate amount of an active gas.

The sequence shown in FIG. 2(A) indicates that in an atmosphere containing $N_2$ and $NH_3$ to constitute a main flow, the first nitride semiconductor layer is epitaxially grown without intentionally supplying an Si raw material to the principal nitride surface of the base.

A typical film obtained here is ideally an i-GaN layer. However, in practice, even a GaN layer epitaxially grown in a state of a raw material for a dopant such as Si being not intentionally supplied usually contains Si or the like mixed as an impurity from the raw material gas or Si or the like mixed from, for example, a quartz member existing in or near the reacting furnace.

Furthermore, for example, in the case where an Si-based abrasive used in a surface abrasion step or the like of a self-supporting substrate such as GaN substrate and AlN substrate is adhering as a residue to the base surface, Si is allowed to stay on the substrate surface during epitaxial growth and may be mixed as an impurity in the i-GaN layer.

In addition, in the case where a substrate intentionally doped with Si at the preparation of a self-supporting substrate such as GaN substrate and AlN substrate is used as the base for epitaxial growth, Si segregation may occur on the base surface at the initial stage of epitaxial growth, and the Si may be taken into the i-GaN layer. In the case of Si, the concentration of such an unintended impurity is preferably kept as low as $3\times10^{21}$ cm$^{-3}$ or less.

Also, in order to obtain a relatively high internal quantum efficiency of the quantum well active layer structure part of the present invention, this may be attained by epitaxially growing the first nitride semiconductor layer in an environment where a silicon (Si) raw material is not intentionally supplied, and the average Si concentration in the film thickness direction of the grown first nitride semiconductor layer is preferably lower than the average Si concentration in the film thickness direction of the grown second nitride semiconductor layer.

This is because even when Si is mixed for various reasons above, the thickness subject to its effect is considered to be maximally on the order of several hundreds of nm from the interface and therefore, in the case of forming the first nitride semiconductor layer to a sufficiently larger thickness than the thickness above, the average Si concentration in the film thickness direction of the first nitride semiconductor layer grown by epitaxial growth without intentionally supplying a raw material for a dopant such as Si is estimated to become lower than the Si concentration in the second nitride semiconductor layer grown while intentionally supplying Si as an n-type dopant.

Also in the step B, the pressure in the reacting furnace is preferably set to, for example, approximately from 35 to 120 kilopascals. At this time, in order to obtain a relatively high internal quantum efficiency of the quantum well active layer structure part of the present invention, gases are preferably supplied such that the component ratio (Fp) of inactive gas occupying in all gases constituting the main flow (the component ratio of inactive gas to the total sum of an $NH_3$ gas component as the first main flow and nitrogen gas and TMGa components as the second main flow in the sequence example of FIG. 2(A)) becomes from 0.5 to 1.0 in terms of flow rate ratio. Also, it is preferred that $H_2$ gas having a high etching effect is not excessively contained in the inactive gas constituting the main flow.

In the step B, if epitaxial growth is performed in a reduced pressure state of the pressure in the reacting furnace being less than 35 kilopascals, crystallinity decreases due to increase of point defects and furthermore, photoluminescence (PL) characteristics of the second nitride semiconductor layer formed thereon and a multi-quantum well active layer structure formed as an optional configuration deteriorate. Also, if the pressure exceeds 120 kilopascals, a vapor phase reaction in the reacting furnace is increased, and carbon is taken into the nitride semiconductor layer during epitaxial growth, giving rise to reduction in the crystallinity.

In the step B, the base temperature is set to a predetermined temperature in the temperature range of 600° C. to 1,350° C. The lower limit is set to 600° C. in view of heat energy required for crystal growth of a good-quality nitride semiconductor, and the upper limit is set to 1,350° C. because of restriction such as deterioration of the constituent member of the reacting furnace. If a film is deposited at a temperature of less than 600° C., a polycrystalline component is liable to be mixed, as a result, light emission characteristics deteriorate.

The first nitride semiconductor layer obtained under these conditions is preferably a relatively thin layer having a thickness $L_1$ of 0.1 to 300 nm. The lower limit of the thickness of the first nitride semiconductor layer is set to 0.1 nm because a thickness of at least 0.1 nm is required in order to cover the base surface (nitride surface) with an epitaxial layer that is a layer not excessively containing Si.

Furthermore, according to the studies by the present inventors, an excessively thick first nitride semiconductor layer is considered to bring about extreme deterioration of the surface morphology of the entire epitaxial layer grown thereafter and in the case of containing an active layer structure in the epitaxial layer, bring about deterioration or the like of the optical characteristics of the active layer structure, and this is not preferred. Specifically, a relatively thin layer where $L_1$ is usually 0.1 nm or more, preferably 1.0 nm or more, more preferably 5.0 nm or more, and usually 300 nm or less, preferably 150 nm or less, more preferably 50 nm or less, is preferred.

According to the studies by the present inventors, when a second nitride semiconductor layer is homoepitaxially grown on such a first nitride semiconductor layer, a nitride semiconductor suitable for a light-emitting element can be realized.

The second nitride semiconductor layer (second GaN layer) that is a relatively thick layer is epitaxially grown while supplying an n-type dopant raw material onto the first nitride semiconductor layer (first GaN layer) (step C).

In order to obtain a high light extraction efficiency from the nitride semiconductor of the present invention while keeping the internal quantum efficiency of the quantum well active layer structure part to an adequate range, as shown in FIG. 2(G), it is preferred to epitaxially grow the second nitride semiconductor layer while intentionally supplying an n-type dopant raw material onto the first nitride semiconductor layer in a state of the first nitride semiconductor layer surface being exposed to an atmosphere containing an appropriate active gas. When grown in this way, adequate unevenness can be intentionally formed in a self-forming manner on, for example, the nitride semiconductor surface.

In order to obtain a relatively high internal quantum efficiency of the quantum well active layer structure part in the present invention, as shown in FIG. 2(A), the second nitride semiconductor layer is epitaxially grown while intentionally supplying an n-type dopant raw material onto the first nitride semiconductor layer in a state of the first nitride semiconductor layer surface being exposed to an atmosphere containing an inactive gas.

Examples of the n-type dopant which can be used for the nitride semiconductor layer include Si, O, C, Ge, Se, S and Te. Among these, Si, Se and O are preferred, and Si can be most preferably used.

Also in the step C, the base temperature is set to be from 600° C. to 1,350° C., but the pressure in the reacting furnace is 5 kilopascals or more and at the same time, not more than the pressure during epitaxial growth of the first nitride semiconductor layer. In the process of stacking the second nitride semiconductor layer on the first nitride semiconductor layer, generation of point defects is suppressed and therefore, the pressure in the reacting furnace can be set to be lower than in the step A and the step B. However, if the pressure is less than 5 kilopascals, nitrogen readily escapes from the second nitride semiconductor layer surface in the growth process, and this effect is considered to be larger on a nonpolar plane than on a normal polar plane. For this reason, the lower limit of the pressure is preferably 5 kilopascals.

In the sequence example shown in FIG. 2(G), $NH_3$ gas which can work out to a nitrogen source of GaN is supplied as the first main flow constituting the main flow, $H_2$ is used as the second main flow constituting the main flow and is partially used as a carrier for supplying TMGa, and furthermore, silane ($SiH_4$) gas is supplied as a source of Si that is an n-type dopant.

In order to obtain a high light extraction efficiency from the nitride semiconductor of the present invention while keeping the internal quantum efficiency of the quantum well active layer structure part to an adequate range, gases are preferably supplied such that the component ratio of inactive gas occupying in all gases becomes from 0.5 to 1.0 in terms of flow rate ratio by introducing $H_2$ or the like as the second main flow gas.

In the sequence example shown in FIG. 2(A), $NH_3$ gas which can work out to a nitrogen source of GaN is supplied as the first main flow constituting the main flow, $N_2$ is used as the second main flow constituting the main flow and is partially used as a carrier gas to supply. A part of this gas is used as a carrier gas for supplying TMGa, and furthermore, silane ($SiH_4$) gas is supplied as a source of Si that is an n-type dopant.

In order to obtain a relatively high internal quantum efficiency of the quantum well active layer structure part in the present invention, gases are preferably supplied such that similarly to the step B, the component ratio of inactive gas occupying in all gases constituting the main flow in the step C (the component ratio of inactive gas to the total sum of the $NH_3$ gas component as the first main flow and nitrogen gas, TMGa and $SiH_4$ gas components as the second main flow in the sequence example of FIG. 2(A)) becomes from 0.5 to 1.0 in terms of flow rate ratio.

The second nitride semiconductor layer obtained in this way is a relatively thick layer having a thickness $L_2$ of 0.4 to 20 μm (that is, from 400 nm to 20 μm), where the silicon concentration is usually $1 \times 10^{17}$ $cm^{-3}$ or more, preferably $5 \times 10^{17}$ $cm^{-3}$ or more, more preferably $1 \times 10^{18}$ $cm^{-3}$ or more, still more preferably $3 \times 10^{18}$ $cm^{-3}$ or more, and usually about $6 \times 10^{19}$ $cm^{-3}$ or less, preferably $4 \times 10^{19}$ $cm^{-3}$ or less, more preferably $1 \times 10^{19}$ $cm^{-3}$ or less, still more preferably $7 \times 10^{18}$ $cm^{-3}$ or less. If the thickness $L_2$ of the second nitride semiconductor layer is less than 0.4 μm, when a pn junction device is fabricated, good pn characteristics can be hardly obtained, whereas if the thickness exceeds 20 μm, surface roughness is liable to be excessively produced.

The thickness $L_2$ is preferably 0.4 μm (400 nm) or more from the standpoint of making it easy to stabilize the electrical characteristics of a device fabricated and preventing the slight lattice defect remaining in the epitaxial growth initiating interface from adversely affecting the quantum well active layer structure of the device.

The thickness $L_2$ is important for adjusting the degree of unevenness on, for example, the nitride semiconductor layer surface while keeping the internal quantum efficiency of the quantum well active layer structure part to an adequate range, and generally, by forming an appropriately thick film under adequate epitaxial growth conditions, the degree of unevenness can be increased. However, formation of excessive unevenness is not preferred, and the upper limit of the unevenness is 20 μm.

If the dopant concentration in the second nitride semiconductor layer is less than $1 \times 10^{17}$ $cm^{-3}$, when a pn junction device is fabricated, good pn characteristics can be hardly obtained, whereas if the dopant concentration exceeds $6 \times 10^{19}$ $cm^{-3}$, the surface of the high concentration-doped nitride semiconductor layer is liable to be excessively roughened.

In the present invention, the first nitride semiconductor layer and the second nitride semiconductor layer preferably differ in the composition, because functional separation can be achieved. Preferably, the first nitride semiconductor layer has a function as a so-called buffer layer, and a part of the second nitride semiconductor layer has at least a function of injecting a carrier in the quantum well active layer structure part. For example, when the first nitride semiconductor layer is an undoped GaN layer in which Si or the like is not intentionally doped, the second nitride semiconductor layer is preferably an n-GaN layer in which Si or the like is intentionally doped. Functions of respective layers may be separated by intentionally changing the growth conditions and in this case, the layers may also differ in the concentration or the like of impurities contained. In this meaning, the first nitride semiconductor layer and the second nitride semiconductor layer preferably differ in the composition.

The present invention includes these steps A, B and C, but needless to say, an additional step may be added. For example, a step of forming a layer structure where two or more kinds of layers differing in the doping concentration are repeatedly stacked, a layer structure where two or more kinds of nitride semiconductor layers composed of different materials are repeatedly stacked, or the like may be added between the step B and the step C (between the first nitride semiconductor layer and the second nitride semiconductor layer). Furthermore, as described above, all of the achieving temperature in the temperature rise of the step A, the film deposition temperature of the first nitride semiconductor layer, and the film deposition temperature of the second nitride semiconductor layer are most preferably from 900° C. to 970° C. in the present invention.

Usually, in growing an i-GaN or n-GaN thick film on a c-plane GaN crystal, the achieving temperature in temperature rise or the growth temperature is most preferably a temperature in excess of 1,000° C., and crystal growth at a lower temperature than that results in reduced crystallinity. However, the results of experiments by the present inventors confirm that in the case of growing a crystal on a base with its principal surface being a nonpolar plane by the method of the present invention, the internal quantum efficiency is greatly enhanced by epitaxially growing the crystal at a temperature 100° C. or more lower than in general conditions.

Therefore, in order to obtain a relatively high internal quantum efficiency of the quantum well active layer structure part of the present invention, the nitride semiconductor layer is preferably formed at a relatively low temperature, and for this purpose, for example, as the Ga raw material, TEGa rather than TMGa is preferably used for not allowing carbon impurities mainly from an organic metal raw material to be mixed in the film. TEGa decomposes at a lower temperature than TMGa, and this is preferred because carbon can be prevented from being taken into the film and, for example, in the second nitride semiconductor layer, when doping it with Si or the like, a layer with little compensation by carbon can be formed.

Also, as illustrated in FIG. 2(G) and FIG. 2(A), a third step including, for example, a step of epitaxially growing a stack structure containing an MQW layer further on the second nitride semiconductor layer (step D), a step of growing a p-type dopant-containing nitride semiconductor layer crystal (step E), and a temperature drop step (F), may be provided.

In the step of epitaxially growing a stack structure containing an MQW layer on the second nitride semiconductor layer (step D), it is preferred to epitaxially grow the stack structure containing an MQW layer on the second nitride semiconductor layer in a state of the second nitride semiconductor layer surface being exposed to an atmosphere containing an inactive gas.

In both cases of FIG. 2(G) and FIG. 2(A), a multi-quantum well active layer structure comprising a stack structure of an InGaN layer and a GaN layer is formed on the second nitride semiconductor layer in an atmosphere containing $N_2$ as an inactive gas and an appropriate amount of $NH_3$ gas that is an active gas optionally required as the nitrogen raw material, where the main flow is composed of these gases.

For appropriately selecting the emission wavelength, the quantum well layer in the multi-quantum well active layer structure of the present invention preferably contains In, Al or the like, and most preferably contains In. The In concentration in the InGaN quantum well layer is, for example, from 0.04 to 0.15 in terms of compositional ratio, and the InGaN/GaN multi-quantum well active layer structure preferably emits light having a center wavelength of 400±30 nm (that is, from 370 to 430 nm).

The center wavelength is more preferably from 380 to 420 nm, and this corresponds to the range of approximately from 0.05 to 0.10 in terms of In compositional ratio of the InGaN quantum well layer. The center wavelength is most preferably from 395 to 415 nm, and this corresponds to the range of approximately from 0.06 to 0.09 in terms of In compositional ratio of the InGaN quantum well layer.

Generally, in an InGaN/GaN multi-quantum well active layer structure formed on a c-plane sapphire substrate, a large number of dislocations attributable to lattice constant mismatching or the like are usually propagating from an interface between the sapphire substrate and the GaN-based epitaxial layer to the entire epitaxial layer containing the multi-quantum well active layer structure, and the dislocation density is known to be about $1 \times 10^9$ cm$^{-2}$. It is also known that even when an epitaxial layer is formed using a substrate obtained by applying a concave-convex treatment to a sapphire substrate and the dislocations are thereby partially reduced, the dislocation density can be reduced only to about $3 \times 10^8$ cm$^{-2}$.

It is considered that In localizes the spatial position of an electron-hole pair in the quantum well layer and in turn, localizes the light emission and when a large number of dislocations are present, an electron-hole pair injected or produced in the quantum well layers is captured by such a dislocation or the like and prevented from undergoing non-emissive recombination.

On the other hand, in the present invention, the base is nitride on a nonpolar plane substrate. That is, in the present invention, the dislocation density in the epitaxial layer can be made very small. The results of experiments by the present invention reveal that the density of dislocations present in the epitaxial layer according to the present invention can be reduced to preferably $3 \times 10^7$ (cm$^{-2}$) or less, more preferably $5.0 \times 10^6$ (cm$^{-2}$) or less. Even when the effect of spatially localizing an electron-hole pair by In is small, light emission characteristics are good in the present invention.

Specifically, it is confirmed that even when the In compositional ratio of the InGaN quantum well layer is from 0.04 to 0.15, very good light emission characteristics are exhibited. It is preferred that the light emitted by the nitride semiconductor epitaxial layer according to the present invention has a center wavelength whose lower limit is preferably 370 nm or more, more preferably 380 nm or more, and upper limit is preferably 430 nm or less, more preferably 420 nm or less. The lower limit is specified in view of the minimum In composition of the InGaN layer required for forming a band offset with the GaN layer, and the upper limit is specified in view of the maximum In composition allowing for formation of a relatively thick InGaN quantum well layer which can be preferably used in the present invention.

The base temperature preferred in forming a quantum well active layer is specified for the purpose of stably forming an InGaN layer. Since In contained in the InGaN layer has a high vapor pressure, the quantum well active layer is preferably formed at a lower temperature than other layers. In particular, according to the studies by the present inventors, in the case of growth on a nonpolar plane, indium is little taken into the film unlike the growth on a polar plane even under the same growth conditions. Therefore, the temperature when forming an InGaN layer-containing quantum well active layer structure on an epitaxial layer formed on a flat nonpolar plane as in the present invention is preferably from 600° C. to 850° C. If the base temperature is less than 600° C., the decomposition efficiency of the nitrogen raw material is decreased or due to increase in the amount of impurities taken into the film, crystallinity is disadvantageously deteriorated.

If the temperature exceeds 850° C., re-evaporation of indium atom actively occurs and this makes it difficult to control the emission wavelength or ensure the in-plane uniformity, which are dependent on the indium composition. For this reason, the base temperature when forming a quantum well active layer is preferably set to be from 600° C. to 850° C. In the case where more reduction of the impurity content and higher wavelength repeatability are required, the base temperature is more preferably set to be from 700° C. to 760° C.

The pressure in the reacting furnace when forming a quantum well active layer is preferably not less than the pressure at the epitaxial growth of the first nitride semiconductor layer and is preferably 120 kPa or less.

This is because of the following reasons. In the step of stacking a quantum well active layer on the second nitride semiconductor layer, generation of defects needs to be suppressed in the presence of indium that is an element having a high vapor pressure. Therefore, the pressure in the reacting furnace is preferably set to be higher than in the step C, whereby excessive re-evaporation or the like of In that is an element having a high vapor pressure can be appropriately suppressed. However, if the pressure exceeds 120 kilopascals, a vapor phase reaction in the reacting furnace is increased, and carbon is liable to be taken into the nitride semiconductor layer during epitaxial growth, giving rise to reduction in the crystallinity. For this reason, the pressure in the reacting furnace is preferably not less than the pressure at the epitaxial growth of the first nitride semiconductor layer and is preferably 120 kPa or less.

As illustrated in FIG. 2(G) and FIG. 2(A), $NH_3$ gas which can work out to a nitrogen source of InGaN and GaN is supplied as the first main flow constituting the main flow, and $N_2$ is used as the second main flow constituting the main flow and is partially used as a carrier for supplying TMGa and TMIn. In the step D, gases are supplied such that the component ratio of inactive gas occupying in all gases constituting the main flow (in the sequence examples of FIG. 2(G) and FIG. 2(A), the component ratio of inactive gas to the total sum of $NH_3$ gas as the first main flow and $N_2$ gas, TMIn and TMGa as the second main flow in the case of a quantum well layer contained in the active layer structure, and the component ratio of inactive gas to the total sum of $NH_3$ gas as the first main flow and nitrogen gas and TMGa as the second main flow in the case of a barrier layer contained in the active layer structure) becomes from 0.5 and 1.0 in terms of flow rate ratio. In particular, in the case of a quantum well layer contained in the active layer structure, $H_2$ is preferably not supplied.

This is because introduction of an excessively active gas, particularly, introduction of $H_2$ gas having a high etching effect, extremely impairs the flatness of an InN-containing material such as InGaN, and this is liable to lead to reduction in the crystallinity of the active layer even in the case of a nitride semiconductor layer grown on a good-quality ground and passed through the first and second growth steps of the present invention. Therefore, it is not preferred to supply $H_2$.

However, in the growth under the conditions allowing for excessive presence of a nitrogen raw material that is an active gas, nitrogen desorption is suppressed and therefore, according to the studies by the present inventors, the component ratio of inactive gas occupying in all gasses constituting the main flow can be lowered to about 0.4.

In the present invention, the thickness of the active layer structure, particularly, the thickness of the quantum well layer in the quantum well active layer structure, which can be produced in the epitaxial growth step of a stack structure, contained in the third step, is preferably large.

Specifically, it is known that when the thickness of the quantum well layer in an InGaN/GaN multi-quantum well active layer structure formed on a c-plane sapphire substrate is approximately from 1 to 2 nm, the emission efficiency is highest. In this connection, one of the contributory factors is the fact that electron-hole pairs injected/produced in a multi-quantum well active layer structure formed on a polar plane are spatially separated and an ultrathin quantum well layer is suited for preventing the separation.

On the other hand, in the present invention, as described above, high-quality first and second nitride semiconductor layers can be formed on a base having a nonpolar plane free from generation of QCSE in principle, so that an ideal quantum structure having an adequately large thickness can be produced.

Furthermore, in the present invention, appropriate unevenness, interface fluctuation and thickness fluctuation may be imparted to the multi-quantum well active layer (MQW). This is a preferred embodiment because of the following reasons. That is, when MQW is taken as an aggregate of electromagnetic dipoles, addition of unevenness to MQW leads to a change in the direction of inner radiation and in turn, in the case of a GaN substrate and an outer medium, for example, air, leads to an increase in the radiation elements falling within the critical angle determined by the refractive index difference at the optical interface formed by GaN/air, which is nearly equal to applying a concave-convex treatment to the surface, and the light extraction efficiency is advantageously expected to be enhanced.

Such naturally occurring unevenness or fluctuation is added to MQW by forming InGaN having a certain level of thickness. If the thickness is small, the degree of unevenness is low, whereas if the thickness is excessively large, this is assumed to cause reduction in the internal quantum efficiency. Furthermore, such naturally occurring unevenness or fluctuation added to MQW can be increased in its degree by stacking a large number of layers such as MQW layer, as described in Examples and the like later.

From these two aspects, in fabricating, for example, a light-emitting element, high efficiency and high output power of the light-emitting element can be achieved when the volume of the quantum well layer in the multi-quantum well active layer structure is increased, and according to the experiments by the present inventors, the lower limit of the thickness of at least one arbitrary quantum well layer in the multi-quantum well active layer is preferably 10 nm or more, more preferably 15 nm or more. Furthermore, for all quantum well layers in the multi-quantum well active layer, the lower limit of the thickness of each layer is preferably 10 nm or more, more preferably 15 nm or more. This indicates that a quantum well layer or a multi-quantum well active layer structure, which are by far thicker than those in conventional methods, can be formed.

On the other hand, as for the quantum well layer in the quantum well active layer structure, in view of realizing highly efficient emissive recombination by so-called quantum size effect and preventing reduction in the crystal quality described below, an excessively thick quantum well layer is not preferred. According to the studies by the present inventors, the thickness is preferably 100 nm or less, more preferably 50 nm or less, still more preferably 30 nm or less, and most preferably 20 nm or less. The upper limit of this preferred thickness of the quantum well layer is also by far higher than that in conventional methods.

In the present invention, the number of quantum well layers is preferably larger than usual. This is because in the present invention, the layer formed on a nonpolar plane is prevented from being excessively reduced in the internal quantum efficiency and therefore, when just the number of well layers is increased and thickness fluctuation is thereby adequately added in the growth plane or the like, light extraction is expected to be enhanced. In the present invention, as described in Examples and the like, when quantum well layers are multiply-stacked, fluctuation can be added as needed in an appropriate range. For this reason, the number of quantum well layers in the multi-quantum well active layer structure is preferably from 2 to 100, more preferably from 4 to 50, still more preferably from 6 to 25, and most preferably from 8 to 15.

In the nitride semiconductor of the present invention, the dislocation density in the epitaxial layer is relatively low and thanks to this low dislocation density, even when the spatial localization effect of In on electron-hole pairs is reduced, in other words, even when an InGaN layer with a low In composition ratio is employed for the quantum well layer as described above, good light emission characteristics can be realized. Here, in the homoepitaxial growth on a GaN substrate, when an InGaN layer with a high In concentration is formed on a GaN layer, the InGaN layer is subjected to compressive stress in the growth plane direction.

Particularly, an InGaN quantum well layer in an InGaN/GaN quantum well active layer structure formed on a nonpolar plane, for example, on an m-plane GaN substrate, is subjected to an anisotropic compressive stress in the growth plane and therefore, the critical film thickness causing no impairment of the crystallinity of the InGaN layer having a high In concentration is by far smaller than the critical film thickness causing no impairment of the crystallinity of the InGaN layer having a low In concentration. That is, in an InGaN/GaN quantum well active layer structure formed as in conventional techniques by a method where only a structure having extremely bad morphology and many point defects can be formed on a nonpolar plane, the emission intensity needs to be enhanced by increasing the In concentration and utilizing the resulting spatial localization effect on electron-hole pairs, similarly to the growth on a sapphire substrate. Consequently, the film thickness of the InGaN layer cannot be increased due to limitation in the critical film thickness.

On the other hand, in the case of an InGaN quantum well layer having a relatively low In composition ratio of 0.04 to 0.15, which is preferably used in the present invention, film deposition to a large thickness is particularly preferred and can be implemented. In turn, the upper limit and the lower limit in the preferred thickness conditions of the quantum well layer are also relatively high compared with conventional techniques.

For these reasons, in the present invention, the thickness of the active layer structure, particularly, the thickness of the quantum well layer in the quantum well active layer structure, which can be produced in the epitaxial growth step of the stack structure contained in the third step, is preferably increased. Also, a larger number of quantum well layers than usual are preferably provided.

As illustrated in FIG. 2(G) and FIG. 2(A), the position of the layer containing a material capable of working out to a p-type dopant may be appropriately selected anywhere as long as the layer is located on the second nitride semiconductor layer, but it is preferred to have an MQW layer-containing stack structure on the second nitride semiconductor layer and further have thereon a layer containing a material capable of working out to a p-type dopant (step E). In this step, Mg is preferably used as the p-type dopant, and the concentration thereof is preferably from $1 \times 10^{19}$ to $8 \times 10^{19}$ cm$^{-3}$. The reasons are as follows.

Mg is hardly taken into a nitride crystal, and its concentration is a take-in rate-controlling factor. The way how the Mg is taken in greatly depends on the flatness of the surface. Therefore, when the surface flatness of the epitaxial layer on a nonpolar plane is excessively bad as is conventional techniques, the Mg concentration can be hardly controlled on the base surface, and an unintentionally low concentration may result or conversely, a layer having a very high concentration may be accidentally formed. On the other hand, in the case of a structure with good surface conditions or a structure imparted with adequate unevenness, which are obtained in the present invention, the Mg concentration can be stably controlled with good repeatability, as a result, a target value of the Mg concentration can be appropriately selected just as intended from a relatively wide range.

That is, there is not caused such a trouble that as in conventional methods, epitaxial growth is effected by intentionally decreasing the target value of the Mg concentration so as to avoid accidental formation of a layer having a high concentration and consequently, an extremely low concentration results. Therefore, the dopant concentration in a layer containing a material capable of working out to a p-type dopant, which is formed on a nonpolar plane with excellent surface flatness, can be set to a range considered to be relatively suitable for an AlGaN-based nitride semiconductor. The dopant concentration is usually $1 \times 10^{19}$ cm$^{-3}$ or more, more preferably $2 \times 10^{19}$ cm$^{-3}$ or more, and usually $8 \times 10^{19}$ cm$^{-3}$ or less, preferably $6 \times 10^{19}$ cm$^{-3}$ or less.

For the layer containing a material capable of working out to a p-type dopant, a layer containing $Al_xGa_{1-x}N$ ($0 \leq x \leq 1$) is preferably used. Particularly, in the case where the center wavelength of light emitted from an InGaN/GaN quantum well active layer structure with a low In composition ratio, which is suitably used in the present invention, is from 370 to 430 nm, the layer is preferably $Al_xGa_{1-x}N$ ($x \neq 0$) so as not to allow the light emitted from the active layer structure to be absorbed by the layer containing a material capable of working out to a p-type dopant.

According to the present invention, even when the first nitride semiconductor layer, the second nitride semiconductor layer formed thereon, and the active layer structure which can be further formed thereon, are an epitaxial layers formed on a nonpolar plane, adequate flatness can be realized. Therefore, also in the layer containing a material capable of working out to a p-type dopant, which is preferably formed on the epitaxial layer, a good $Al_xGa_{1-x}N$ ($x\neq 0$) layer can be formed even when the Al composition ratio is higher than usual and the layer thickness is larger than usual.

In general, the AlGaN layer on a GaN substrate is subject to a tensile stress in the layer. This stress increases as the Al composition ratio is higher and the film thickness is larger, and this is liable to allow for generation of cracking or the like and introduction of defects. However, on an epitaxial layer having adequate flatness and little defects, which is realized in the present invention, the degree of stress is reduced. As a result, a high-quality AlGaN layer can be grown even when the Al composition ratio is relatively high and the film thickness is relatively large.

According to the studies by the present inventors, the Al composition which can be preferably used is usually 0.02 or more, more preferably 0.03 or more, and is 0.20 or less, preferably 0.15 or less. The film thickness is usually 0.05 μm or more, preferably 0.10 μm or more, more preferably 0.12 μm or more, and usually 0.25 μm or less, preferably 0.20 μm or less, more preferably 0.18 μm or less.

In view of forming a p-side electrode on the semiconductor light-emitting element of the present invention, it is effective and preferred for satisfying both optical characteristics and electrical characteristics that a thin film having a small Al composition ratio, for example, a thin film of a low Al composition such as $Al_{0.025}Ga_{0.975}N$, is inserted as an interface layer of the electrode to reduce the contact resistance with the electrode and $Al_{0.10}Ga_{0.90}N$ is formed on the quantum well active layer structure side for suppressing the light absorption as described above, thereby configuring the layer containing a material capable of working out to a p-type dopant to have a two-layer structure.

For the same reasons as in the steps B and C, when importance is attached to flatness, the growth atmosphere in forming the layer containing a material capable of working out to a p-type dopant, for example, an $Al_xGa_{1-x}N$ ($0\leq x\leq 1$) layer, is preferably an inactive gas. However, even in an atmosphere mainly composed of $H_2$ gas that is an active gas, the layer can be formed without any problem. In particular, when the layer containing a material capable of working out to a p-type dopant, for example, an $Al_xGa_{1-x}N$ ($0\leq x\leq 1$) layer, has a small film thickness and its growth time is short, the layer can be preferably grown even in an atmosphere mainly composed of $H_2$ gas that is an active gas. Accordingly, the growth atmosphere in forming the layer containing a material capable of working out to a p-type dopant, for example, an $Al_xGa_{1-x}N$ ($0\leq x\leq 1$) layer, can be appropriately selected. For example, from the standpoint of preventing mixing of impurities such as carbon, the growth is preferably performed in an atmosphere mainly composed of $H_2$ gas that is an active gas, whereas when importance is attached to surface flatness, growth in an atmosphere mainly composed of $N_2$ is preferred.

Similarly to the growth of other layers, the base temperature during growth when forming the layer containing a material capable of working out to a p-type dopant, for example, an $Al_xGa_{1-x}N$ ($0\leq x\leq 1$) layer, is preferably from 600° C. to 1,350° C., more preferably from 650° C. to 1,200° C., still more preferably from 800° C. to 1,100° C., and most preferably from 900° C. to 970° C.

The pressure when forming the epitaxial layer containing a material capable of working out to a p-type dopant is preferably 30 kPa or more from the standpoint of suppressing the defect generation associated with introduction of Mg, and is preferably 120 kPa or less for inhibiting the above-described vapor phase reaction.

With respect to the nitride semiconductor layer using the semiconductor of the present invention, the temperature drop step after growth may be performed by an arbitrary procedure, but the temperature drop conditions are preferably as follows. That is, an activation process is performed during temperature drop so that the portion of the epitaxial layer containing a material capable of working out to a p-type dopant can be converted into a p-type layer (activation process during temperature drop step).

In this case, according to the studies by the present inventors, when a flat epitaxial layer containing a material capable of working out to a p-type dopant is formed on a nonpolar-plane base, the material capable of working out to a p-type dopant can be activated by the following temperature drop step schematically shown in FIG. 2(A).

Specifically, immediately after stopping the supply of the Group III raw material and the dopant raw material, drop in the base temperature is started by, for example, natural cooling of the substrate temperature, gradual cooling under temperature control, or cooling by means of a gas supplied. In the temperature drop step, $N_2$ is continuously supplied, an inactive gas is supplied, or another inactive gas is also supplied while continuously supplying $N_2$. At the same time, when $H_2$ is supplied in the growth step, this gas is thoroughly reduced or cut off and after decreasing the $NH_3$ flow rate to be lower than in the growth step, $NH_3$ is supplied until reaching an appropriate temperature. Thereafter, the substrate temperature is further lowered using only $N_2$ gas or only a mixed gas of $N_2$ gas and an inactive gas. The present inventors have found that the layer having an adequate flatness in its surface, being formed on a nonpolar plane and containing a material capable of working out to a p-type dopant can be converted into a p-type layer by such a procedure.

In the temperature drop step, the operation of decreasing the $NH_3$ flow rate to be lower than that during growth and after supplying $NH_3$ until reaching an appropriate temperature, stopping its supply is performed so as to prevent excessive escape of nitrogen as a constituent element of the epitaxial layer from the surface. This is analogous to the technical idea in the temperature rise step of the present invention.

Furthermore, according to the studies by the present inventors, the optimal p-type dopant activation sequence depends on the material constituting the outermost surface.

For example, in the case where the outermost surface is a GaN layer, after the completion of crystal growth sequence, that is, in this case, after stopping the supply of the Ga raw material such as TMGa and TEGa and the Mg raw material such as $Cp_2Mg$ and entering the temperature drop step, the flow rate of $NH_3$ is preferably from 100 cc/min (sccm) to 1 L/min (slm). On the other hand, in the case where the outermost surface is an AlGaN layer, escape of N from the surface scarcely occurs and therefore, after stopping the supply of the Group III raw material such as TMGa, TEGa and TMAl and the Mg raw material such as $Cp_2Mg$ and entering the temperature drop step, the flow rate of $NH_3$ is preferably from 30 (sccm) to 100 (sccm).

In either case, as for the temperature until which the introduction of $NH_3$ is continued in the temperature drop step, the introduction is preferably continued until reaching at least 965° C., and the gas is preferably cut off when lowered to 450° C. at the longest. In the temperature drop step, if the $NH_3$ supply is stopped at a too high temperature, this gives rise to an unintended excessive level of surface roughness, whereas if the $NH_3$ supply is continued until reaching an excessively low temperature, H atom from $NH_3$ is fixed in the crystal and the activation rate of Mg is reduced. For this reason, the $NH_3$ supply is most preferably stopped between 950° C. and 750° C.

The pressure range in the temperature drop step can be arbitrarily set, but according to the studies by the present inventors, the temperature drop step can be performed under reduced pressure, atmospheric pressure or applied pressure, and the pressure is preferably on the order of 13 to 203 kPa. In particular, when the step is performed under reduced pressure, desorption of H atom is accelerated and this is preferred, and when performed under applied pressure, the layer being formed on a nonpolar plane and containing a material capable of working out to a p-type dopant can be easily converted into a p-type layer and adequate surface flatness is also advantageously ensured. Incidentally, in consideration of productivity and the like, the pressure is preferably close to that during the epitaxial growth of a stack structure.

After the temperature drop step, a thermal post-temperature-drop-step annealing may be performed by using another apparatus or again increasing the temperature of the crystal growth apparatus, or a process of effecting p-type conversion of the epitaxial layer portion containing a material capable of working out to a p-type dopant by applying electron beam irradiation or the like after the temperature drop step may be separately performed (activation process after temperature drop step). Incidentally, it is optional to further apply the activation process after temperature drop step to the epitaxial layer formed on a nonpolar plane, which is passed through the activation process during temperature drop step according to the present invention.

The studies by the present inventors have revealed that even when the first nitride semiconductor layer, the second nitride semiconductor layer formed thereon and the active layer structure which can be further formed thereon are an epitaxial layer formed on a nonpolar plane and an epitaxial layer containing a material capable of working out to a p-type dopant is further formed thereon with an adequate flatness, the epitaxial layer formed on a nonpolar plane may be subject to relatively serious damage depending on the activation process after temperature drop step (for example, heat annealing), compared with similar layers formed on a c-plane sapphire substrate. In some cases, when the activation process after temperature drop step is performed to such an extent as sufficiently realizing the activation of Mg, the optical characteristics may be deteriorated.

However, the present inventors have confirmed that in the case of having first and second nitride semiconductor layers formed by crystal growth at a relatively low temperature and having a quantum well active layer structure formed by crystal growth at a relatively low temperature, the problem above can be overcome. Such a difference in the degree of deterioration in the activation process after temperature drop step, attributable to the difference in the growth temperature of the epitaxial layer formed on a nonpolar plane, is considered to be observed characteristically in an epitaxial layer formed on a nonpolar plane.

In the case where the epitaxial layer formed on a nonpolar plane, which is realized by the present invention, is subjected to the activation process after temperature drop step and this process is performed by so-called heat annealing, the heat annealing is preferably performed between 650° C. and 750° C., and most preferably between 680° C. and 720° C. The heat annealing time is preferably on the order of 1 to 30 minutes, and most preferably from 3 to 10 minutes. The atmosphere in performing the process is preferably an oxygen atmosphere, a nitrogen atmosphere or a mixed atmosphere thereof. The activation process after temperature drop step may also be performed as an electron irradiation process.

In the present invention, when the first nitride semiconductor layer, the second nitride semiconductor layer formed thereon and the active layer structure which can be further formed thereon are an epitaxial layer formed on a nonpolar plane and a layer containing a material capable of working out to a p-type dopant, which is preferably formed thereon, is further provided, with all things considered, the step of effecting p-type conversion of the epitaxial layer containing a material capable of working out to a p-type dopant is preferably the activation process during temperature drop process rather than the activation process after temperature drop step, which is separately performed, because the process is simple and damage is hardly introduced.

As described above, in the nitride semiconductor of the present invention, nitride on a nonpolar-plane substrate is used as a base, and the dislocation density in the epitaxial layer can be reduced. That is, the density of dislocations present in the epitaxial layer of the nitride semiconductor of the present invention is preferably $3 \times 10^7$ ($cm^{-2}$) or less, more preferably $5.0 \times 10^6$ ($cm^{-2}$) or less.

Figure 3:
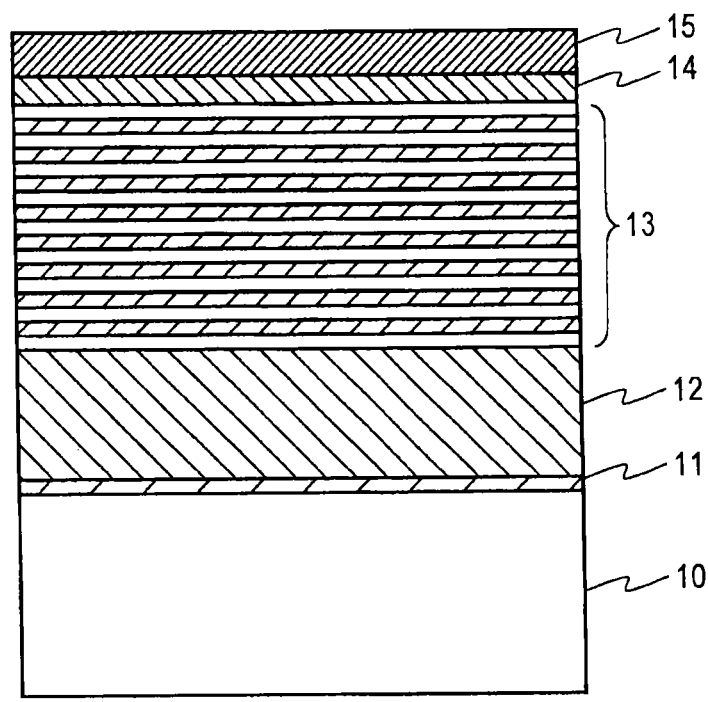
FIG. 3(A) A cross-sectional schematic view illustrating an example of the nitride semiconductor of the present invention.
FIG. 3(B) A cross-sectional schematic view illustrating an example of the nitride semiconductor of Examples 6 and 7.
FIG. 3(C) A cross-sectional schematic view illustrating an example of the nitride semiconductor of Example 9.
FIG. 3(D) A cross-sectional schematic view illustrating an example of the nitride semiconductor of Examples 11 and 13 and Reference Example 2.
FIG. 3(E) A cross-sectional schematic view illustrating an example of the nitride semiconductor of Example 12 and Comparative Example 1.
FIG. 3(F) A cross-sectional schematic view illustrating an example of the nitride semiconductor of Example 14 and Comparative Example 2.
FIG. 3(G) A cross-sectional schematic view illustrating an example of the nitride semiconductor of Example 15.
FIG. 3(H) A cross-sectional schematic view illustrating an example of the nitride semiconductor of Example 17.
Figure 3:
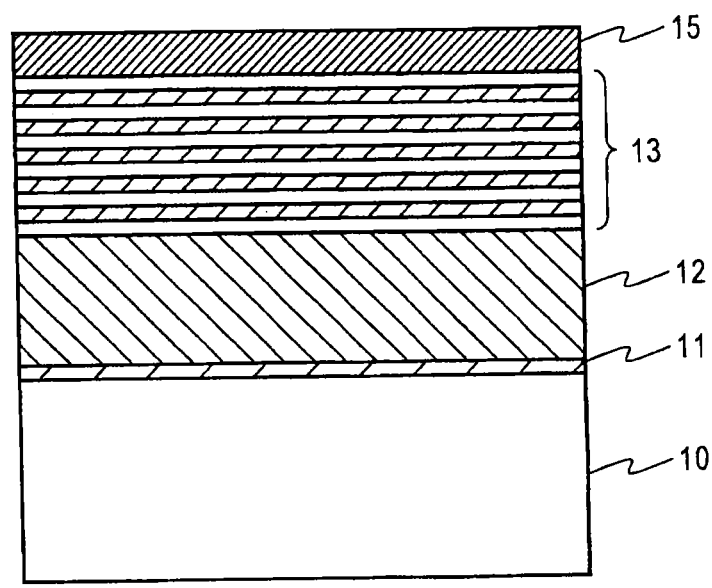
Figure 3:
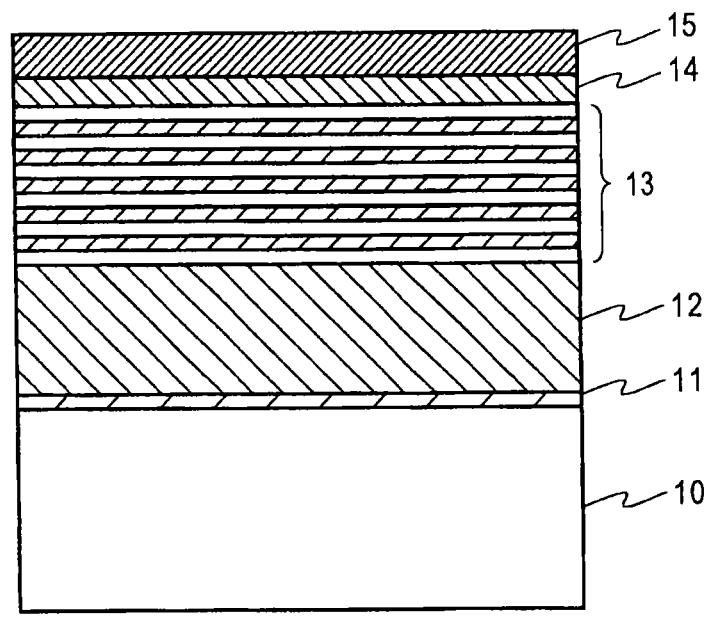
Figure 3:
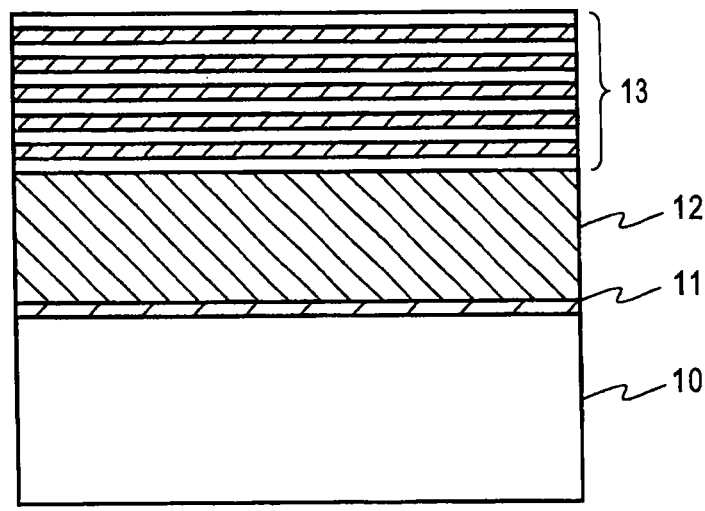
Figure 3:
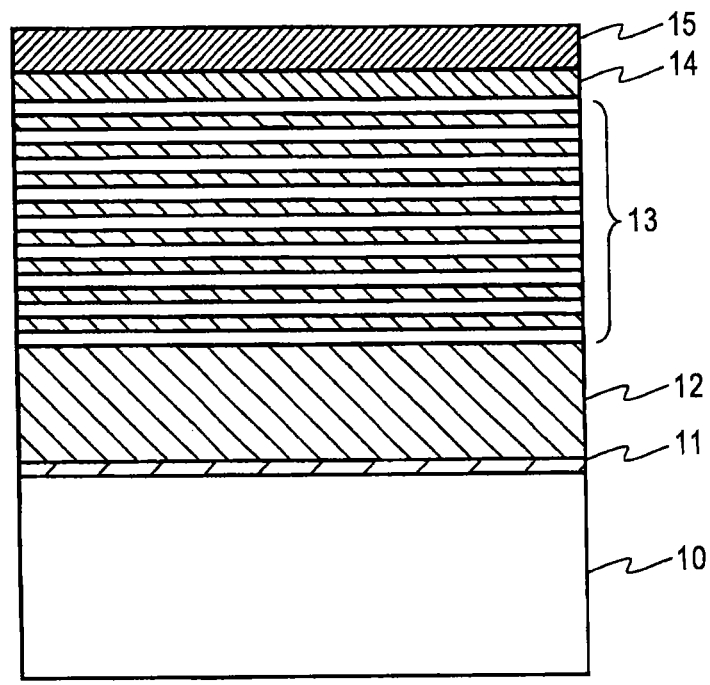
Figure 3:
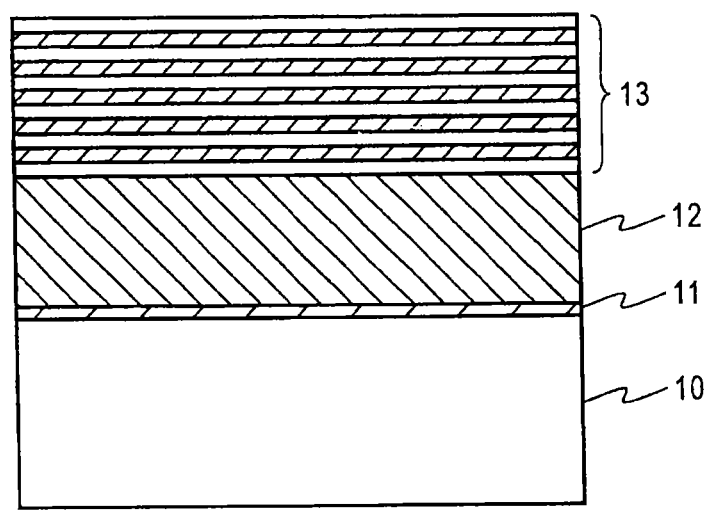
Figure 3:
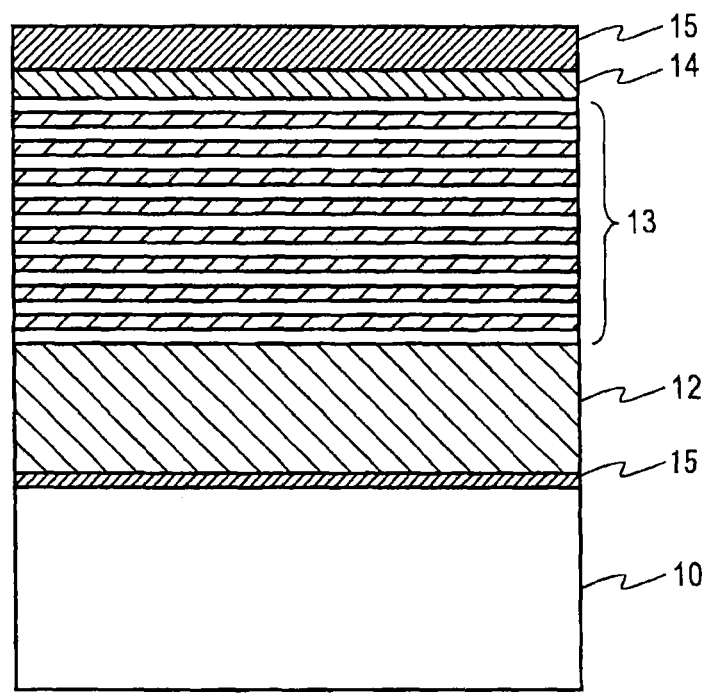
Figure 3:
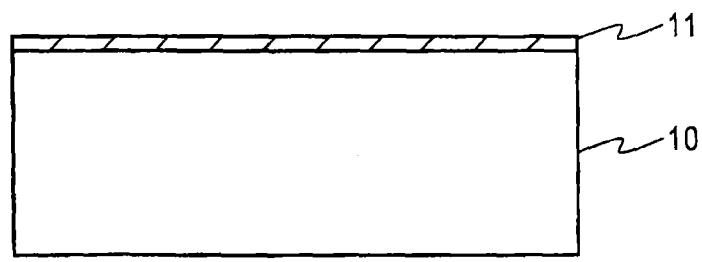

FIG. 3(A) is a cross-sectional schematic view for explaining an example of the thus-obtained nitride semiconductor of the present invention, where a GaN layer 11 not intentionally doped with Si and an n-type GaN layer 12 doped with Si are stacked on the principal surface of a GaN substrate 10 that is a self-supporting substrate with its principal surface being a (1-100) plane (m-plane), an InGaN/GaN multi-quantum well active layer structure 13 formed by alternately stacking an InGaN quantum well layer and a GaN barrier layer is provided on the n-type GaN layer 12, and an Mg-doped AlGaN layer 14 and a GaN layer 15 are formed on the multi-quantum well active layer structure 13.

The In concentration in the InGaN quantum well layer illustrated in FIG. 3(A) is, for example, from 0.04 to 0.15 in terms of compositional ratio, and the InGaN/GaN multi-quantum well active layer structure 13 can emit light with a wavelength of 400±30 nm.

Figure 4:
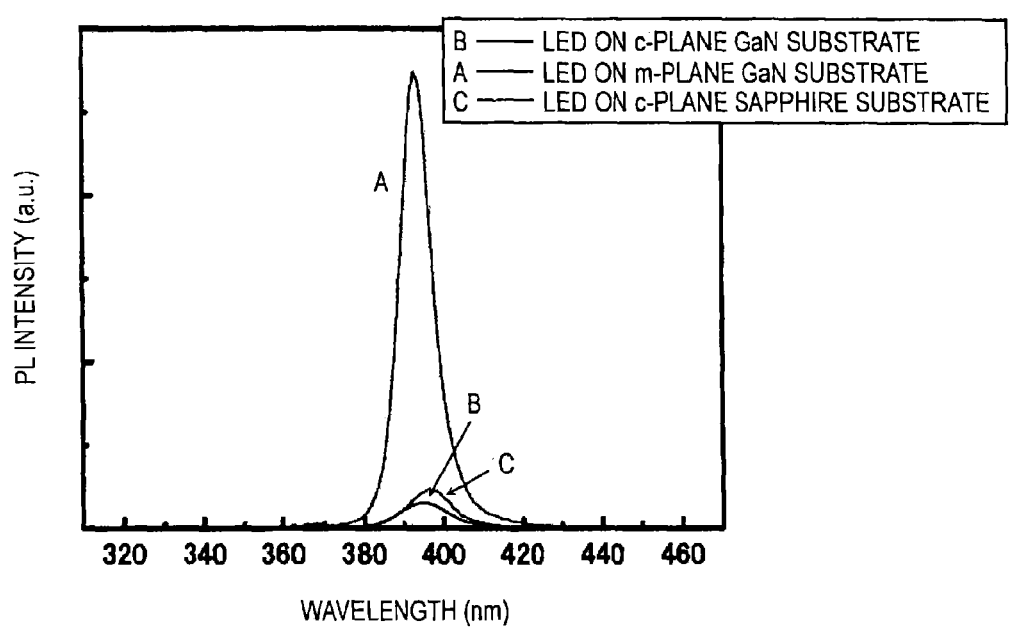
FIG. 4 A diagram for explaining the PL emission characteristics of a sample when LED having the structure shown in FIG. 3(A) is fabricated using an m-plane nitride semiconductor grown by the crystal growth method of the present invention.

FIG. 4 shows PL emission characteristics of Sample (A) that is an LED of the structure shown in FIG. 3(A) fabricated using an m-plane nitride semiconductor grown by the crystal growth method of the present invention. In the figure, for comparison with the PL characteristics of a c-plane nitride semiconductor LED, the results of LED Sample (B) using a c-plane nitride semiconductor grown on a c-plane standing GaN substrate, which is a c-plane nitride semiconductor LED for comparison, and LED Sample (C) using a c-plane nitride semiconductor grown on a sapphire substrate, are also shown. All of the LED samples are a light-emitting element of the stack structure shown in FIG. 3(A), and the crystal growth sequence of each sample is established by an optimal method according to the properties of each substrate. In all samples, the surface morphology was quite good.

As seen from the results shown in the Figure, the PL emission (A) from the light-emitting layer (MQW layer) of the LED sample of the present invention exhibits a significantly high intensity compared with the PL emissions (B and C) from the light-emitting layers (MQW layer) of the c-plane nitride semiconductor LED samples. This difference in the PL intensity is attributable to the difference in the crystallinity of the light-emitting layer of each LED sample, and the present inventors consider that the main cause thereof is the first and second nitride semiconductor layers adequately formed on a nonpolar plane (particularly, on a GaN self-supporting substrate having an m-plane in the outermost surface) reduced in the QCSE effect, where the thickness of the second nitride semiconductor layer is from 400 nm to 20 μm and therefore, the emission efficiency of the light-emitting layer (MQW layer) formed on this nitride semiconductor crystal layer is remarkably enhanced.

The present inventors believe that such effects are obtained for the first time by the crystal growth method of the present invention.

More specifically, in order to obtain a relatively high internal quantum efficiency of the quantum well active layer structure part of the present invention, the gas species constituting the main flow from the temperature rise step to the epitaxial growth step of the first and second nitride semiconductor layers is controlled to contain an inactive gas; as an optional configuration, the epitaxial growth surface with the principal surface being a nonpolar plane or the surface exposed during the epitaxial growth is prevented from being excessively exposed to $H_2$ gas that is an active gas; and as an optional configuration, even when $NH_3$ as an active gas capable of working out to a nitrogen raw material and $H_2$ as an active gas are supplied, the ratio of inactive gas occupying in all gas species constituting the main flow from the temperature rise step to the epitaxial growth step of the first and second nitride semiconductor layers is adjusted to be from 0.5 to 1.0 in terms of flow rate, whereby an m-plane nitride semiconductor layer with high crystallinity is obtained and the crystallinity of the quantum well active layer structure (MQW layer) epitaxially grown thereon is also elevated.

In addition, the QCSE effect is suppressed in the surface of a nonpolar m-plane nitride semiconductor and therefore, the emission efficiency from the light-emitting layer (MQW layer) containing an appropriate amount of In as a composition is increased.

Figure 5:
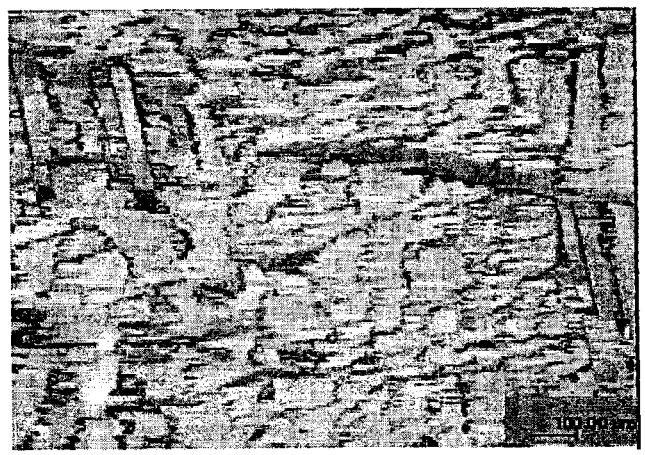
FIG. 5(A) A differential interference microscopy image of Sample A for explaining the results when estimating the constituent gas species dependency of a main flow during epitaxial growth of the first and second nitride layers.
FIG. 5(B) A differential interference microscopy image of Sample B for explaining the results when estimating the constituent gas species dependency of a main flow during epitaxial growth of the first and second nitride layers.
FIG. 5(C) A differential interference microscopy image of Sample C for explaining the results when estimating the constituent gas species dependency of a main flow during epitaxial growth of the first and second nitride layers.
Figure 5:
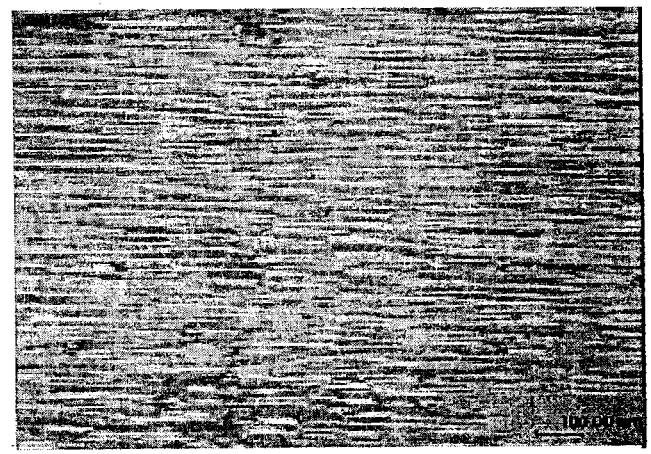
Figure 5:

FIGS. 5(A) to 5(C) are differential interference microscopy images for explaining the results of studies into the dependency on constituent gases of the main flow (see Table 1) during epitaxial growth (steps B and C) of first and second nitride layers. All samples are an m-plane nitride semiconductor crystal being grown on an m-plane standing GaN substrate and having a nearly m-plane surface, and in the present invention, nitride semiconductors formed by any of the methods are preferred.

In all samples, the epitaxial growth was performed using $N_2$ gas for the main flow in the first temperature rise step and using a mixed gas of $N_2$ and $NH_3$ (the flow rate ratio of the inactive gas component to all gases constituting the main flow: Fp=0.75) for the main flow in the second temperature rise step.

Sample A (FIG. 5(A)) is a result obtained by supplying, as the main flow, $NH_3$, $H_2$ and TMGa in the step B, and $NH_3$, $H_2$, TMGa and $SiH_4$ in the step C.

Sample B (FIG. 5(B)) is a result obtained by supplying, as the main flow, $NH_3$, $N_2$, $H_2$ and TMGa in the step B, and $NH_3$, $N_2$, $H_2$, TMGa and $SiH_4$ in the step C.

Sample C (FIG. 5(C)) is a result obtained by supplying, as the main flow, $NH_3$, $N_2$ and TMGa in the step B, and $NH_3$, $N_2$, $H_2$, TMGa and $SiH_4$ in the step C.

The flow rate ratio Fp of inactive gas to all gases constituting the main flow in each step is shown in Table 1.

TABLE 1

| Sample No. | A | B | C |
|---|---|---|---|
| Flow rate ratio of inactive gas to all gases constituting main flow in step B | 0 | 0.24999 | 0.73747 |
| Flow rate ratio of inactive gas to all gases constituting main flow in step C | 0 | 0.24997 | 0.7309 |

As seen from the results shown in FIGS. 5(A) to 5(C), when the ratio of inactive gas to gases constituting the main flow in the crystal growth step is small and in particular, $H_2$ gas is adequately contained therein, adequate unevenness can be intentionally formed in a self-forming manner on, for example, the nitride semiconductor layer surface (FIGS. 5(A) and 5(B)). On the other hand, when the ratio of inactive gas to gases constituting the main flow is large and $N_2$ is the major constituent gas of the main flow, the surface is flattened (FIG. 5(C)).

According to the studies by the present inventors, when an Si source is intentionally supplied in the form of, for example, $SiH_4$ or $Si_2H_6$ during epitaxial growth of the first nitride semiconductor layer (step B), unevenness can be intentionally formed in a self-forming manner. Also, when the pressure in the reacting furnace in the steps A and B is excessively reduced (less than 35 kilopascals), the crystallinity of the first GaN layer is macroscopically reduced and this reduction in crystallinity leads to deterioration of the characteristics of the light-emitting layer.

Here, in order to obtain a relatively high internal quantum efficiency of the quantum well active layer structure part in the step A (the period $t_A$), the step B and the step C, the ratio of inactive gas to gases constituting the main flow had to be 0.5 or more.

Furthermore, the thickness of the first GaN layer has an appropriate range and in order to obtain a nitride semiconductor film excellent in the surface conditions and light emission characteristics, the first nitride semiconductor layer epitaxially grown without intentionally supplying excess Si in the form of, for example, $SiH_4$ or $Si_2H_6$ is preferably a relatively thin layer whose thickness is from 0.1 to 300 nm, more preferably from 1.0 nm to 150 nm, and most preferably in the range of 5.0 nm to 50 nm.

The present inventors understand these results as follows. First, when the first nitride semiconductor layer is formed as a film intentionally doped with excess Si, a product resulting from a vapor phase reaction of $SiH_4$ or $Si_2H_6$ as a supply source of Si attaches to the base surface and the first nitride semiconductor layer surface immediately after the initiation of growth and prevents uniform growth in the plane. That is, microscopically, the first nitride semiconductor layer in the initial stage of growth starts local crystal growth in the plane. Once such non-uniform crystal growth in plane is started, a film having relatively good surface morphology cannot be formed.

Accordingly, in the initial stage of epitaxial growth of a nitride semiconductor layer, it is important to eliminate an appropriate amount of product giving rise to non-uniform crystal growth in plane. Once uniform crystal growth is started in plane, even when an Si-doped nitride semiconductor crystal is grown, the surface morphology is not deteriorated significantly. This is the reason why in the present invention, the first nitride semiconductor layer is grown without intentionally doping excess Si.

Of course, the vapor phase reaction of $SiH_4$ can be easily suppressed also by reducing the pressure in the reacting furnace and therefore, even a sample where the first nitride semiconductor layer is an Si-doped film can have certainly good surface conditions. However, when the amount of Si doped is too large and the pressure in the reacting furnace is excessively reduced, desorption of nitrogen from the surface is induced and defects are thereby introduced, as a result, the microscopic crystallinity is extremely deteriorated. Accordingly, in order to appropriately reduce both the defect introduction into the first nitride semiconductor layer and the growth inhibition ascribable to a vapor phase reaction of the Si supply source, it is preferred that the pressure in the reacting furnace is not excessively reduced, that is, kept at 35 kilopascals or more, and the first nitride semiconductor layer is epitaxially grown without doping excess Si.

Incidentally, it was also confirmed that in newly growing a nitride semiconductor layer on such a first nitride semiconductor layer, even when the pressure in the reacting furnace is reduced or Si is doped is used for the purpose of, for example, increasing the growth speed, the nitride semiconductor layer is scarcely deteriorated in its surface morphology or optical characteristics.

For this reason, the first nitride semiconductor layer in the present invention is considered to be sufficient if it does not excessively contain an element working out to a growth inhibition factor. Accordingly, the configuration by GaN not intentionally doped with excess Si is allowed to include various modes and as long as excess Si is not intentionally doped, the first nitride semiconductor layer can be a Group III-V nitride semiconductor such as InN, AlN, BN, GaInN, GaAlN, GaBN, InAlN, InBN, AlBN, GaInAlN, GaInBN, InAlBN and GaInAlBN (hereinafter, these are sometimes collectively referred to as a GaN-based semiconductor). Furthermore, an embodiment where the first nitride semiconductor layer is epitaxially grown by supplying an element capable of working out to a dopant except for Si, such as O, Mg or Zn, may also be employed.

As described later in Examples, it is confirmed that even when Mg or the like is intentionally doped, in newly growing a nitride semiconductor layer on the first nitride semiconductor layer, the entire epitaxial layer formed thereafter is scarcely deteriorated in its surface morphology or optical characteristics. In particular, as for the GaN-based material, a higher effect in view of heat resistance related to the adherence to the ground is yielded by an Mg-doped layer rather than by an Si-doped or an undoped layer, and this is confirmed by the present inventors.

Accordingly, an Mg-doped layer even in a co-doped state with Si can be preferably used as a first nitride semiconductor layer when heat resistance related to adherence to the base surface is required. For example, such a layer is preferably used in fabrication of a template or a light-emitting element.

On the other hand, a first nitride semiconductor layer formed without intentionally doping excess Si can be suitably used for applications such as light-emitting element and electronic device. In the case where the first nitride semiconductor layer is an adequately Si-doped layer, adequate unevenness is formed in the surface and when the entire epitaxial layer is fabricated into a light-emitting element, the emission efficiency is increased. Particularly, in the present invention, when the internal quantum efficiency is also controlled to such an extent as not being excessively reduced, Ra is about 200 nm and roughness in the same level as the wavelength is naturally formed and acts effectively for light extraction. Accordingly, such an embodiment can be preferably used for a light-emitting element and the like.

As a result, the outermost surface of the epitaxial layer obtained by stacking a first nitride semiconductor layer and a second nitride semiconductor layer, which are formed by the present invention, and furthermore, the outermost surface of the epitaxial layer obtained by further forming a stack structure on the stack of the first nitride semiconductor layer and the second nitride semiconductor layer, can be realized by creating a morphology with adequate unevenness.

The surface morphology of the nitride semiconductor of the present invention can be measured using a contact step meter by determining the average surface roughness or centerline average roughness (Ra) indicative of the degree of unevenness. In the case of a flat surface morphology without unevenness is required of the nitride semiconductor of the present invention, the outermost surface thereof preferably has Ra of 20.0 nm or less, more preferably Ra of 10.0 nm or less, still more preferably Ra of 8.0 nm or less, and most preferably Ra of 6.0 nm or less.

On the other hand, as described above, when adequate unevenness is formed with an expectation to improve light extraction and thereby enhance the emission efficiency of a light-emitting element, Ra of the outermost surface of the nitride semiconductor of the present invention is usually 100 nm or more, preferably 150 nm or more, and usually 300 nm or less, preferably 250 nm or less. This range is preferred because the scattering function acts efficiently in the wavelength suitably utilized in the present invention.

Ra as used herein is a value determined by linearly scanning the sample surface with a stylus to obtain a roughness curve, folding back the roughness curve at a centerline, and dividing the area defined by the folded roughness curve and the centerline by the scan length.

In the case where a flat morphology is required of the nitride semiconductor of the present invention, when the active layer has a quantum well layer, the standard deviation in the in-plane thickness of the quantum well layer is usually 0.45 nm or less, preferably 0.4 nm or less, more preferably 0.35 nm or less.

Also, in the case of obtaining a relatively high internal quantum efficiency of the quantum well active layer structure part of the present invention, the variation coefficient in the in-plane thickness of the quantum well layer is usually 0.10 or less, preferably 0.09 nm or less. These numerical values of the standard deviation in the in-plane thickness of the quantum well layer and the variation coefficient in the in-plane thickness have grounds which are empirically supported by a large amount of experimental data accumulated by the present inventors and described in detail in Examples later.

Furthermore, the major characteristic features of the nitride semiconductor of the present invention are that: (i) the internal quantum efficiency measured under specific conditions is significantly higher than conventionally known values; (ii) the photoluminescence lifetime ($\tau(PL)$) is greatly longer than conventionally known values; and (iii) the emissive recombination lifetime ($\tau(R)$) is extremely shorter than conventionally known values. In the case of obtaining a relatively high internal quantum efficiency, it is also preferred in practice that (iv) the emissive recombination lifetime ($\tau(R)$) is shorter than non-emissive recombination lifetime ($\tau(NR)$). Moreover, these very excellent values were confirmed for the first time when measured under the low excitation density condition specified in the present invention.

That is, in the above-described nitride semiconductor of the present invention (a nitride semiconductor containing a first nitride semiconductor layer, a second nitride semiconductor layer and an active layer-containing stack structure, on the principal nitride surface of a base with at least one principal surface being nonpolar nitride), the internal quantum efficiency as determined by CW-PL measurement of the active layer under low excitation density condition is 20% or more, preferably 30% or more, more preferably 35% or more.

Also, in the nitride semiconductor of the present invention, the internal quantum efficiency as determined by pulsed PL measurement of the active layer under low excitation density condition is 20% or more, preferably 25% or more.

Also, in the nitride semiconductor of the present invention, the photoluminescence lifetime ($\tau(PL)$) as determined by time-resolved PL measurement of the active layer at room temperature under low excitation density condition is 1 ns or more, preferably 1.5 ns or more.

These numerical values for very excellent characteristic features have grounds which are empirically supported by a large amount of experimental data accumulated by the present inventors and described in detail in Examples later.

The present invention is described in greater detail below by referring to Examples and Comparative Examples.

Example 1

This Example is an example where gallium nitride-based semiconductor thin films were grown in a stacked manner by the MOCVD method to fabricate a near ultraviolet light-emitting LED. The outline of a series of crystal growth processes is already described by referring to FIG. 2(A). FIG. 3(A) schematically shows the configuration of layers grown.

A (1-100) plane (m-plane) oriented standing GaN substrate was used as the base. The substrate size was 4.1 mm in the c-axis direction and 15 mm in the a-axis direction. As for the electrical characteristics, the substrate was n-type and the carrier density was $6.6 \times 10^{17}$ cm$^{-3}$. According to X-ray diffraction analysis, the half-width of a rocking curve in (10-12) reflection was 34.2 arcsec, the OFF angle in the c(+) direction was 0.25°, and the OFF angle in the a direction was 0.03°. Also, the dislocation density was $5.0 \times 10^6$ cm$^{-2}$.

The m-plane standing GaN substrate was placed on a tray (susceptor) in a horizontal quartz-made reacting furnace where normal conditions are growth under atmospheric pressure. The pressure in the reacting furnace was set to 100±2 kPa in all steps.

First, as the first temperature rise step $t_B$, the temperature was raised while supplying $N_2$ at 10 L/min as a main flow into the reacting furnace. When the base temperature reached 400° C., the second temperature rise step $t_A$ was started, where NH$_3$ was supplied at 7.5 L/min as a gas constituting the first main flow and $N_2$ was supplied at 12.5 L/min as a gas constituting the second main flow.

Thereafter, the substrate temperature was further raised to 1,000° C. while increasing the rates of NH$_3$ and $N_2$ to 10 L/min and 30 L/min, respectively. At this time, the subflow was $N_2$ gas at 20 L/min and the growth-irrelevant gas for purging or the like was $N_2$ at 19 L/min in total. In the second temperature rise step, the flow rate ratio Fp of the inactive gas component to all gases constituting the main flow was 0.625 at the start of the second temperature rise step and 0.75 when the growth temperature was reached.

In the next step B, NH$_3$ was supplied at 10 L/min as a gas constituting the first main flow. Also, as gases constituting the second main flow, $N_2$ at 29.5 L/min, $H_2$ at 0.5 L/min, and TMGa (0.0018 L/min on the condition of a concentration of 100%) with a carrier gas of $H_2$ (0.5 L/min) forming a part of the main flow were supplied into the furnace. By supplying these gases of the main flow, an undoped GaN layer (first nitride semiconductor layer) was grown to a thickness of 40 nm.

At this time, the subflow was a mixed gas (20.5 L/min) of NH$_3$ (0.5 L/min) and $N_2$ (20 L/min) and the growth-irrelevant gas for purging or the like was $N_2$ at 19 L/min. The flow rate ratio Fp of the inactive gas component to all gases constituting the main flow during the growth of the first nitride semiconductor layer was 0.73747.

In the next step C, NH$_3$ was supplied at 10 L/min as a gas constituting the first main flow. Also, as gases constituting the second main flow, $N_2$ at 29.24 L/min, $H_2$ at 0.76 L/min, TMGa (0.0055 L/min on the condition of a concentration of 100%) with a carrier gas of $H_2$ (0.5 L/min) forming a part of the main flow, and SiH$_4$ ($6 \times 10^{-7}$ L/min on the condition of a concentration of 100%) with a carrier gas of $H_2$ (0.2 L/min) forming a part of the main flow and a diluent gas of $H_2$ (0.06 L/min) were supplied into the reacting furnace.

By supplying these gases of the main flow, an Si-doped GaN layer (second nitride semiconductor layer) was grown to a thickness of 7 μm. At this time, the subflow was a mixed gas (25.5 L/min) of NH$_3$ (0.5 L/min) and $N_2$ (25 L/min) and the growth-irrelevant gas for purging or the like was $N_2$ at 19 L/min. The flow rate ratio Fp of the inactive gas component to all gases constituting the main flow during the growth of the second nitride semiconductor layer was 0.73090.

Subsequently, the base temperature (substrate temperature) was set to 740° C. and after the substrate temperature was sufficiently stabilized, a multi-quantum well active layer structure where a quantum well layer of In$_{0.07}$Ga$_{0.93}$N (target thickness: 1.5 nm) and a barrier layer of GaN (target thickness: 13 nm) were alternately stacked for 8 periods, was formed (step D). Here, in the growth of the quantum well layer of In$_{0.07}$Ga$_{0.93}$N, NH$_3$ (10 L/min) was used as a gas constituting the first main flow.

Also, as gases constituting the second main flow, $N_2$ (20 L/min), TMGa (0.000015 L/min) with a carrier gas of $N_2$ (0.5 L/min) forming a part of the main flow, and trimethylindium (TMIn) (0.00023 L/min) with a carrier gas of $N_2$ (0.5 L/min) forming a part of the main flow were supplied.

In the growth of the GaN barrier layer, NH$_3$ (10 L/min) was used as a gas constituting the first main flow. Also, as gases constituting the second main flow, $N_2$ (18.5 L/min), $H_2$ (1.5 L/min), and TMGa (0.000017 L/min) with a carrier gas of $H_2$ (0.5 L/min) forming a part of the main flow were supplied.

In the step D, the subflow was a mixed gas at 25.5 L/min of NH$_3$ (0.5 L/min) and $N_2$ (25 L/min) and the growth-irrelevant gas for purging or the like was $N_2$ at 19 L/min. The flow rate ratio Fp of the inactive gas component to all gases constituting the main flow during the growth of the multi-quantum well active layer structure was 0.66666 in the case of the InGaN well layer and 0.61667 in the case of the GaN barrier layer.

Thereafter, the substrate temperature was set to 1,000° C. and an Mg-doped Al$_{0.1}$Ga$_{0.9}$N layer was formed to a thickness of 50 nm (step E). At this time, the gas constituting the first main flow was NH$_3$ (10 L/min).

Also, gases constituting the second main flow were $H_2$ (80 L/min), trimethylaluminum (TMAl) (0.0001 L/min) with a carrier gas of $H_2$ (0.5 L/min) forming a part of the main flow, TMGa (0.0018 L/min) with a carrier gas of $H_2$ (0.5 L/min) forming a part of the same main flow, and cyclopentadienyl magnesium (Cp$_2$Mg) (4×10$^{-6}$ L/min) with a carrier gas of H$_2$ (0.5 L/min) forming a part of the same main flow.

On the Mg-doped Al$_{0.1}$Ga$_{0.9}$N layer, an Mg-doped GaN layer was further epitaxially grown to a thickness of 70 nm (step E). The growth of this GaN layer was performed by cutting the supply of TMAl and H$_2$ (50 L/min) out of the above-described gases in the main flow.

In the step E, during the growth of the Al$_{0.1}$Ga$_{0.9}$N layer, the subflow was a mixed gas at 50.5 L/min of NH$_3$ (0.5 L/min) and N$_2$ (50 L/min) and the growth-irrelevant gas for purging or the like was N$_2$ (19 L/min). The flow rate ratio Fp of the inactive gas component to all gases constituting the main flow during the growth of the Mg-doped Al$_{0.1}$Ga$_{0.9}$N layer was 0.

Also, in the step E, during the growth of the Mg-doped GaN layer, the subflow was a mixed gas at 20.5 L/min of NH$_3$ (0.5 L/min) and N$_2$ (20 L/min) and the growth-irrelevant gas for purging or the like was N$_2$ (19 L/min). The flow rate ratio Fp of the inactive gas component to all gases constituting the main flow during the growth of the Mg-doped GaN layer was 0.

After the completion of these growth steps, the substrate temperature was lowered, the gases in the reacting furnace were completely replaced with N$_2$ gas, and then, the substrate was taken out and evaluated.

The surface of the thus-produced substrate was extremely flat. The surface was measured by a contact step meter to determine the average surface roughness or centerline average roughness (Ra) indicative of the degree of unevenness.

As a result, Ra of the substrate of this Example was 4.9 nm. As for the PL characteristics evaluated by exciting the substrate with laser light at a wavelength of 325 nm, the peak wavelength was 391 nm, the integrated intensity thereof was as high as 96 in terms of relative value, and the standard deviation of wavelength distribution in plane was as small as 0.8%.

Example 2

This Example is an example where gallium nitride-based semiconductor thin films were grown in a stacked manner by the MOCVD method to fabricate a near ultraviolet light-emitting LED. The outline of a series of crystal growth processes is already described by referring to FIG. 2(A). FIG. 3(A) schematically shows the configuration of layers grown.

A (1-100) plane (m-plane) oriented standing GaN substrate was used as the base. The substrate size was 4.2 mm in the c-axis direction and 15 mm in the a-axis direction. As for the electrical characteristics, the substrate was n-type and the carrier density was 6.7×10$^{17}$ cm$^{-3}$. According to X-ray diffraction analysis, the half-width of a rocking curve in (10-12) reflection was 32.8 arcsec, the OFF angle in the c(+) direction was 0.29°, and the OFF angle in the a direction was 0.05°. Also, the dislocation density was 5.4×10$^6$ cm$^{-2}$. The m-plane standing GaN substrate was placed on a tray (susceptor) in a horizontal quartz-made reacting furnace where normal conditions are growth under atmospheric pressure. The pressure in the reacting furnace was set to 100±2 kPa in all steps.

First, as the first temperature rise step $t_B$, the temperature was raised while supplying N$_2$ at 10 L/min as a main flow into the reacting furnace. When the base temperature reached 400° C., the second temperature rise step $t_A$ was started, where NH$_3$ was supplied at 7.5 L/min as a gas constituting the first main flow and N$_2$ was supplied at 12.5 L/min as a gas constituting the second main flow.

Thereafter, the substrate temperature was further raised to 1,000° C. while increasing the rates of NH$_3$ and N$_2$ to 10 L/min and 30 L/min, respectively. At this time, the subflow was N$_2$ gas at 20 L/min and the growth-irrelevant gas for purging or the like was N$_2$ at 19 L/min in total. In the second temperature rise step, the flow rate ratio Fp of the inactive gas component to all gases constituting the main flow was 0.625 at the start of the second temperature rise step and 0.75 when the growth temperature was reached.

In the next step B, NH$_3$ was supplied at 20 L/min as a gas constituting the first main flow. Also, as gases constituting the second main flow, N$_2$ at 29.5 L/min, H$_2$ at 0.5 L/min, and TMGa (0.0018 L/min on the condition of a concentration of 100%) with a carrier gas of H$_2$ (0.5 L/min) forming a part of the main flow were supplied into the furnace. By supplying these gases of the main flow, an undoped GaN layer (first nitride semiconductor layer) was grown to a thickness of 40 nm.

At this time, the subflow was a mixed gas (20.5 L/min) of NH$_3$ (0.5 L/min) and N$_2$ (20 L/min) and the growth-irrelevant gas for purging or the like was N$_2$ at 19 L/min. The flow rate ratio Fp of the inactive gas component to all gases constituting the main flow during the growth of the first nitride semiconductor layer was 0.58998.

Subsequent steps C, D and E were performed under the same conditions as in Example 1.

After the completion of these growth steps, the substrate temperature was lowered, the gases in the reacting furnace were completely replaced with N$_2$ gas, and then, the substrate was taken out and evaluated.

The surface of the thus-produced substrate had good flatness, though there was slight unevenness.

The surface was measured by a contact step meter to determine centerline average roughness (Ra). As a result, Ra of the substrate of this Example was 17.4 nm. As for the PL characteristics evaluated by exciting the substrate with laser light at a wavelength of 325 nm, the peak wavelength was 396 nm, the integrated intensity thereof was as high as 68 in terms of relative value, and the standard deviation of wavelength distribution in plane was as small as 0.9%.

Example 3

This Example is an example where gallium nitride-based semiconductor thin films were grown in a stacked manner by the MOCVD method to fabricate a near ultraviolet light-emitting LED. The outline of a series of crystal growth processes is already described by referring to FIG. 2(A). FIG. 3(A) schematically shows the configuration of layers grown.

A (1-100) plane (m-plane) oriented standing GaN substrate was used as the base. The substrate size was 4.0 mm in the c-axis direction and 15 mm in the a-axis direction. As for the electrical characteristics, the substrate was n-type and the carrier density was 6.4×10$^{17}$ cm$^{-3}$. According to X-ray diffraction analysis, the half-width of a rocking curve in (10-12) reflection was 36.7 arcsec, the OFF angle in the c(+) direction was 3.4°, and the OFF angle in the a direction was 0.3°. Also, the dislocation density was 5.1×10$^6$ cm$^{-2}$. The m-plane standing GaN substrate was placed on a tray (susceptor) in a horizontal quartz-made reacting furnace where normal conditions are growth under atmospheric pressure. The pressure in the reacting furnace was set to 100±2 kPa in all steps.

First, as the first temperature rise step $t_B$, the temperature was raised while supplying N$_2$ at 10 L/min as a main flow into the reacting furnace. When the base temperature reached 400° C., the second temperature rise step $t_4$ was started, where $NH_3$ was supplied at 7.5 L/min as a gas constituting the first main flow and $N_2$ was supplied at 10 L/min as a gas constituting the second main flow.

Thereafter, the substrate temperature was further raised to 1,000° C. while increasing the rates of $NH_3$ and $N_2$ to 15 L/min and 15 L/min, respectively. At this time, the subflow was $N_2$ gas at 20 L/min and the growth-irrelevant gas for purging or the like was $N_2$ at 19 L/min in total. In the second temperature rise step, the flow rate ratio Fp of the inactive gas component to all gases constituting the main flow was 0.57143 at the start of the second temperature rise step and 0.50 when the growth temperature was reached.

In the next step B, $NH_3$ was supplied at 10 L/min as a gas constituting the first main flow. Also, as gases constituting the second main flow, $N_2$ at 29.5 L/min, $H_2$ at 0.5 L/min, and TMGa (0.0018 L/min on the condition of a concentration of 100%) with a carrier gas of $H_2$ (0.5 L/min) forming a part of the main flow were supplied into the reacting furnace. By supplying these gases of the main flow, an undoped GaN layer (first nitride semiconductor layer) was grown to a thickness of 120 nm.

At this time, the subflow was a mixed gas (20.5 L/min) of $NH_3$ (0.5 L/min) and $N_2$ (20 L/min) and the growth-irrelevant gas for purging or the like was $N_2$ at 19 L/min. The flow rate ratio Fp of the inactive gas component to all gases constituting the main flow during the growth of the first nitride semiconductor layer was 0.73747.

In the next step C, $NH_3$ was supplied at 10 L/min as a gas constituting the first main flow. Also, as gases constituting the second main flow, $N_2$ at 29.294 L/min, $H_2$ at 0.706 L/min, TMGa (0.0055 L/min on the condition of a concentration of 100%) with a carrier gas of $H_2$ (0.5 L/min) forming a part of the main flow, and $SiH_4$ ($6 \times 10^{-8}$ L/min on the condition of a concentration of 100%) with a carrier gas of $H_2$ (0.2 L/min) forming a part of the main flow and a diluent gas of $H_2$ (0.006 L/min) were supplied into the reacting furnace. By supplying these gases of the main flow, an Si-doped GaN layer (second nitride semiconductor layer) was grown to a thickness of 1 μm.

At this time, the subflow was a mixed gas (25.5 L/min) of $NH_3$ (0.5 L/min) and $N_2$ (25 L/min) and the growth-irrelevant gas for purging or the like was $N_2$ at 19 L/min. The flow rate ratio Fp of the inactive gas component to all gases constituting the main flow during the growth of the second nitride semiconductor layer was 0.78579.

Subsequently, the base temperature (substrate temperature) was set to 740° C. and after the substrate temperature was sufficiently stabilized, a multi-quantum well active layer structure where a quantum well layer of $In_{0.07}Ga_{0.93}N$ (target thickness: 1.5 nm) and a barrier layer of GaN (target thickness: 13 nm) were alternately stacked for 8 periods, was formed (step D). Here, in the growth of the quantum well layer of $In_{0.07}Ga_{0.93}N$, $NH_3$ (10 L/min) was used as a gas constituting the first main flow.

Also, as gases constituting the second main flow, $N_2$ (20 L/min), TMGa (0.000015 L/min) with a carrier gas of $N_2$ (0.5 L/min) forming a part of the main flow, and TMIn (0.00023 L/min) with a carrier gas of $N_2$ (0.5 L/min) forming a part of the main flow were supplied.

In the growth of the GaN barrier layers, $NH_3$ (10 L/min) was used as a gas constituting the first main flow. Also, as gases constituting the second main flow, $N_2$ (18.5 L/min), $H_2$ (1.5 L/min), and TMGa (0.000017 L/min) with a carrier gas of $H_2$ (0.5 L/min) forming a part of the main flow were supplied.

In the step D, the subflow was a mixed gas at 25.5 L/min of $NH_3$ (0.5 L/min) and $N_2$ (25 L/min) and the growth-irrelevant gas for purging or the like was $N_2$ at 19 L/min. The flow rate ratio Fp of the inactive gas component to all gases constituting the main flow during the growth of the multi-quantum well active layer structure was 0.66666 in the case of the InGaN well layer and 0.61667 in the case of the GaN barrier layer.

Thereafter, the substrate temperature was set to 1,000° C. and an Mg-doped $Al_{0.1}Ga_{0.9}N$ layer was formed to a thickness of 50 nm (step E). At this time, the gas constituting the first main flow was $NH_3$ (10 L/min). Also, gases constituting the second main flow were $H_2$ (80 L/min), TMAl (0.0001 L/min) with a carrier gas of $H_2$ (0.5 L/min) forming a part of the main flow, TMGa (0.0018 L/min) with a carrier gas of $H_2$ (0.5 L/min) forming a part of the same main flow, and $Cp_2Mg$ ($4 \times 10^{-6}$ L/min) with a carrier gas of $H_2$ (0.5 L/min) forming a part of the same main flow.

On the Mg-doped $Al_{0.1}Ga_{0.9}N$ layer, an Mg-doped GaN layer was further epitaxially grown to a thickness of 70 nm (step E). The growth of this GaN layer was performed by cutting the supply of TMAl and $H_2$ (50 L/min) out of the above-described gases in the main flow.

In the step E, during the growth of the $Al_{0.1}Ga_{0.9}N$ layer, the subflow was a mixed gas at 50.5 L/min of $NH_3$ (0.5 L/min) and $N_2$ (50 L/min) and the growth-irrelevant gas for purging or the like was $N_2$ (19 L/min). The flow rate ratio Fp of the inactive gas component to all gases constituting the main flow during the growth of the Mg-doped $Al_{0.1}Ga_{0.9}N$ layer was 0.

Also, in the step E, during the growth of the Mg-doped GaN layer, the subflow was a mixed gas at 20.5 L/min of $NH_3$ (0.5 L/min) and $N_2$ (20 L/min) and the growth-irrelevant gas for purging or the like was $N_2$ (19 L/min). The flow rate ratio Fp of the inactive gas component to all gases constituting the main flow during the growth of the Mg-doped GaN layer was 0. After the completion of these growth steps, the substrate temperature was lowered, the gases in the reacting furnace were completely replaced with $N_2$ gas, and then, the substrate was taken out and evaluated.

The surface of the thus-produced substrate had good flatness, though there was very slight unevenness. The surface was measured by a contact step meter to determine centerline average roughness (Ra). As a result, Ra of the substrate of this Example was 8.2 nm. As for the PL characteristics evaluated by exciting the substrate with laser light at a wavelength of 325 nm, the peak wavelength was 390 nm, the integrated intensity thereof was as high as 45 in terms of relative value, and the standard deviation of wavelength distribution in plane was as small as 0.9%.

Example 4

This Example is an example where gallium nitride-based semiconductor thin films were grown in a stacked manner by the MOCVD method to fabricate a near ultraviolet light-emitting LED. The outline of a series of crystal growth processes is described by referring to FIG. 2(B). FIG. 3(A) schematically shows the configuration of layers grown.

A (1-100) plane (m-plane) oriented standing GaN substrate was used as the base. The substrate size was 3.8 mm in the c-axis direction and 15 mm in the a-axis direction. As for the electrical characteristics, the substrate was n-type and the carrier density was $6.9 \times 10^{17}$ cm$^{-3}$. According to X-ray diffraction analysis, the half-width of a rocking curve in (10-12) reflection was 30.4 arcsec, the OFF angle in the c(+)

direction was −1.35°, and the OFF angle in the a direction was 1.01°. Also, the dislocation density was 5.6×10$^6$ cm$^{-2}$.

The m-plane standing GaN substrate was placed on a tray (susceptor) in a horizontal quartz-made reacting furnace where normal conditions are growth under atmospheric pressure. The pressure in the reacting furnace was set to 100±2 kPa in all steps.

First, as the first temperature rise step $t_B$, the temperature was raised while supplying N$_2$ at 10 L/min as a main flow into the reacting furnace. When the base temperature reached 400° C., the second temperature rise step $t_A$ was started, where NH$_3$ was supplied at 10 L/min as a gas constituting the first main flow and N$_2$ was supplied at 17.5 L/min as a gas constituting the second main flow.

Thereafter, the substrate temperature was further raised to 700° C. while increasing the rates of NH$_3$ and N$_2$ to 12.5 L/min and 17.5 L/min, respectively. At this time, the subflow was N$_2$ gas at 20 L/min and the growth-irrelevant gas for purging or the like was N$_2$ at 19 L/min in total. In the second temperature rise step, the flow rate ratio Fp of the inactive gas component to all gases constituting the main flow was 0.50 at the start of the second temperature rise step and 0.58333 when the growth temperature was reached.

In the next step B, NH$_3$ was supplied at 10 L/min as a gas constituting the first main flow. Also, as gases constituting the second main flow, N$_2$ at 29.5 L/min, H$_2$ at 0.5 L/min, and TMGa (0.0018 L/min on the condition of a concentration of 100%) with a carrier gas of H$_2$ (0.5 L/min) forming a part of the main flow were supplied into the reacting furnace. By supplying these gases of the main flow, an undoped GaN layer (first nitride semiconductor layer) was grown to a thickness of 1 nm.

At this time, the subflow was a mixed gas (20.5 L/min) of NH$_3$ (0.5 L/min) and N$_2$ (20 L/min) and the growth-irrelevant gas for purging or the like was N$_2$ at 19 L/min. The flow rate ratio Fp of the inactive gas component to all gases constituting the main flow during the growth of the first nitride semiconductor layer was 0.73747.

In the next step C, NH$_3$ was supplied at 10 L/min as a gas constituting the first main flow. Also, as gases constituting the second main flow, N$_2$ at 39.24 L/min, H$_2$ at 0.82 L/min, TMGa (0.0055 L/min on the condition of a concentration of 100%) with a carrier gas of H$_2$ (0.5 L/min) forming a part of the main flow, and SiH$_4$ (6×10$^{-8}$ L/min on the condition of a concentration of 100%) with a carrier gas of H$_2$ (0.2 L/min) forming a part of the main flow and a diluent gas of H$_2$ (0.006 L/min) were supplied into the reacting furnace. By supplying these gases of the main flow, an Si-doped GaN layer (second nitride semiconductor layer) was grown to a thickness of 0.5 μm.

At this time, the subflow was a mixed gas (25.5 L/min) of NH$_3$ (0.5 L/min) and N$_2$ (25 L/min) and the growth-irrelevant gas for purging or the like was N$_2$ at 19 L/min. The flow rate ratio Fp of the inactive gas component to all gases constituting the main flow during the growth of the second nitride semiconductor layer was 0.78377.

Subsequently, the base temperature (substrate temperature) was set to 740° C. and after the substrate temperature was sufficiently stabilized, a multi-quantum well active layer structure where a quantum well layer of In$_{0.11}$Ga$_{0.89}$N (target thickness: 1.5 nm) and a barrier layer of GaN (target thickness: 13 nm) were alternately stacked for 8 periods, was formed (step D).

Here, in the growth of the quantum well layer of In$_{0.11}$Ga$_{0.89}$N, NH$_3$ (10 L/min) was used as a gas constituting the first main flow. Also, as gases constituting the second main flow, N$_2$ (20 L/min), TMGa (0.000015 L/min) with a carrier gas of N$_2$ (0.5 L/min) forming a part of the main flow, and TMIn (0.00023 L/min) with a carrier gas of N$_2$ (0.5 L/min) forming a part of the main flow were supplied.

In the growth of the GaN barrier layers, NH$_3$ (10 L/min) was used as a gas constituting the first main flow. Also, as gases constituting the second main flow, N$_2$ (18.5 L/min), H$_2$ (1.5 L/min), and TMGa (0.000017 L/min) with a carrier gas of H$_2$ (0.5 L/min) forming a part of the main flow were supplied.

In the step D, the subflow was a mixed gas at 25.5 L/min of NH$_3$ (0.5 L/min) and N$_2$ (25 L/min) and the growth-irrelevant gas for purging or the like was N$_2$ at 19 L/min. The flow rate ratio Fp of the inactive gas component to all gases constituting the main flow during the growth of the multi-quantum well active layer structure was 0.66666 in the case of the InGaN well layer and 0.61667 in the case of the GaN barrier layer.

Thereafter, the substrate temperature was set to 1,000° C. and an Mg-doped Al$_{0.1}$Ga$_{0.9}$N layer was formed to a thickness of 50 nm (step E). At this time, the gas constituting the first main flow was NH$_3$ (10 L/min). Also, gases constituting the second main flow were H$_2$ (80 L/min), TMAl (0.0001 L/min) with a carrier gas of H$_2$ (0.5 L/min) forming a part of the main flow, TMGa (0.0018 L/min) with a carrier gas of H$_2$ (0.5 L/min) forming a part of the same main flow, and Cp$_2$Mg (4×10$^{-6}$ L/min) with a carrier gas of H$_2$ (0.5 L/min) forming a part of the same main flow.

On the Mg-doped Al$_{0.1}$Ga$_{0.9}$N layer, an Mg-doped GaN layer was further epitaxially grown to a thickness of 70 nm (step E). The growth of this GaN layer was performed by cutting the supply of TMAl and H$_2$ (50 L/min) out of the above-described gases in the main flow.

In the step E, during the growth of the Al$_{0.1}$Ga$_{0.9}$N layer, the subflow was a mixed gas at 50.5 L/min of NH$_3$ (0.5 L/min) and N$_2$ (50 L/min) and the growth-irrelevant gas for purging or the like was N$_2$ (19 L/min). The flow rate ratio Fp of the inactive gas component to all gases constituting the main flow during the growth of the Mg-doped Al$_{0.1}$Ga$_{0.9}$N layer was 0.

Also, in the step E, during the growth of the Mg-doped GaN layer, the subflow was a mixed gas at 20.5 L/min of NH$_3$ (0.5 L/min) and N$_2$ (20 L/min) and the growth-irrelevant gas for purging or the like was N$_2$ (19 L/min). The flow rate ratio Fp of the inactive gas component to all gases constituting the main flow during the growth of the Mg-doped GaN layer was 0.

After the completion of these growth steps, the substrate temperature was lowered, the gases in the reacting furnace were completely replaced with N$_2$ gas, and then, the substrate was taken out and evaluated.

The surface of the thus-produced substrate was extremely flat. The surface was measured by a contact step meter to determine centerline average roughness (Ra). As a result, Ra of the substrate of this Example was 5.2 nm. As for the PL characteristics evaluated by exciting the substrate with laser light at a wavelength of 325 nm, the peak wavelength was 412 nm, the integrated intensity thereof was as high as 90 in terms of relative value, and the standard deviation of wavelength distribution in plane was as small as 1.0%.

Example 5

This Example is an example where gallium nitride-based semiconductor thin films were grown in a stacked manner by the MOCVD method to fabricate a blue LED. The outline of a series of crystal growth processes is already described by referring to FIG. 2(A). FIG. 3(A) schematically shows the configuration of layers grown.

A (1-100) plane (m-plane) oriented standing GaN substrate was used as the base. The substrate size was 12 mm in the c-axis direction and 20 mm in the a-axis direction. As for the electrical characteristics, the substrate was n-type and the carrier density was $1.5 \times 10^{18}$ cm$^{-3}$. According to X-ray diffraction analysis, the half-width of a rocking curve in (10-12) reflection was 48.1 arcsec, the OFF angle in the c(+) direction was −0.85°, and the OFF angle in the a direction was 2.64°. Also, the dislocation density was $4.0 \times 10^6$ cm$^{-2}$.

The m-plane standing GaN substrate was placed on a tray (susceptor) in a horizontal quartz-made reacting furnace where normal conditions are growth under atmospheric pressure. The pressure in the reacting furnace was set to 100±2 kPa in all steps.

First, as the first temperature rise step $t_B$, the temperature was raised while supplying N$_2$ at 10 L/min as a main flow into the reacting furnace. When the base temperature reached 400° C., the second temperature rise step $t_A$ was started, where NH$_3$ was supplied at 7.5 L/min as a gas constituting the first main flow and N$_2$ was supplied at 10 L/min as a gas constituting the second main flow.

Thereafter, the substrate temperature was further raised to 1,000° C. while increasing the rates of NH$_3$ and N$_2$ to 10 L/min and 17.5 L/min, respectively. At this time, the subflow was N$_2$ gas at 20 L/min and the growth-irrelevant gas for purging or the like was N$_2$ at 19 L/min in total. In the second temperature rise step, the flow rate ratio Fp of the inactive gas component to all gases constituting the main flow was 0.57143 at the start of the second temperature rise step and 0.63636 when the growth temperature was reached.

In the next step B, NH$_3$ was supplied at 10 L/min as a gas constituting the first main flow. Also, as gases constituting the second main flow, N$_2$ at 49.5 L/min, H$_2$ at 0.5 L/min, and TMGa (0.0018 L/min on the condition of a concentration of 100%) with a carrier gas of H$_2$ (0.5 L/min) forming a part of the main flow were supplied into the reacting furnace. By supplying these gases of the main flow, an undoped GaN layer (first nitride semiconductor layer) was grown to a thickness of 15 nm.

At this time, the subflow was a mixed gas (20.5 L/min) of NH$_3$ (0.5 L/min) and N$_2$ (20 L/min) and the growth-irrelevant gas for purging or the like was N$_2$ at 19 L/min. The flow rate ratio Fp of the inactive gas component to all gases constituting the main flow during the growth of the first nitride semiconductor layer was 0.82498.

In the next step C, NH$_3$ was supplied at 10 L/min as a gas constituting the first main flow. Also, as gases constituting the second main flow, N$_2$ at 49.24 L/min, H$_2$ at 0.82 L/min, TMGa (0.0055 L/min on the condition of a concentration of 100%) with a carrier gas of H$_2$ (0.5 L/min) forming a part of the main flow, and SiH$_4$ ($6 \times 10^{-8}$ L/min on the condition of a concentration of 100%) with a carrier gas of H$_2$ (0.2 L/min) forming a part of the main flow and a diluent gas of H$_2$ (0.006 L/min) were supplied into the reacting furnace. By supplying these gases of the main flow, an Si-doped GaN layer (second nitride semiconductor layer) was grown to a thickness of 5 μm.

At this time, the subflow was a mixed gas (25.5 L/min) of NH$_3$ (0.5 L/min) and N$_2$ (25 L/min) and the growth-irrelevant gas for purging or the like was N$_2$ at 19 L/min. The flow rate ratio Fp of the inactive gas component to all gases constituting the main flow during the growth of the second nitride semiconductor layer was 0.81977.

Subsequently, the base temperature (substrate temperature) was set to 700° C. and after the substrate temperature was sufficiently stabilized, a multi-quantum well active layer structure where a quantum well layer of In$_{0.14}$Ga$_{0.86}$N (target thickness: 1.5 nm) and a barrier layer of GaN (target thickness: 13 nm) were alternately stacked for 8 periods, was formed (step D). Here, in the growth of the quantum well layer of In$_{0.14}$Ga$_{0.86}$N, NH$_3$ (10 L/min) was used as a gas constituting the first main flow.

Also, as gases constituting the second main flow, N$_2$ (20 L/min), TMGa (0.000008 L/min) with a carrier gas of N$_2$ (0.5 L/min) forming a part of the main flow, and TMIn (0.00023 L/min) with a carrier gas of N$_2$ (0.5 L/min) forming a part of the main flow were supplied.

In the growth of the GaN barrier layers, NH$_3$ (10 L/min) was used as a gas constituting the first main flow. Also, as gases constituting the second main flow, N$_2$ (18.5 L/min), H$_2$ (1.5 L/min), and TMGa (0.000017 L/min) with a carrier gas of H$_2$ (0.5 L/min) forming a part of the main flow were supplied.

In the step D, the subflow was a mixed gas at 25.5 L/min of NH$_3$ (0.5 L/min) and N$_2$ (25 L/min) and the growth-irrelevant gas for purging or the like was N$_2$ at 19 L/min. The flow rate ratio Fp of the inactive gas component to all gases constituting the main flow during the growth of the multi-quantum well active layer structure was 0.66666 in the case of the InGaN well layer and 0.61667 in the case of the GaN barrier layer.

Thereafter, the substrate temperature was set to 1,000° C. and an Mg-doped Al$_{0.1}$Ga$_{0.9}$N layer was formed to a thickness of 50 nm (step E). At this time, the gas constituting the first main flow was NH$_3$ (10 L/min).

Also, gases constituting the second main flow were H$_2$ (80 L/min), TMAl (0.0001 L/min) with a carrier gas of H$_2$ (0.5 L/min) forming a part of the main flow, TMGa (0.0018 L/min) with a carrier gas of H$_2$ (0.5 L/min) forming a part of the same main flow, and Cp$_2$Mg ($4 \times 10^{-6}$ L/min) with a carrier gas of H$_2$ (0.5 L/min) forming a part of the same main flow.

On the Mg-doped Al$_{0.1}$Ga$_{0.9}$N layer, an Mg-doped GaN layer was further epitaxially grown to a thickness of 70 nm (step E). The growth of this GaN layer was performed by cutting the supply of TMAl and H$_2$ (50 L/min) out of the above-described gases in the main flow.

In the step E, during the growth of the Al$_{0.1}$Ga$_{0.9}$N layer, the subflow was a mixed gas at 50.5 L/min of NH$_3$ (0.5 L/min) and N$_2$ (50 L/min) and the growth-irrelevant gas for purging or the like was N$_2$ (19 L/min). The flow rate ratio Fp of the inactive gas component to all gases constituting the main flow during the growth of the Mg-doped Al$_{0.1}$Ga$_{0.9}$N layer was 0.

Also, in the step E, during the growth of the Mg-doped GaN layer, the subflow was a mixed gas at 20.5 L/min of NH$_3$ (0.5 L/min) and N$_2$ (20 L/min) and the growth-irrelevant gas for purging or the like was N$_2$ (19 L/min). The flow rate ratio Fp of the inactive gas component to all gases constituting the main flow during the growth of the Mg-doped GaN layer was 0.

After the completion of these growth steps, the substrate temperature was lowered, the gases in the reacting furnace were completely replaced with N$_2$ gas, and then, the substrate was taken out and evaluated.

The surface of the thus-produced substrate was extremely flat. The surface was measured by a contact step meter to determine centerline average roughness (Ra). As a result, Ra of the substrate of this Example was 4.8 nm. As for the PL characteristics evaluated by exciting the substrate with laser light at a wavelength of 325 nm, the peak wavelength was 440 nm, the integrated intensity thereof was as high as 51 in terms of relative value, and the standard deviation of wavelength distribution in plane was 1.1%.

Example 6

This Example is an example where gallium nitride-based semiconductor thin films were grown in a stacked manner by the MOCVD method to fabricate a near ultraviolet light-emitting LED. The outline of a series of crystal growth processes is described by referring to FIG. 2(C). FIG. 3(B) schematically shows the configuration of layers grown.

A (1-100) plane (m-plane) oriented standing GaN substrate was used as the base. The substrate size was 10 mm in the c-axis direction and 15 mm in the a-axis direction. As for the electrical characteristics, the substrate was n-type and the carrier density was $6.7 \times 10^{17}$ cm$^{-3}$.

According to X-ray diffraction analysis, the half-width of a rocking curve in (10-12) reflection was 31.1 arcsec, the OFF angle in the c(+) direction was 4.2°, and the OFF angle in the a direction was 0.02°. Also, the dislocation density was $5.2 \times 10^6$ cm$^{-2}$.

The m-plane standing GaN substrate was placed on a susceptor in a vertical SUS-made reacting furnace where normal conditions are growth under reduced pressure. In this apparatus, piping corresponding to the subflow was no provided.

First, the pressure in the reacting furnace was set to 40 kPa and as the first temperature rise step $t_B$, the temperature was raised while supplying $N_2$ at 20 L/min as a main flow into the reacting furnace. When the base temperature reached 400° C., the second temperature rise step $t_A$ was started.

In this step, as a gas constituting the first main flow, 1,1-dimethyl hydrazine (1,1-DMHy) which is an inactive gas was supplied at 0.003 L/min by with a carrier gas of $N_2$ (0.5 L/min) forming a part of the main flow. Also, $N_2$ was supplied at 15 L/min as a gas constituting the second main flow.

Thereafter, the substrate temperature was further raised to 1,040° C. while increasing the rate of $N_2$ to 20 L/min. At this time, the growth-irrelevant gas for purging or the like was $N_2$ gas at 6.375 L/min in total. The flow rate ratio Fp of the inactive gas component to all gases constituting the main flow in the second temperature rise step was 1.0 from the start of the second temperature rise step to the time when the growth temperature was reached.

In the next step B, the pressure in the reacting furnace was set to 40 kPa and as a gas constituting the first main flow, 1,1-DMHy with a carrier gas of $N_2$ (0.5 L/min) forming a part of the main flow was supplied at 0.0229 L/min. Also, as gases constituting the second main flow, $N_2$ at 20 L/min and TMGa (0.0018 L/min on the condition of a concentration of 100%) with a carrier gas of $N_2$ (0.5 L/min) forming a part of the main flow were supplied into the reacting furnace. By supplying these gases of the main flow, an undoped GaN layer (first nitride semiconductor layer) was grown to a thickness of 40 nm. At this time, the growth-irrelevant gas for purging or the like was $N_2$ at 6.375 L/min. The flow rate ratio Fp of the inactive gas component to all gases constituting the main flow during the growth of the first nitride semiconductor layer was 0.99875.

In the next step C, the pressure in the reacting furnace was set to 8 kPa and as a gas constituting the first main flow, 1,1-DMHy with a carrier gas of $N_2$ (2.27 L/min) forming a part of the main flow was supplied at 0.104 L/min. Also, as gases constituting the second main flow, $N_2$ at 20 L/min, TMGa (0.0018 L/min on the condition of a concentration of 100%) with a carrier gas of $N_2$ (0.5 L/min) forming a part of the main flow, and SiH$_4$ ($6 \times 10^{-8}$ L/min on the condition of a concentration of 100%) with a diluent gas of $N_2$ (0.2 L/min) forming a part of the main flow were supplied into the reacting furnace. By supplying these gases of the main flow, an Si-doped GaN layer (second nitride semiconductor layer) was grown to a thickness of 4 µm.

At this time, the growth-irrelevant gas for purging or the like was $N_2$ at 6.375 L/min. The flow rate ratio Fp of the inactive gas component to all gases constituting the main flow during the growth of the second nitride semiconductor layer was 0.99448.

Subsequently, the pressure in the reacting furnace set to 67 kPa, and a multi-quantum well active layer structure where a quantum well layer of In$_{0.07}$Ga$_{0.93}$N (target thickness: 1.5 nm) at the base temperature (substrate temperature) of 740° C. and a barrier layer of GaN (target thickness: 13 nm) at the base temperature of 840° C. were alternately stacked for 5 periods, was formed (step D). Here, in the growth of the quantum well layer of In$_{0.07}$Ga$_{0.93}$N, NH$_3$ (12 L/min) was used as a gas constituting the first main flow. Also, as gases constituting the second main flow, $N_2$ (10 L/min), TMGa (0.000008 L/min) with a carrier gas of $N_2$ (0.5 L/min) forming a part of the main flow, and TMIn (0.00023 L/min) with a carrier gas of $N_2$ (0.5 L/min) forming a part of the main flow were supplied.

In the growth of the GaN barrier layers, NH$_3$ (12 L/min) was used as a gas constituting the first main flow. Also, as gases constituting the second main flow, $N_2$ (9.5 L/min), H$_2$ (0.5 L/min), and TMGa (0.000017 L/min) with a carrier gas of H$_2$ (0.5 L/min) forming a part of the main flow were supplied.

The growth-irrelevant gas for purging or the like was $N_2$ at 6.375 L/min. The flow rate ratio Fp of the inactive gas component to all gases constituting the main flow during the growth of the multi-quantum well active layer structure was 0.45452 in the case of the InGaN well layer and 0.43179 in the case of the GaN barrier layer.

Thereafter, by setting the pressure in the reacting furnace to 36 kPa and setting the substrate temperature to 1,000° C., an Mg-doped GaN layer was epitaxially grown to a thickness of 120 nm (step E). At this time, as a gas constituting the first main flow, 1,1-DMHy with a carrier gas of $N_2$ (0.5 L/min) forming a part of the main flow was supplied at 0.0229 L/min. The gases constituting the second main flow were $N_2$ (14 L/min), H$_2$ (1 L/min), TMGa (0.0018 L/min) with a carrier gas of H$_2$ (0.5 L/min) forming a part of the main flow, and Cp$_2$Mg ($4 \times 10^{-6}$ L/min) with a carrier gas of H$_2$ (0.5 L/min) forming a part of the same main flow.

In the step E, during the growth of the Mg-doped GaN layer, the growth-irrelevant gas for purging or the like was $N_2$ (6.375 L/min). The flow rate ratio Fp of the inactive gas component to all gases constituting the main flow during the growth of the Mg-doped GaN layer was 0.93180.

After the completion of these growth steps, the substrate temperature was lowered, the gases in the reacting furnace were completely replaced with $N_2$ gas, and then, the substrate was taken out and evaluated.

The surface of the thus-produced substrate had good flatness, though there as very slight unevenness. The surface was measured by a contact step meter to determine centerline average roughness (Ra). As a result, Ra of the substrate of this Example was 9.1 nm. As for the PL characteristics evaluated by exciting the substrate with laser light at a wavelength of 325 nm, the peak wavelength was 395 nm, the integrated intensity thereof was as high as 109 in terms of relative value, and the standard deviation of wavelength distribution in plane was as small as 0.9%.

Example 7

This Example is an example where gallium nitride-based semiconductor thin films are grown in a stacked manner by the MOCVD method to fabricate a near ultraviolet light-emitting LED. The outline of a series of crystal growth processes is described by referring to FIG. 2(D). FIG. 3(B) schematically shows the configuration of layers grown.

As for the base, an m-plane oriented GaN layer is grown to a thickness of 0.5 µm on a (1-100) plane (m-plane) ZnO substrate of 2 inches in diameter, and this substrate is used an m-plane template.

Using this m-plane GaN template, the substrate is placed on a susceptor in a rotation/revolution-type SUS-made reacting furnace where normal conditions are growth under reduced pressure.

First, as the first temperature rise step $t_B$, the pressure in the reacting furnace is set to 40 kPa, and the temperature is raised while supplying $N_2$ at 30 L/min as a main flow into the reacting furnace. When the base temperature reaches 400° C., the second temperature rise step $t_A$ can be started, where $NH_3$ is supplied at 7.5 L/min as a gas constituting the first main flow, and $N_2$ and Ar are supplied at 27.5 L/min and 10 L/min, respectively, as gases constituting the second main flow.

Thereafter, the pressure in the reacting furnace is set at 40 kPa, and the substrate temperature is further raised to 1,000° C. while increasing the rates of $NH_3$ and $N_2$ to 10 L/min and 80 L/min, respectively. At this time, the subflow is $N_2$ gas at 30 L/min and the growth-irrelevant gas for purging or the like is $N_2$ at 21 L/min in total. In the second temperature rise step, the flow rate ratio Fp of the inactive gas component to all gases constituting the main flow is 0.83333 at the start of the second temperature rise step and 0.90 when the growth temperature is reached.

In the next step B, the pressure in the reacting furnace is set at 40 kPa, and $NH_3$ is supplied as a gas constituting the first main flow at 10 L/min. Also, as gases constituting the second main flow, $N_2$ at 50 L/min, Ar at 10 L/min, and TMGa (0.0081 L/min on the condition of a concentration of 100%) with a carrier gas of $N_2$ (0.5 L/min) forming a part of the main flow are supplied into the reacting furnace. By supplying these gases of the main flow, an undoped GaN layer (first nitride semiconductor layer) can be grown to a thickness of 10 nm.

At this time, the subflow is a mixed gas (35 L/min) of $NH_3$ (1 L/min) and $N_2$ (34 L/min) and the growth-irrelevant gas for purging or the like is $N_2$ at 21 L/min. The flow rate ratio Fp of the inactive gas component to all gases constituting the main flow during the growth of the first nitride semiconductor layer is 0.85704.

In the next step C, the pressure in the reacting furnace is set to 12 kPa, and $NH_3$ is supplied as a gas constituting the first main flow at 10 L/min. Also, as gases constituting the second main flow, $N_2$ at 70 L/min, Ar at 10 L/min, TMGa (0.026 L/min on the condition of a concentration of 100%) with a carrier gas of $N_2$ (0.5 L/min) forming a part of the main flow, and $SiH_4$ ($1.8\times10^{-6}$ L/min on the condition of a concentration of 100%) with a diluent gas of $N_2$ (0.2 L/min) forming a part of the main flow are supplied into the reacting furnace. By supplying these gases of the main flow, an Si-doped GaN layer (second nitride semiconductor layer) can be grown to a thickness of 15 µm.

At this time, the subflow is a mixed gas (35 L/min) of $NH_3$ (1 L/min) and $N_2$ (34 L/min) and the growth-irrelevant gas for purging or the like is $N_2$ at 21 L/min. The flow rate ratio Fp of the inactive gas component to all gases constituting the main flow during the growth of the second nitride semiconductor layer is 0.88864.

Subsequently, by setting the pressure in the reacting furnace to 40 kPa and setting the base temperature (substrate temperature) to 740° C., a multi-quantum well active layer structure where a quantum well layer of $In_{0.08}Ga_{0.92}N$ (target thickness: 1.5 nm) and a barrier layer of GaN (target thickness: 13 nm) are alternately stacked for 5 periods, can be formed (step D). Here, in the growth of the quantum well layer of $In_{0.08}Ga_{0.92}N$, $NH_3$ (10 L/min) is used as a gas constituting the first main flow. Also, as gases constituting the second main flow, $N_2$ (60 L/min), TMGa (0.00013 L/min) with a carrier gas of $N_2$ (0.5 L/min) forming a part of the main flow, and TMIn (0.00023 L/min) with a carrier gas of $N_2$ (0.5 L/min) forming a part of the main flow are supplied.

In the growth of the GaN barrier layers, $NH_3$ (10 L/min) is used as a gas constituting the first main flow. Also, as gases constituting the second main flow, $N_2$ (60 L/min) and TMGa (0.0075 L/min) with a carrier gas of $N_2$ (0.5 L/min) forming a part of the main flow are supplied.

In the step D, the subflow is a mixed gas at 35 L/min of $NH_3$ (1 L/min) and $N_2$ (34 L/min) and the growth-irrelevant gas for purging or the like is $N_2$ at 21 L/min. The flow rate ratio Fp of the inactive gas component to all gases constituting the main flow during the growth of the multi-quantum well active layer structure is 0.85713 in the case of the InGaN well layer and 0.85713 in the case of the GaN barrier layer.

Thereafter, by setting the pressure in the reacting furnace to 40 kPa and setting the substrate temperature to 1,000° C., an Mg-doped GaN layer can be formed to a thickness of 120 nm (step E). At this time, the gas constituting the first main flow is $NH_3$ (10 L/min). Also, the gases constituting the second main flow are $N_2$ (60 L/min), TMGa (0.0081 L/min) with a carrier gas of $N_2$ (0.5 L/min) forming a part of the main flow, and $Cp_2Mg$ ($6\times10^{-5}$ L/min) with a carrier gas of $N_2$ (0.5 L/min) forming a part of the same main flow.

Here, the subflow is a mixed gas at 35 L/min of $NH_3$ (1 L/min) and $N_2$ (34 L/min) and the growth-irrelevant gas for purging or the like is $N_2$ (21 L/min). The flow rate ratio Fp of the inactive gas component to all gases constituting the main flow during the growth of the Mg-doped GaN layer is 0.85704.

In this way, a near ultraviolet light-emitting LED can be fabricated on an m-plane GaN template (base) using a ZnO substrate.

Reference Example 1

This Example is an example where gallium nitride-based semiconductor thin films are grown in a stacked manner by the MOCVD method to fabricate a near ultraviolet light-emitting LED. The outline of a series of crystal growth processes is already described by referring to FIG. 2(A). Also, the configuration of layers grown is schematically shown in FIG. 3(A).

A base obtained by continuously stacking an undoped GaN layer of 1 µm and an n-type GaN layer (carrier concentration: $5\times10^{18}$ $cm^{-3}$) of 3.5 µm on a c-plane sapphire and once taken out of the furnace was used as the base. The GaN on this base surface was a polar plane and c(+)-oriented. The base was placed on a tray (susceptor) in a horizontal quartz-made reacting furnace where normal conditions are growth under atmospheric pressure. The pressure in the reacting furnace was set to 100±2 kPa in all steps.

The growth conditions in all steps from the temperature rise step to the completion of growth were thoroughly the same as those in Example 1.

The surface of the thus-produced substrate was very roughened and completely clouded. The surface was measured by a contact step meter to determine centerline average roughness (Ra). As a result, Ra of the substrate of this Example was 376 nm. Also, PL characteristics were tried to evaluate by exciting the substrate with laser light at a wavelength of 325 nm, but PL emission could not be observed at all.

Example 8

In this Example, the flatness of the multi-quantum well (MQW) layer of a near ultraviolet light-emitting LED fabricated by the crystal growth technique of the present invention was confirmed by the observation through a transmission electron microscope (TEM). The outline of a series of crystal growth processes is already described by referring to FIG. 2(A), and the configuration of layers of the LED obtained is the same as that schematically shown in FIG. 3(A).

A (1-100) plane (m-plane) oriented standing GaN substrate was used as the base. The substrate size was 4.0 mm in the c-axis direction and 20 mm in the a-axis direction. The substrate was doped with Si (Si concentration: $6.2\times10^{17}$ $cm^{-3}$). As for the electrical characteristics, the substrate was n-type and the carrier density was $6.5\times10^{17}$ $cm^{-3}$.

According to X-ray diffraction analysis, the half-width of a rocking curve in (10-12) reflection was 36.2 arcsec, the OFF angle in the c(+) direction was $-0.145°$, and the OFF angle in the a direction was $0.05°$. Furthermore, the dislocation density was $5.1\times10^{6}$ $cm^{-2}$.

The m-plane standing GaN substrate was placed on a tray (susceptor) in a horizontal quartz-made reacting furnace where normal conditions are growth under atmospheric pressure, and an LED having the layer configuration of FIG. 3(A) was fabricated under the same conditions as Example 1 except for changing the film thickness of the second semiconductor layer (Si-doped n-type GaN layer) to 4.2 μm.

The surface of the thus-obtained substrate was measured by a contact step meter and found to be Ra=4.7 nm, and it could be confirmed that the surface is extremely flat. As for the PL characteristics evaluated by exciting the substrate with laser light at a wavelength of 325 nm, the peak wavelength was 394 nm and the integrated intensity thereof was 89 in terms of relative value, revealing extremely high PL intensity.

The LED sample having such characteristics was processed into a thin film by the following procedure and observed using a high-angle annular dark-field scanning transmission electron microscope (HAADF-STEM). First, the sample was mechanically abraded to a film thickness of 50 μm or less by using a preliminary parallel grinder and a rotary abrasion pad and then subjected to Ar ion milling under conditions of an acceleration voltage of 2 to 5 kV and a milling angle of 2 to 4° by using Model 691 PIPS (registered trademark) manufactured by Gatan, Inc., whereby the thickness was reduced to a thickness suitable for the HAADF-STEM method (HAADF-STEM; high-angle annular dark-field scanning transmission electron microscopy) (about 50 nm). The thus-obtained thin-film sample was fixed to a Mo mesh and used as a sample for observation.

The apparatus used for the HAADF-STEM observation was TECNAI G2 F20 manufactured by FEI Company, which is equipped with a field emission gun (FEG). In this apparatus, an annular dark-field detector (Model 3000, manufactured by Fischione, Inc.) for performing the later-described HAADF-STEM observation is mounted.

Incidentally, the purpose of observation in this Example is, as described later, to clearly observe the InGaN/GaN boundary and define the interface fluctuation, film thickness fluctuation and unevenness degree. Therefore, in order to make distinct the contrast of a layer containing a heavy atom such as In and observe the sample without damaging it, HAADF-STEM was applied. The acceleration voltage of an electron beam was set to 200 Kv.

The sample for observation prepared above was observed by HAADF-STEM with light incident on the a-axis. The visual field observed was set to a region where the average thickness of each quantum well layer can be determined without sacrificing the resolution of the HAADF-STEM apparatus. Specifically, the visual field is set to a region of 190 nm in the direction perpendicular to the stacking direction of quantum well layers.

The reason for employing HAADF-STEM is briefly described here. Exact observation of the thickness or the like of a quantum well (QW) is premised on no damage of the sample observed, because if the sample is damaged by the irradiation of an electron beam, the obtained TEM image often becomes an image (artifact) not exactly reflecting the true state (see, for example, Non-Patent Document 3: C. J. Humphreys et al., "Applications Environmental Impact and Microstructure of Light-Emitting Diodes", *MICROSCOPY AND ANALYSIS*, NOVEMBER 2007, pp. 5-8).

Because of such a circumstance, a low dosage (to decrease the current density per unit time), a low current density (to decrease the current density per unit area), and observation at low temperature by cooling the sample become essential. The observation method satisfying these conditions is most preferably a low-temperature observation method using HAADF-STEM.

The HAADF-STEM method is described, for example, in Non-Patent Document 4 (K. SAITOH, "High-resolution Z-contrast Imaging by the HAADF-STEM Method", *J. Cryst. Soc. Jpn.*, 47(1), 9-14 (2005)) and Non-Patent Document 5 (K. WATANABE, "Imaging in High Resolution HAADF-STEM", *J. Cryst. Soc. Jpn.*, 47(1), 15-19 (2005)).

The HAADF-STEM method is a technique where electrons inelastically scattered at high angles by thermal diffuse scattering due to lattice vibration in an STEM image observed by scanning transmission electron microscopy (STEM) are received by an annular detector, the integrated intensity of the electrons is measured as a function of probe position, and the intensity is displayed as an image. The brightness of the image obtained by this technique is proportional to the square of an atomic number. In the case of observing a sample such as GaN/InGaN type, this technique is advantageous in that the contrast of a layer containing a heavy atom such as In becomes distinct and the sample can be observed at a low dosage.

Specific observation conditions in this Example were controlled to an incident angle of electron beam: 10 mrad or less, a spot diameter: 0.2 nm or less, and a detected scattering angle: 70 mrad or more. The image data collection conditions were set to a magnification: 640,000 times, a pixel resolution: 0.186 nm/pix (pixel), a scanning rate: 64 μsec/pix, and a pixel frame: 1024 pix square. Incidentally, the condition of pixel resolution (0.186 nm/pix) is nearly coincident with the STEM resolution (0.18 nm) of the apparatus used in this test.

By such image data collection, an intensity data for each pixel of 1024×1024 pix (about 1,050,000 pix) and in turn, a two-dimensional intensity distribution are obtained. And, 0.186 nm/pix×1,024 pix is approximately 190 nm and thus coincides with the above-described observation region (190 nm) of the quantum well layer.

The direction from which an electron beam is incident on the sample for observation was set parallel to the [11-20] direction of GaN with wurtzite crystal structure. In this connection, the observation may be performed under conditions that the electron beam is incident parallel to the [0001] direction. Other electron beam incident directions may also be selected.

For cooling the sample, a liquid nitrogen injection-type cryo-holder (Model 636 DHM, manufactured by GATAN, Inc.) is used. In the case of using this cryo-holder, the lowest achieving sample temperature is in a temperature region of 77 to 140 K in about 40 minutes after the injection of liquid nitrogen, and there is also a report on an experiment where the temperature was measured by attaching a thermocouple to the sample observed (Non-Patent Document 6).

In confirming the visual field or determining the electron beam incident direction, TEM observation was performed. This TEM observation was performed by adjusting the current density of electron beam to be from 30 to 500 A/m² so as to avoid damage to the sample. Incidentally, it has been confirmed that even when an electron beam of 500 A/m² is irradiated for 10 minutes under the above-described cryo-holder conditions, the morphology of the sample is not changed.

Figure 6:
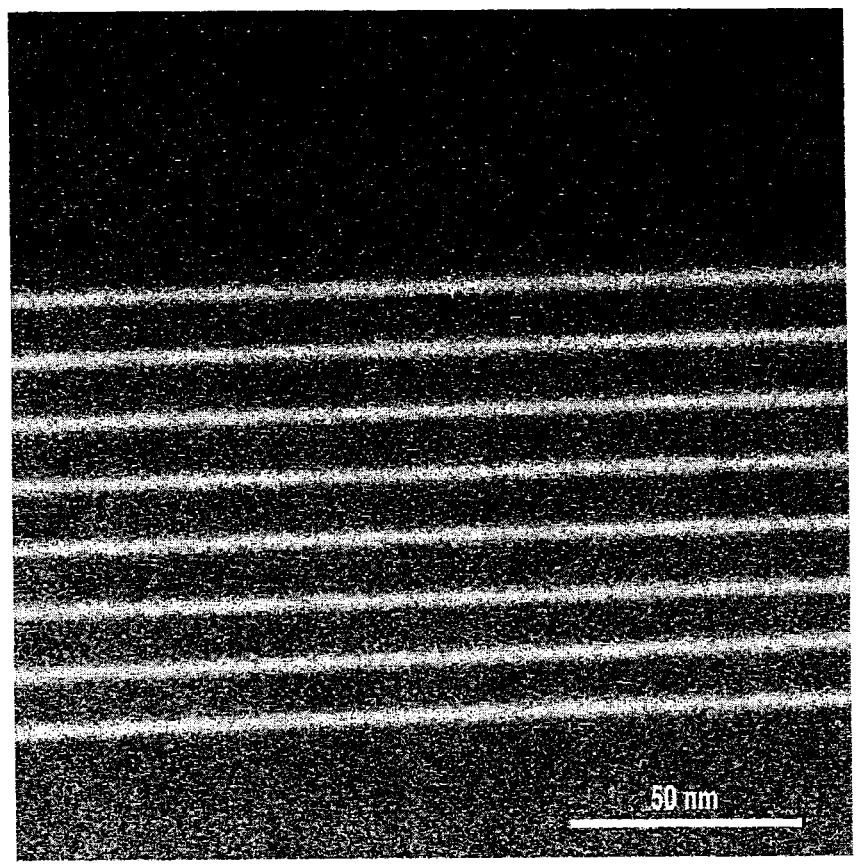
FIG. 6 An STEM image obtained in Example 8.
Figure 7:
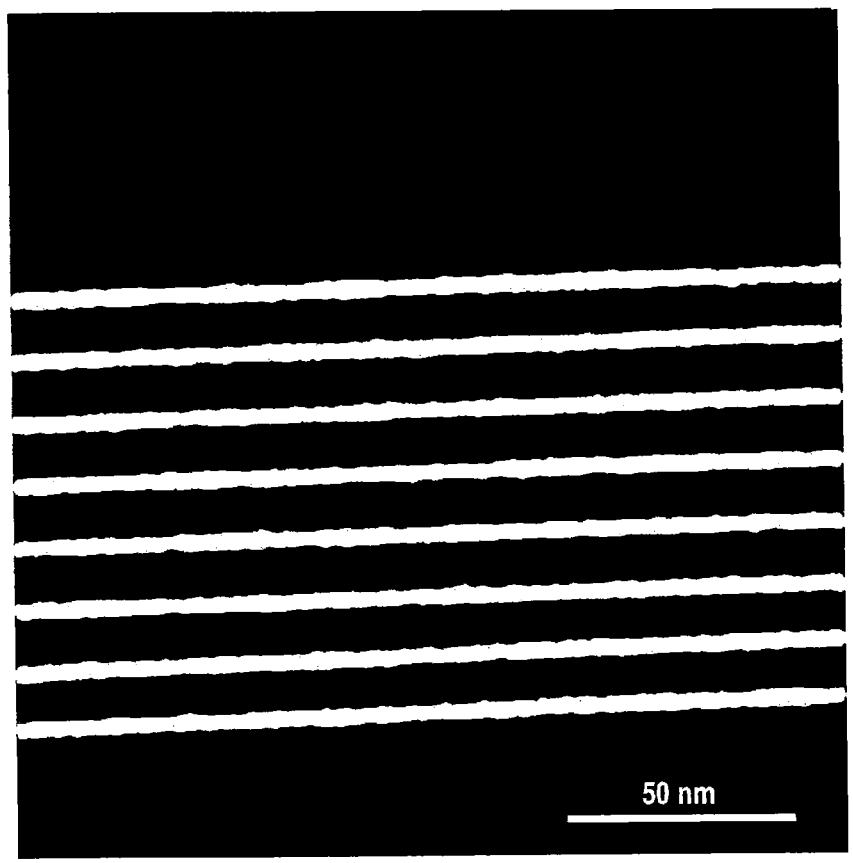
FIG. 7 Results of image processing performed to calculate an average thickness or the like of each quantum well layer from the STEM image of FIG. 6.

FIG. 6 shows an HAADF-STEM image obtained in this way, and FIG. 7 shows the results after image processing performed to calculate the average thickness of each quantum well layer from the HAADF-STEM image.

The image processing performed here includes (1) digitalizing the HAADF-STEM image, (2) approximating each quantum well layer by an ellipsoid, (3) rotating the image so that the major axis of the ellipsoid can be parallel to the horizontal direction (X-axis direction) of the image, (4) calculating all thicknesses in the Y-axis direction for all pixels in the X-axis direction of each quantum well layer, and (5) determining "the average thickness, standard deviation, and variation coefficient of each quantum well layer". Here, the "variation coefficient" is a coefficient obtained by dividing the standard deviation by the average value, and the value thereof is referred to as a "CV value".

The average thicknesses (nm) of respective quantum well layers (w1 to w8) obtained in this way are shown together in Table 2, where w1 is the average thickness of the quantum well layer on the lowest side (substrate side) and w8 is the average thickness of the quantum well layer on the highest side (surface side). At the same time, with respect to the thickness in the Y-axis direction of each layer, the standard deviation (see mathematical formula 1 later) and the variation coefficient (CV value) are shown together.

TABLE 2

| Quantum Well Layer | Average Thickness (nm) | Standard Deviation Among Pixels (nm) | Variation coefficient |
|---|---|---|---|
| w8 | 3.84 | 0.29 | 0.075 |
| w7 | 3.73 | 0.28 | 0.076 |
| w6 | 3.62 | 0.29 | 0.081 |
| w5 | 3.65 | 0.29 | 0.079 |
| w4 | 3.61 | 0.31 | 0.085 |

TABLE 2-continued

| Quantum Well Layer | Average Thickness (nm) | Standard Deviation Among Pixels (nm) | Variation coefficient |
|---|---|---|---|
| w3 | 3.61 | 0.26 | 0.072 |
| w2 | 3.65 | 0.21 | 0.059 |
| w1 | 3.65 | 0.29 | 0.081 |

Example 9

The sample is LED fabricated by growing gallium nitride-based semiconductor thin films in a stacked manner by the MOCVD method. The outline of a series of crystal growth processes is already described by referring to FIG. 2(E), but the structure of MQW thereof is a stack of 5 periods shown in FIG. 3(C).

A (1-100) plane (m-plane) oriented standing GaN substrate was used as the base. The substrate size was 4.1 mm in the c-axis direction and 15 mm in the a-axis direction. The substrate was doped with Si, and the Si concentration was $6.2 \times 10^{17}$ cm$^{-3}$. As for the electrical characteristics, the substrate was n-type and the carrier density was $6.5 \times 10^{17}$ cm$^{-3}$.

According to X-ray diffraction analysis, the half-width of a rocking curve in (10-12) reflection was 38.9 arcsec, the OFF angle in the c(+) direction was −0.165°, and the OFF angle in the a direction was 0.05°. Also, the dislocation density was $5.8 \times 10^{6}$ cm$^{-2}$.

The m-plane standing GaN substrate was placed on a tray (susceptor) in a horizontal quartz-made reacting furnace where normal conditions are growth under atmospheric pressure, and an LED structure was fabricated.

The temperature rise step was performed in the same manner as in Example 8.

In the next step B, NH$_3$ was supplied as a gas constituting the first main flow at 10 L/min. Also, as gases constituting the second main flow, N$_2$ at 0 L/min, H$_2$ (30 L/min), and TMGa (0.0018 L/min on the condition of a concentration of 100%) with a carrier gas of H$_2$ (0.5 L/min) forming a part of the main flow were supplied into the reacting furnace. By supplying these gases of the main flow, an undoped GaN layer (first nitride semiconductor layer) was grown to a thickness of 40 nm (Step B).

At this time, the subflow was a mixed gas (20.5 L/min) of NH$_3$ (0.5 L/min) and N$_2$ (20 L/min) and the growth-irrelevant gas for purging or the like was N$_2$ at 19 L/min. The flow rate ratio Fp of the inactive gas component to all gases constituting the main flow during the growth of the first nitride semiconductor layer was 0.0.

In the next step C, NH$_3$ was supplied at 10 L/min as a gas constituting the first main flow. Also, as gases constituting the second main flow, H$_2$ (40 L/min), TMGa (0.0055 L/min on the condition of a concentration of 100%) with a carrier gas of H$_2$ (0.5 L/min) forming a part of the main flow, and SiH$_4$ ($6 \times 10^{-7}$ L/min on the condition of a concentration of 100%) with a carrier gas of H$_2$ (0.2 L/min) forming a part of the main flow and a diluent gas of H$_2$ (0.06 L/min) were supplied. By supplying these gases of the main flow, an Si-doped GaN layer (second nitride semiconductor layer) was grown to a thickness of 1.7 μm.

At this time, the subflow was a mixed gas at 25.5 L/min of NH$_3$ (0.5 L/min) and N$_2$ (25 L/min) and the growth-irrelevant gas for purging or the like was N$_2$ at 19 L/min. The flow rate ratio Fp of the inactive gas component to all gases constituting the main flow during the growth of the first nitride semiconductor layer was 0.0.

The subsequent step D was performed under utterly the same conditions as in Example 8 except for changing the number of periods to 5.

The step E was performed under utterly the same conditions as in Example 8.

After the completion of these growth steps, the substrate temperature was lowered, the gases in the reacting furnace were completely replaced with N$_2$ gas, and then, the substrate was taken out and evaluated.

On the surface of the thus-produced substrate, slight unevenness was recognized. When the surface was measured by a contact step meter, Ra=210 nm and roughness to such an extent that interaction with the emission wavelength is liable to occur and a scattering function is expected to develop was naturally formed. As for the PL characteristics evaluated by exciting the substrate with laser light at a wavelength of 325 nm, the peak wavelength was 423 nm, and the integrated intensity thereof was 11.

Figure 8:
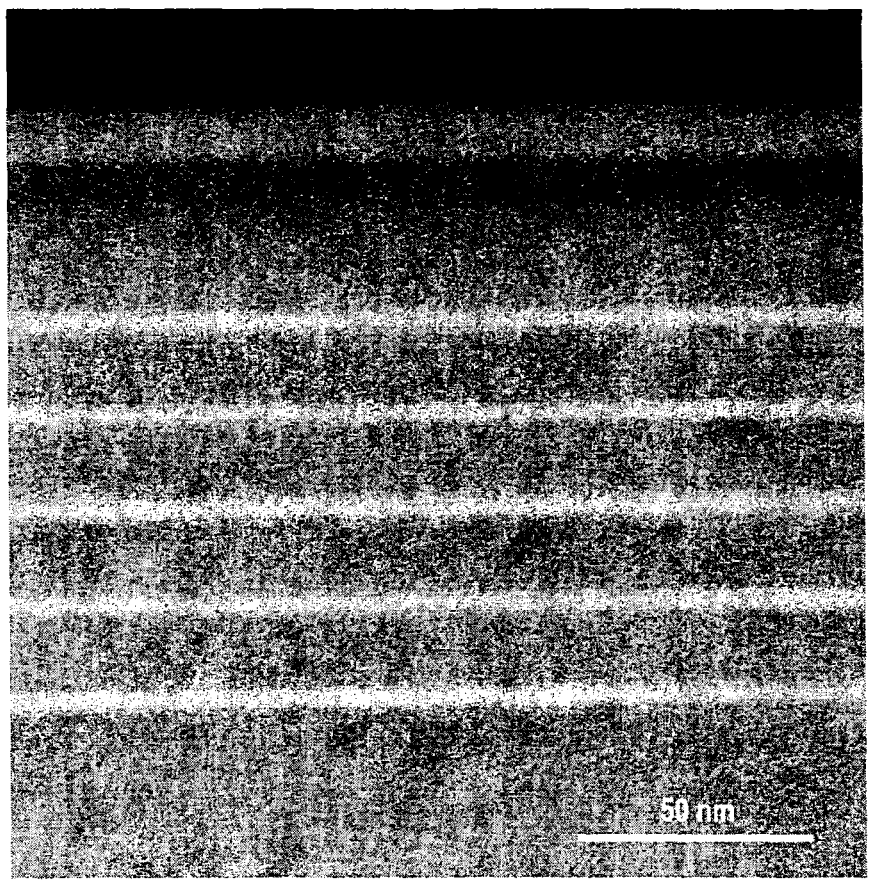
FIG. 8 An STEM image obtained from the LED of Example 9.
Figure 9:
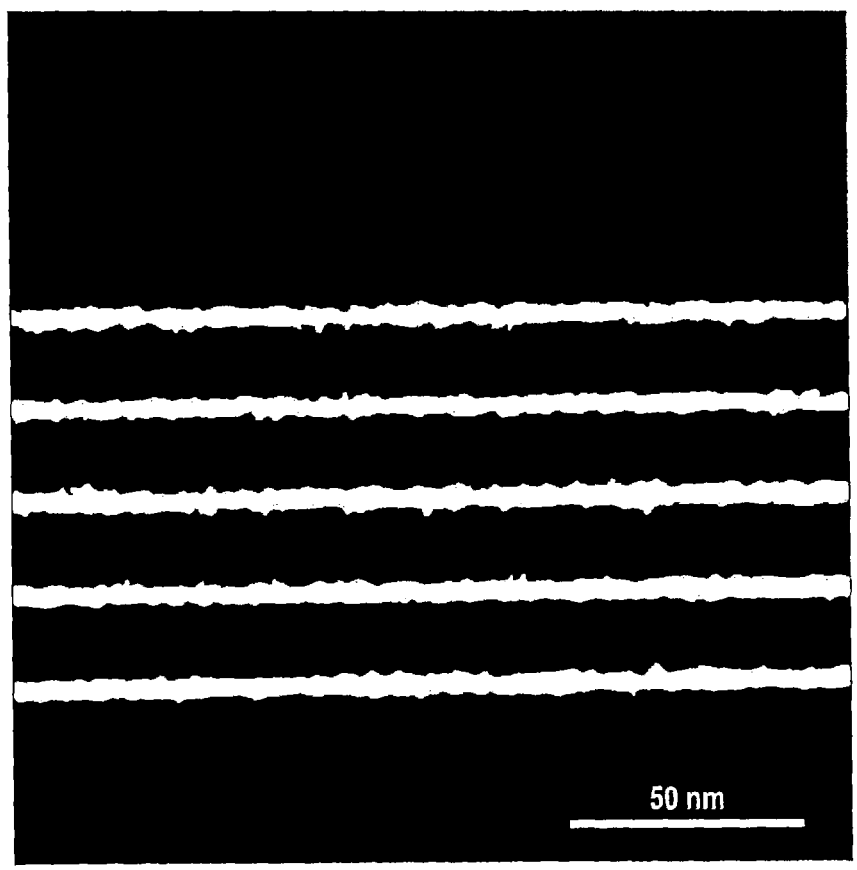
FIG. 9 Results of image processing performed to calculate an average thickness or the like of each quantum well layer from the STEM image of FIG. 8.

FIG. 8 shows an HAADF-STEM image obtained from the thus-obtained LED by the same procedure as in Example 8, and FIG. 9 shows the results after processing of the image of FIG. 8.

The average thicknesses (nm) of respective quantum well layers (w1 to w5) of this comparative sample, obtained as a result of the image processing, are shown together in Table 3, where w1 is the average thickness of the quantum well layer on the lowest side (substrate side) and w5 is the average thickness of the quantum well layer on the highest (surface side). At the same time, with respect to the thickness in the Y-axis direction of each layer, the standard deviation (see mathematical formula 1 later) and the variation coefficient are shown together.

TABLE 3

| Quantum Well Layer | Average Thickness (nm) | Standard Deviation of Thickness in Y-Axis Direction (nm) | Variation coefficient |
| --- | --- | --- | --- |
| w5 | 4.65 | 0.57 | 0.123 |
| w4 | 4.46 | 0.50 | 0.113 |
| w3 | 5.13 | 0.73 | 0.143 |
| w2 | 4.82 | 0.51 | 0.107 |
| w1 | 4.79 | 0.52 | 0.110 |

Figure 10:
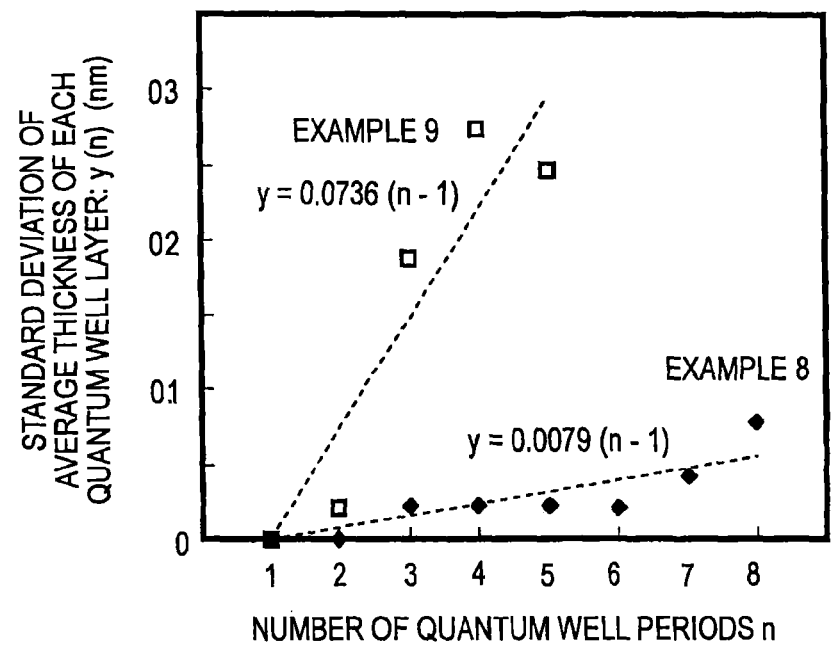
FIG. 10 A diagram comparing uniformity of the average thickness of respective quantum well layers (standard deviation of thickness of the quantum well layer) of Examples 8 and 9.

FIG. 10 is a diagram plotted to show how the standard deviation of the average thickness of each quantum well layer changes as the quantum well layers shown in Examples 8 and 9 are stacked starting from the substrate side. Here, "the average thickness of each quantum well layer" is calculated by a method including, as already described above, (1) digitalizing the HAADF-STEM image, (2) approximating each quantum well layer by an ellipsoid, (3) rotating the image so that the major axis of the ellipsoid can be parallel to the horizontal direction (X-axis direction) of the image, (4) calculating all thicknesses in the Y-axis direction for all pixels in the X-axis direction of each quantum well layer, and (5) determining "the average thickness, standard deviation, and variation coefficient of each quantum well layer". The "variation coefficient" is a value (standard deviation/average) obtained by dividing the "standard deviation" by the "average".

The standard deviation of the average thickness (standard deviation of the average thickness of each quantum well layer) y(n) (nm) when layers are stacked for n periods starting from the substrate side was calculated according to the following (mathematical formula 1), where w$_n$ (nm) is the average thickness of the nth quantum well layer starting from the substrate side.

[Math. 1]

$$y(n) = \sqrt{\frac{n \sum w_n^2 - (\sum w_n)^2}{n(n-1)}} \quad \text{(Mathematical Formula 1)}$$

The calculation in the formula above is on the assumption that n>1, and in the case of n=1, the standard deviation of the average thickness is taken as 0.

In the sample of Example 8, the standard deviation y(n) (nm) of the average thickness of each quantum well layer exhibited a relationship of roughly y(n)=0.0079 (n−1) with the number n of quantum well periods, and the standard deviation of the average thickness of each quantum well layer was very small. On the other hand, in the sample of Example 9, there is a relationship of roughly y(n)=0.0735 (n−1), revealing a tendency that the standard deviation of the average thickness of each quantum well layer becomes large as the number of quantum well layers stacked is increased.

In Example 8, the thickness was designed to 3.64 nm for all quantum well layers, and in Example 9, the thickness is designed to 4.80 nm for all quantum well layers. The notable difference in the standard deviation y(n) (nm) of the average thickness of each quantum well layer is not attributed to the difference in the design value of the average thickness but is attributable to the difference in the crystallinity including flatness of the quantum well layer.

In this way, the dependency of the standard deviation y(n) of the average thickness of each quantum well layer on the number n of quantum well periods of the nitride semiconductor of the present invention can be confirmed by the HAADF-STEM method under conditions of little damaging the sample observed. As verified above, the flatness of the quantum well active layer structure part used in the present invention can be changed by varying the growth conditions of the first and second semiconductor layers formed before the growth of the quantum well layer.

In particular, it is understood that even when the substrate has adequate fluctuation or is flat, the standard deviation for the average thickness of the quantum well layer is increased by multiply-stacking the layers. In the present invention, the quantum well layer preferably has adequate fluctuation and in this meaning, it is preferred to increase the total number of quantum wells in an appropriate range.

Example 10

This Example shows the results when the same sample as in Example 8 was prepared and observed by an ultrahigh voltage transmission electron microscope (ultrahigh voltage TEM). A general-purpose TEM has an accelerating voltage of approximately from 100 to 400 kV, but the effective penetrating ability for electron achievable by such a level of accelerating voltage is on the order of several hundreds of nm at most and is not sufficient to observe possible crystal defects or dislocations in an epitaxial growth layer on a GaN substrate. The reasons therefor are as follows.

In the homoepitaxial growth of a GaN-based material on a GaN substrate, unlike the heteroepitaxial growth of a GaN-based material on a sapphire substrate or the like, it is estimated that when sufficiently examined good epitaxial growth is realized, reduction of dislocation is essentially possible.

Therefore, in the observation of crystal defects or dislocations, even if the sample has a low dislocation density, a sample whose "thickness" is large enough to contain a dislocation in the observation field must be prepared. For observing a sample having such a thickness by TEM, the electron accelerating voltage at the observation needs to be 1,000 kV or more.

With an electron accelerating voltage in this range, the thickness of the observable sample can be increased to approximately from 1 to 2 μm, and the dislocation can be recognized even in the sample having a low dislocation density described above. In the case where a dislocation line cannot be recognized even when a sample having such a thickness is observed, this supposes that the dislocation density is a fairly low dislocation density. In other words, even if a dislocation line is not recognized when a sample having a thickness on the order of several hundreds of nm at most is observed, this is not enough to conclude that the dislocation density is sufficiently low.

Specifically, when a dislocation is not recognized at the time of observing one visual field portion of a sample having a thickness on the order of several hundreds of nm at most, this only indicates that the dislocation density is nor more than about 108 ($cm^{-2}$), whereas when a dislocation is not recognized at the observation of one visual field of a sample whose thickness is increased to approximately from 1 to 2 μm, the dislocation density is revealed to be a lower dislocation density of about 107 ($cm^{-2}$) or less at most.

Furthermore, since the dislocation cannot be observed in some cases depending on the incident direction of electron beam, the incident electron beam is preferably adjusted to run in parallel to the c-axis direction.

For these reasons, in the TEM observation of this Example, an ultrahigh voltage TEM with an effective penetrating ability in excess of 1 μm was used by setting the accelerating voltage of electron beam to 1,000 Kv. The sample thickness was set to about 1.5 μm and the electron beam was controlled to be incident parallel to the c-axis direction. Incidentally, the ultrahigh voltage TEM used was JEM-ARM1000 manufactured by JEOL Ltd.

Figure 11:
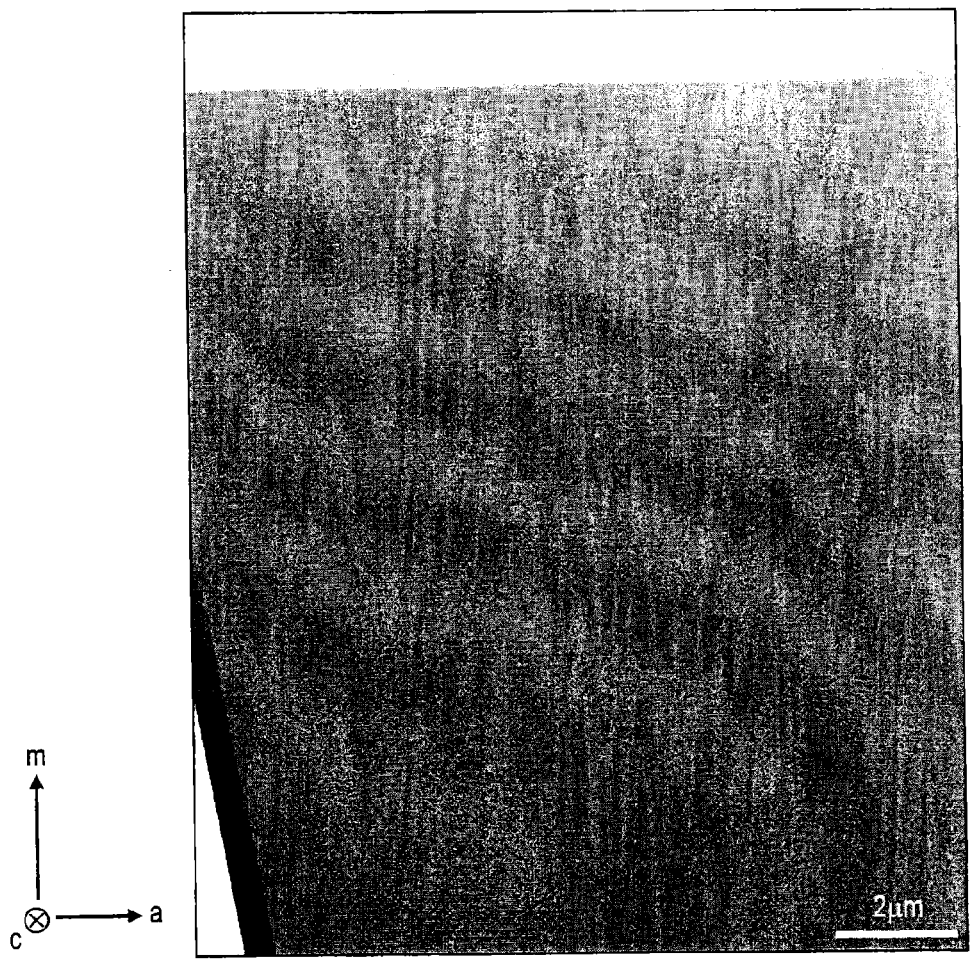
FIG. 11 An image when the sample prepared in Example 10 is observed by an ultrahigh voltage TEM.

FIG. 11 shows an ultrahigh voltage TEM observation image under the above-described conditions. As seen in this photograph, a crystal defect, a dislocation and the like were not recognized.

Example 11

In this Example, the light emission characteristics of a multi-quantum well (MQW) layer produced by the crystal growth technique of the present invention was evaluated by a photoluminescence (PL) method to confirm that an MQW structure excellent in the internal quantum efficiency and emission lifetime is obtained.

FIG. 3(D) is a diagram showing a stack structure of the sample used in this Example, and FIG. 2(F) is a diagram for explaining a sequence of the crystal growth method for the sample. In this sample, an InGaN/GaN multi-quantum well active layer structure 13 where the number of periods is 5, is provided in the uppermost layer.

A (1-100) plane (m-plane) oriented standing GaN substrate was used as the base. The substrate size was 4.1 mm in the c-axis direction and 15 mm in the a-axis direction. The substrate was doped with Si, and the Si concentration was $6.2 \times 10^{17}$ $cm^{-3}$. As for the electrical characteristics, the substrate was n-type and the carrier density was $6.5 \times 10^{17}$ $cm^{-3}$.

According to X-ray diffraction analysis, the half-width of a rocking curve in (10-12) reflection was 35 arcsec, the OFF angle in the c(+) direction was −0.165°, and the OFF angle in the a direction was 0.05°. Also, the dislocation density was $4.9 \times 10^{6}$ $cm^{-2}$.

The m-plane standing GaN substrate was placed on a tray (susceptor) in a horizontal quartz-made reacting furnace where normal conditions are growth under atmospheric pressure, and a quantum well structure was produced. The crystal growth conditions were the same as those in Example 1 except for changing the thickness of the second semiconductor layer (Si-doped n-type GaN layer) to 2.5 μm, the number of periods for the quantum well grown in the step D was changed to 5, and the temperature was lowered without performing the step E.

The surface of the thus-produced substrate was measured by a contact step meter and found to be Ra=4.8 nm, indicating that the surface was extremely flat. As for the PL characteristics measured at room temperature by exciting the substrate with laser light at a wavelength of 325 nm, the peak wavelength was 393 nm, and the integrated intensity thereof was 196 in terms of relative value, revealing extremely high PL intensity. The internal quantum efficiency and PL emission lifetime of the sample were evaluated in the following manner.

First, the internal quantum efficiency was evaluated by performing PL (CW-PL) measurement where the light irradiated on the sample was a continuous wave (CW), and time-resolved PL measurement where pulsed light was irradiated.

Figure 12:
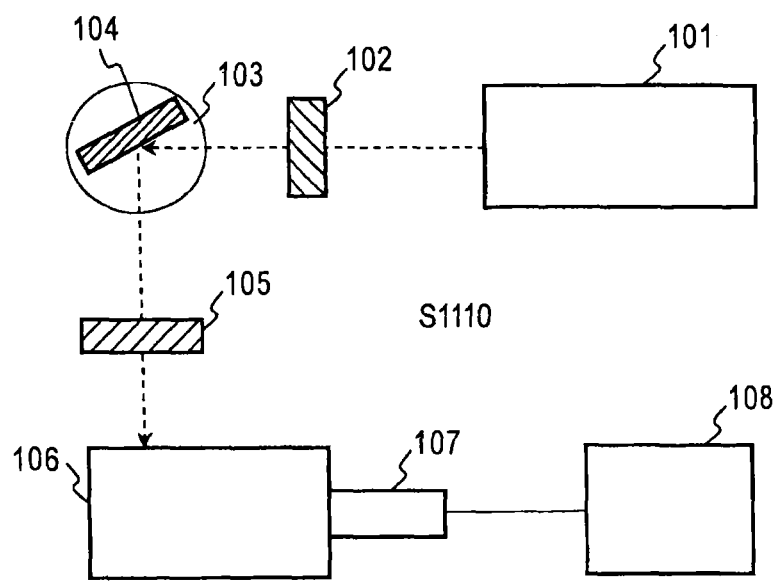
FIG. 12 A block diagram of the optical system used in the CW-PL measurement.

FIG. 12 is a block diagram of an optical system used in the CW-PL measurement. A He—Cd laser 101 with a wavelength of 325 nm is used as the excitation light source, and laser light whose intensity is adjusted by an ND filter 102 is irradiated on Sample 104 housed in the inside of a cryostat 103. PL light from Sample 104 is passed through a λ/4 wavelength plate 105, separated by a spectroscope 106 and measured by a light amplifier 107, and data collection is executed by a control computer 108. The sample temperature was set to from 13 to 300 K, and the laser power per unit area on the sample surface was 150 W/$cm^2$. The photoexcited constantly excess carrier density under these conditions was estimated to be from $1 \times 10^{16}$ to $1 \times 10^{17}$ $cm^{-3}$.

Based on the results of this CW-PL measurement, assuming that the integrated intensity I(13K) obtained by integrating the PL intensities from the multi-quantum well at 13 K with respect to the emission energy is 1, the same integrated intensity I(300K) at 300 K was 58% of I(13K).

Figure 13:
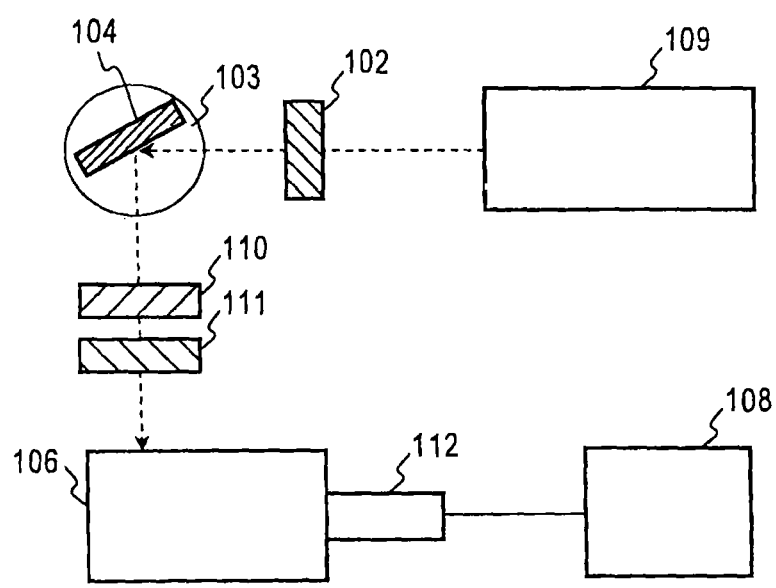
FIG. 13 A block diagram of the optical system used in the time-resolved PL measurement (with a polarizing filter).

FIG. 13 is a block diagram of an optical system used for time-resolved PL measurement (with a polarizing filter). In this time-resolved PL measurement, an optical system consisting of a tunable pulsed laser light source 109 and Streakscope (manufactured by Hamamatsu Photonics K.K.) 112 was used. The tunable pulsed laser light source is composed of a mode-locked Ti:sapphire laser, a Ti:sapphire regenerative amplifier, an optical parametric amplifier and a harmonic generating crystal. The pulse repetition frequency was 1 kHz, and the pulse width was 120 fs.

The PL measurement based on selective excitation is effective in directly evaluating the optical quality of a single quantum well layer having a single layer or a plurality of layers and being included in an active layer structure. For example, in order to selectively excite a plurality of quantum well layers, it is necessary to select light having an energy lower than the bandgap of GaN and at the same time, higher than the bandgap of an InGaN quantum well layer. For this reason, the wavelength of the tunable pulsed laser was set to 370 nm. The pulse energy is adjusted with an ultraviolet ND filter 102 and then irradiated on Sample 104 in a cryostat 103 which can be cooled by liquid He. The PL from Sample 104 is passed through a polarizing filter 110 and a depolarizer 111, dispersed by a spectroscope 106 and then led to Streakscope 112. In the measurement, the sample temperature was varied from 4 K to 300 K.

The polarizing filter 110 is disposed between a condensing lens (not shown) and the spectroscope 106 and used to selectively pass light having an electric field component perpendicular to the c-axis of Sample 104 and take the light into the spectroscope 106. The depolarizer 111 is used to avoid being influenced by polarization dependency of diffraction characteristics of the spectroscope 106. The pulse energy irradiated on Sample 104 was determined by dividing the power measured with a power meter by the repetition frequency. The pulse energy density per unit area was 1,400 nJ/cm$^2$.

The value of absorption coefficient α at the excitation wavelength of one quantum well layer included in the nitride semiconductor layer prepared in this experiment is exactly unknown but is considered to be appropriately from $1\times10^4$ to $1\times10^5$ cm$^1$. Assuming that the absorption coefficient α in one quantum well layer is $1\times10^4$ cm$^1$, the average density of excess carriers excited in all quantum well layers included in the nitride semiconductor layer is estimated to be approximately $3\times10^{16}$ cm$^{-3}$. Similarly, when the absorption coefficient α is $5\times10^4$ cm$^{-1}$, the average density of excess carriers excited is estimated to be approximately $1\times10^{17}$ cm$^{-3}$, and when the absorption coefficient α is $1\times10^5$ cm$^{-1}$, the average density of excess carriers excited is estimated to be approximately $3\times10^{17}$ cm$^{-3}$.

Based on the results of the time-resolved PL measurement, the PL intensity was determined by time-integrating the transient response of PL emission from the multi-quantum well at 4 K and further integrated with respect to the emission energy and assuming that the resulting integrated intensity I(4K) is 1, the same integrated intensity I(300K) at 300 K was 93% of I(4K).

Also, the PL lifetime was determined from the transient response (decay curve) of the PL intensity after pulse excitation with respect to time, which was obtained by the time-resolved PL measurement (with a polarizing filter) where the pulse energy density per unit area was set to 1,400 nJ/cm$^2$ at 300 K. When the PL lifetime is defined as the time from the maximum intensity on the decay curve of the PL intensity to an intensity of 1/e of the maximum intensity, the PL lifetime τ(PL) was 3.6 nsec. Also, the emissive recombination lifetime τ(R) was 4.4 ns, and the non-emissive recombination lifetime τ(NR) was 20.6 ns. The emissive recombination lifetime τ(R) was determined according to the formula: τ(R)=τ(PL)/η, where η is the internal quantum efficiency, and the non-emissive recombination lifetime τ(NR) was determined according to the formula: τ(NR)=τ(PL)/(1−η). As a result, τ(R)<τ(NR).

Figure 14:
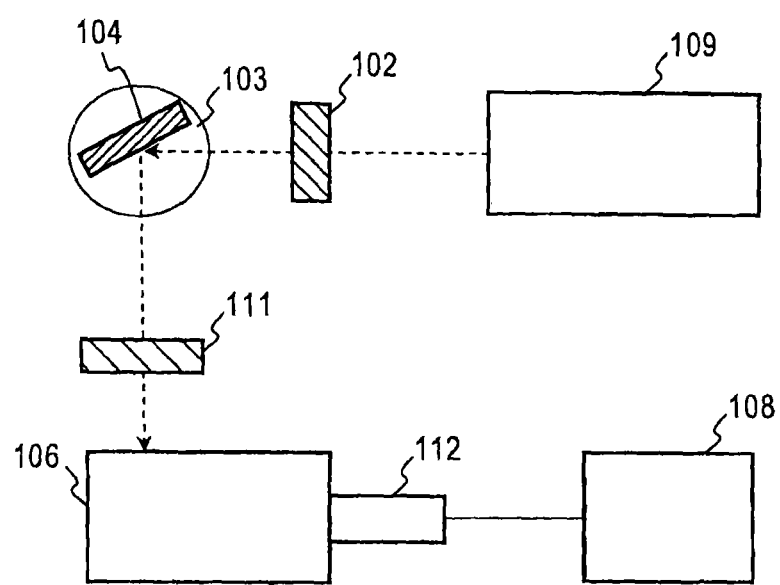
FIG. 14 A block diagram of the optical system used in the time-resolved PL measurement (without a polarizing filter).

FIG. 14 is a block diagram of an optical system used for time-resolved PL measurement (without a polarizing filter), which differs from that shown in FIG. 13 only in that the polarizing filter 110 is not used.

The pulse repetition frequency was 1 kHz, and the pulse width was 120 fs. The tunable pulsed laser light source was composed of a mode-locked Ti:sapphire laser, a Ti:sapphire regenerative amplifier, an optical parametric amplifier and a harmonic generating crystal.

The PL measurement based on selective excitation is effective in directly evaluating the optical quality of a single quantum well layer having a single layer or a plurality of layers and being included in an active layer structure. For example, in order to selectively excite a plurality of quantum well layers, it is necessary to select light having an energy lower than the bandgap of GaN and at the same time, higher than the bandgap of an InGaN quantum well layer. For this reason, the wavelength of the tunable pulsed laser was set to 370 nm.

The pulse energy is adjusted with an ultraviolet ND filter 102 and then irradiated on Sample 104 in a cryostat 103 which can be cooled by liquid He. The PL from Sample 104 is passed through a depolarizer 111, dispersed by a spectroscope 106 and then led to Streakscope 112. In the measurement, the sample temperature was varied from 4 K to 300 K. The pulse energy irradiated on Sample 104 was determined by dividing the power measured with a power meter by the repetition frequency. The pulse energy density per unit area was 510 nJ/cm$^2$.

The value of absorption coefficient α at the excitation wavelength of one quantum well layer included in the nitride semiconductor layer prepared in this experiment is exactly unknown but is considered to be appropriately from $1\times10^4$ to $1\times10^5$ cm$^{-1}$. Assuming that the absorption coefficient α in one quantum well layer is $1\times10^4$ cm$^{-1}$, the average density of excess carriers excited in all quantum well layers included in the nitride semiconductor layer is estimated to be approximately $1\times10^{16}$ cm$^{-3}$. Similarly, when the absorption coefficient α is $5\times10^4$ cm$^{-1}$, the average density of excess carriers excited is estimated to be approximately $5\times10^{16}$ cm$^{-3}$, and when the absorption coefficient α is $1\times10^5$ cm$^1$, the average density of excess carriers excited is estimated to be approximately $1\times10^{17}$ cm$^{-3}$.

Based on the results of the time-resolved PL measurement, the PL intensity was determined by time-integrating the transient response of PL emission from the multi-quantum well at 4 K and further integrated with respect to the emission energy and assuming that the resulting integrated intensity I(4K) is 1, the same integrated intensity I(300K) at 300 K was 60% of I(4K).

Also, the PL lifetime was determined from the transient response (decay curve) of the PL intensity after pulse excitation with respect to time, which was obtained by the time-resolved PL measurement (without a polarizing filter) where the pulse energy density per unit area was set to 510 nJ/cm$^2$ at 300 K. When the PL lifetime is defined as the time from the maximum intensity on the decay curve of the PL intensity to an intensity of 1/e of the maximum intensity, the PL lifetime τ(PL) was 2.5 nsec. Also, the emissive recombination lifetime τ(R) was 4.1 ns, and the non-emissive recombination lifetime τ(NR) was 6.3 ns. The emissive recombination lifetime τ(R) was determined according to the formula: τ(R)=τ(PL)/η, where η is the internal quantum efficiency, and the non-emissive recombination lifetime τ(NR) was determined according to the formula: τ(NR)=τ(PL)/(1−η).

The above-described value of the internal quantum efficiency obtained in this Example is significantly high compared with conventionally known values and in turn, the values of the non-emissive recombination lifetime τ(NR) and PL lifetime τ(PL) are high. These values confirm the high quality of the nitride semiconductor crystal produced by the technique of the present invention. To clarify this matter, the dependency of PL principle and internal quantum efficiency on the excitation light intensity is described below.

Figure 15:
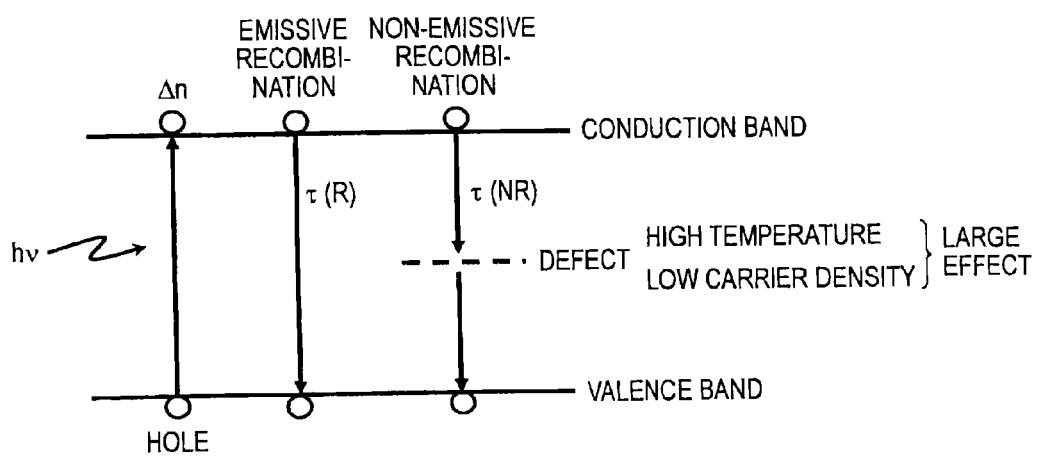
FIG. 15 A band diagram for explaining the emissive recombination and non-emissive recombination occurring in a semiconductor crystal.

FIG. 15 is a band diagram for explaining the emissive recombination and non-emissive recombination which occur in a semiconductor crystal. As shown in the Figure, an electron-hole pair produced by excitation with light having an energy hv is annihilated through either emissive recombination in which they directly recombine between the lower end of a conduction band and the upper end of a valence band to release the energy as light, or non-emissive recombination in which they recombine via a defect level or the like formed in a forbidden band to release the energy as a component other than light (mainly as heat).

The "emissive recombination lifetime $\tau(R)$" in such a process is defined as the time required for the total number of carriers produced by excitation light to decrease to 1/e of the initial number due to emissive recombination, and similarly, the "non-emissive recombination lifetime $\tau(NR)$" is defined as the time required for the total number of produced carriers to decrease to 1/e of the initial number due to non-emissive recombination.

The internal quantum efficiency $\eta$ is represented by $\eta=1/(1+\tau(R)/\tau(NR))$, and as the $\tau(R)$ is shorter and the $\tau(NR)$ is longer, the internal quantum efficiency $\eta$ becomes higher.

The time-resolved PL technique described above is a technique capable of observing the transient response of emission of an electron-hole pair produced by optical pulse excitation. Assuming that the time until the PL emission is decayed and reaches 1/e of the maximum intensity is $\tau(PL)$, the $\tau(PL)$ is determined by competition between emissive recombination and non-emissive recombination and is given by $1/\tau(PL)=1/\tau(R)+1/\tau(NR)$.

In the case where the sample has poor crystallinity a large amount of crystal defects, out of recombinations above, non-emissive recombination is liable to occur. Consequently, $\tau(NR)$ and in turn, $\tau(PL)$ become short.

On the other hand, even when the sample has good crystallinity and the contribution of non-emissive recombination is low, if $\tau(R)$ is short, $\tau(PL)$ becomes short. In the case where the sample has good crystallinity and the amount of crystal defects is small, $\tau(NR)$ and in turn, $\tau(PL)$ become long.

Here, the non-emissive recombination process is a thermal excitation type and therefore, as the temperature is higher, the contribution of the non-emissive recombination process increases. Accordingly, when the measurement is performed by setting the sample temperature to a cryogenic temperature, the contribution (effect) of the non-emissive recombination process is substantially negligible. For this reason, in experimentally determining the internal quantum efficiency $\eta$, the emission intensity at room temperature is often expressed by a relative value to that at a cryogenic temperature, which is taken as 1. Furthermore, as the density of carriers produced is lower, the contribution of the non-emissive recombination process increases. In other words, the non-emissive recombination process is saturated with increase in the carrier density, and the contribution of the non-emissive recombination process is relatively increased, as a result, the internal quantum efficiency $\eta$ tends to become apparently large.

Figure 16:
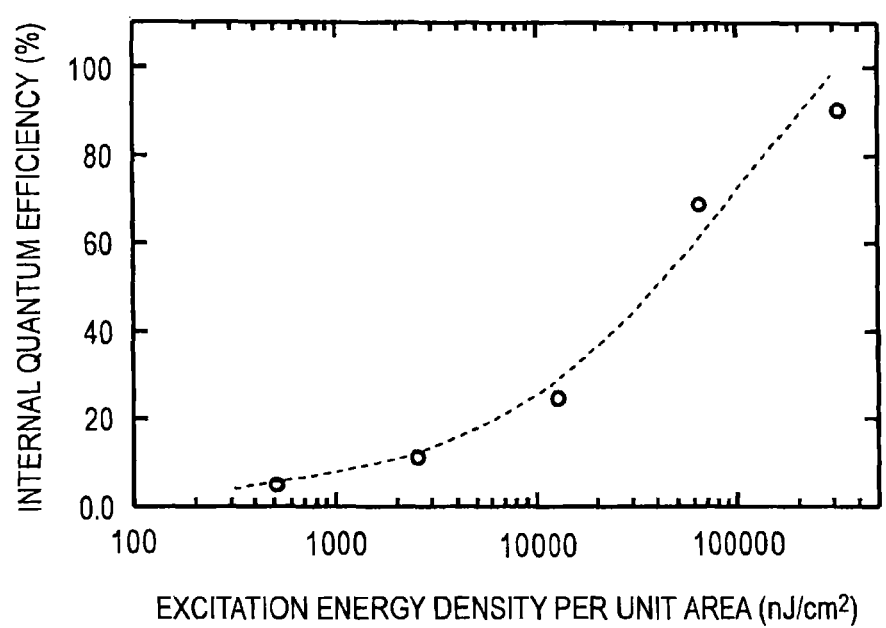
FIG. 16 A diagram showing results when the excitation energy density dependency of the internal quantum efficiency of a multi-quantum well structure excited by an optical pulse is experimentally examined.

FIG. 16 is a diagram showing the results of experimental examination on the excitation energy density dependency of the internal quantum efficiency of a multi-quantum well structure when excited by an optical pulse. As seen from the results shown in this Figure, when the excitation energy density is as low as 500 nJ/cm$^2$, the internal quantum efficiency is very low and on the order of a few %. However, even with the same sample, in the case of a high excitation energy density exceeding 300,000 nJ/cm$^2$, the internal quantum efficiency reaches 90% or more.

These results mean that in order to properly evaluate the superiority/inferiority of crystallinity among samples by the PL method, the measurement must be performed under low excitation energy density conditions where the effect of the non-emissive recombination process is strongly reflected. In other words, it is necessary to set the excitation energy density in the evaluation by the PL method to a low excitation energy density of about 2,000 nJ/cm$^2$ or less and set the density of excess carrier produced by light to a range approximately from the latter half of $10^{16}$ (cm$^{-3}$) to the early half of $10^{17}$ (cm$^{-3}$). In conventional reports, there are no small cases in which PL evaluation is performed under conditions of high excitation energy density, that is, essentially under conditions where the density of photoexcited excess carriers produced in an active layer structure is an excessively high density. However, even when the internal quantum efficiency is determined under such conditions, only an "apparently" high value not reflecting the crystal quality is obtained and this is not proper evaluation of crystallinity.

Accordingly, the PL measurement under low excitation density condition as referred to in the present specification indicates that a nitride semiconductor formed on a principal nitride surface of a base that is nonpolar nitride contains at least a layer capable of being regarded as an optically active layer structure and PL measurement is performed by setting the density of excess carriers produced by light in the active layer structure to approximately from the latter half of $10^{16}$ (cm$^{-3}$) to early half of $10^{17}$ (cm$^{-3}$). In the case where the active layer structure is a multi-quantum well active layer, the measurement under the conditions above indicate that the PL measurement is performed by setting the average photoexcited excess carrier density in all quantum well layers to approximately from the latter half of $10^{16}$ (cm$^{-3}$) to the early half of $10^{17}$ (cm$^{-3}$).

Therefore, for properly evaluating the crystallinity, it is necessary to appropriately change the photoexcitation energy density or photoexcitation power density when the structure of the object to be measured is changed, and thereby reduce the photoexcited excess carrier density in the active layer structure or in the quantum well layer in the case of a multi-quantum well active layer structure.

In this Example, the PL measurement was performed under low excitation energy density conditions, where the CW-PL measurement gives a value of 58% (I(300K)/I(13K) =58%) at an excitation power density of 150 W/cm$^2$ and the time-resolved PL measurement gives a value of 93% (I(300K)/I(4K)=93%) at an excitation energy density of 1400 nJ/cm$^2$ and a value of 60% (I(300K)/I(4K)=60%) at an excitation energy density of 510 nJ/cm$^2$. This fact means that the crystallinity is by far higher than that of conventional nitride semiconductor crystals.

Example 12

This Example is an example where gallium nitride-based semiconductor thin films were grown in a stacked manner by the MOCVD method to fabricate a near ultraviolet light-emitting LED. FIG. 2(G) shows the outline of a series of crystal growth processes. Also, FIG. 3(E) schematically shows the configuration of layers grown.

A (1-100) plane (m-plane) oriented standing GaN substrate was used as the base. The substrate size was 4.0 mm in the c-axis direction and 15 mm in the a-axis direction. As for the electrical characteristics, the substrate was n-type and the carrier density was $7.0\times10^{17}$ cm$^{-3}$. According to X-ray diffraction analysis, the half-width of a rocking curve in (10-12) reflection was 37.5 arcsec, the OFF angle in the c(+) direction was −0.28°, and the OFF angle in the a direction was 0.03°. Also, the dislocation density was $5.0\times10^6$ cm$^{-2}$.

The m-plane standing GaN substrate was placed on a tray (susceptor) in a horizontal quartz-made reacting furnace where normal conditions are growth under atmospheric pressure. The pressure in the reacting furnace was set to 100±2 kPa in all steps.

In the temperature rise step (step A), as the first temperature rise step $t_B$, the temperature was raised while supplying H$_2$ at 10 L/min as a main flow into the reacting furnace. When the base temperature reached 400° C., the second temperature rise step $t_A$ was started, where NH$_3$ was supplied at 7.5 L/min as a gas constituting the first main flow and H$_2$ was supplied at 12.5 L/min as a gas constituting the second main flow.

Thereafter, the substrate temperature was further raised to 1,000° C. while increasing the rates of NH$_3$ and H$_2$ to 10 L/min and 30 L/min, respectively. At this time, the subflow was N$_2$ at 20 L/min and the growth-irrelevant gas for purging or the like was N$_2$ at 19 L/min in total. In the second temperature rise step, the flow rate ratio Fp of the inactive gas component to all gases constituting the main flow was 0 throughout the entire temperature rise step.

In the first growth step (step B), NH$_3$ was supplied at 10 L/min as a gas constituting the first main flow. Also, as gases constituting the second main flow, H$_2$ (40 L/min), TMGa (0.0055 L/min on the condition of a concentration of 100%) with a carrier gas of H$_2$ (0.5 L/min) forming a part of the main flow, and SiH$_4$ ($6\times10^{-7}$ L/min on the condition of a concentration of 100%) with a carrier gas of H$_2$ (0.2 L/min) forming a part of the main flow and a diluent gas of H$_2$ (0.06 L/min) were supplied. At this time, Fp was 0.0. By supplying these gases of the main flow, an Si-doped GaN layer (first nitride semiconductor layer) was grown to a thickness of 40 nm.

In the second growth step (step C), NH$_3$ was supplied at 10 L/min as a gas constituting the first main flow. Also, as gases constituting the second main flow, H$_2$ (40 L/min), TMGa (0.0055 L/min on the condition of a concentration of 100%) with a carrier gas of H$_2$ (0.5 L/min) constituting a part of the main flow, and SiH$_4$ ($6\times10^{-7}$ L/min on the condition of a concentration of 100%) with a carrier gas of H$_2$ (0.2 L/min) forming a part of the main flow and a diluent gas of H$_2$ (0.06 L/min) were supplied. At this time, Fp was 0.0. By supplying these gases of the main flow, an Si-doped GaN layer (second nitride semiconductor layer) was grown to a thickness of 3.96 μm.

The step D in the third step was performed under utterly the same conditions as in Example 9 except for changing the number of periods in MQW to 8.

The step E in the third step was performed under utterly the same conditions as in Example 9.

After the completion of these growth steps, the substrate temperature was lowered, the gases in the reacting furnace were completely replaced with N$_2$ gas, and then, the substrate was taken out and evaluated.

On the surface of the thus-produced substrate, slight unevenness was recognized. When the surface was measured by a contact step meter, Ra=244 nm and roughness to such an extent that interaction with the emission wavelength is liable to occur and a scattering function is expected to develop was naturally formed. As for the PL characteristics evaluated by exciting the substrate with laser light at a wavelength of 325 nm, the peak wavelength was 422 nm, and the integrated intensity thereof was 10.

The HAADF-STEM image of the sample above was observed by the same procedure as in Examples 8 and 9, and the obtained average thicknesses (nm) of respective quantum well layers (w1 to w8) of this comparative sample are shown together in Table 4, where w1 is the average thickness of the quantum well layer on the lowest side (substrate side) and w8 is the average thickness of the quantum well layer on the highest side (surface side). At the same time, the standard deviation and variation coefficient among pixels of each layer are shown together.

TABLE 4

| Quantum Well Layer | Average Thickness (nm) | Standard Deviation of Thickness in Y-Axis Direction (nm) | Variation coefficient |
|---|---|---|---|
| W8 | 4.81 | 0.82 | 0.171 |
| W7 | 5.03 | 0.71 | 0.140 |
| W6 | 4.91 | 0.73 | 0.149 |
| w5 | 4.87 | 0.64 | 0.132 |
| w4 | 4.84 | 0.68 | 0.141 |
| w3 | 4.81 | 0.70 | 0.145 |
| w2 | 4.52 | 0.65 | 0.145 |
| w1 | 4.65 | 0.71 | 0.152 |

Comparative Example 1

This Comparative Example is an example where gallium nitride-based semiconductor thin films were grown in a stacked manner by the MOCVD method to fabricate a near ultraviolet light-emitting LED. FIG. 2(H) shows the outline of a series of crystal growth processes. Also, FIG. 3(E) schematically shows the configuration of layers grown.

A (1-100) plane (m-plane) oriented standing GaN substrate was used as the base. The substrate size was 3.9 mm in the c-axis direction and 15 mm in the a-axis direction. As for the electrical characteristics, the substrate was n-type and the carrier density was $7.4\times10^{17}$ cm$^{-3}$. According to X-ray diffraction analysis, the half-width of a rocking curve in (10-12) reflection was 36.5 arcsec, the OFF angle in the c(+) direction was −0.31°, and the OFF angle in the a direction was 0.02°. Also, the dislocation density was $5.2\times10^6$ cm$^{-2}$.

The m-plane standing GaN substrate was placed on a tray (susceptor) in a horizontal quartz-made reacting furnace where normal conditions are growth under atmospheric pressure. The pressure in the reacting furnace was set to 100±2 kPa in all steps.

The temperature rise step (step A) was performed in the same manner as in Example 12.

Subsequently, when the substrate temperature reached 1,000° C., NH$_3$ and H$_2$ were continuously supplied at 10 L/min and 30 L/min, respectively and by waiting in this state for 15 minutes, cleaning of the substrate surface was effected. The subflow here was N$_2$ gas at 20.0 L/min and the growth-irrelevant gas for purging or the like was N$_2$ at 19 L/min in total. At this time, Fp=0.

In the first growth step (step B), NH$_3$ was supplied at 10 L/min as a gas constituting the first main flow. Also, as gases constituting the second main flow, H$_2$ (40 L/min), TMGa (0.0055 L/min on the condition of a concentration of 100%) with a carrier gas of H$_2$ (0.5 L/min) forming a part of the main flow, and SiH$_4$ ($6\times10^{-7}$ L/min on the condition of a concentration of 100%) with a carrier gas of H$_2$ (0.2 L/min)

forming a part of the main flow and a diluent gas of $H_2$ (0.06 L/min) were supplied. At this time, Fp was 0.0. By supplying these gases of the main flow, an Si-doped GaN layer (first nitride semiconductor layer) was grown to a thickness of 5 nm.

In the second growth step (step C), $NH_3$ was supplied at 10 L/min as a gas constituting the first main flow. Also, as gases constituting the second main flow, $H_2$ (40 L/min), TMGa (0.0055 L/min on the condition of a concentration of 100%) with a carrier gas of $H_2$ (0.5 L/min) constituting a part of the main flow, and $SiH_4$ ($6\times10^{-7}$ L/min on the condition of a concentration of 100%) with a carrier gas of $H_2$ (0.2 L/min) forming a part of the main flow and a diluent gas of $H_2$ (0.06 L/min) were supplied. At this time, Fp was 0.0. By supplying these gases of the main flow, an Si-doped GaN layer (second nitride semiconductor layer) was grown to a thickness of 45 nm.

The step D in the third step was performed in the same manner as in Example 12.

The step E in the third step was performed in the same manner as in Example 12.

After the completion of these growth steps, the substrate temperature was lowered, the gases in the reacting furnace were completely replaced with $N_2$ gas, and then, the substrate was taken out and evaluated.

In the substrate of this Example, Ra was 85 nm and the formed unevenness was small, indicating that the roughness can hardly interact with general light in near ultraviolet or visible region and the light extraction effect of LED fabricated may not be much expected. As for the PL characteristics evaluated by exciting the substrate with laser light at a wavelength of 325 nm, the peak wavelength was 400 nm, and the integrated PL intensity was as very low as 1.

The HAADF-STEM image of the sample above was observed by the same procedure as in Examples 8, 9 and 12, and the obtained average thicknesses (nm) of respective quantum well layers (w1 to w8) of this comparative sample are shown together in Table 5, where w1 is the average thickness of the quantum well layer on the lowest side (substrate side) and w8 is the average thickness of the quantum well layer on the highest side (surface side). At the same time, with respect to the thickness of each layer, the standard deviation and variation coefficient are shown together.

TABLE 5

| Quantum Well Layer | Average Thickness (nm) | Standard Deviation (nm) | Variation coefficient |
|---|---|---|---|
| W8 | 3.62 | 0.51 | 0.142 |
| W7 | 3.87 | 0.49 | 0.127 |

TABLE 5-continued

| Quantum Well Layer | Average Thickness (nm) | Standard Deviation (nm) | Variation coefficient |
|---|---|---|---|
| W6 | 3.90 | 0.48 | 0.123 |
| w5 | 3.97 | 0.46 | 0.116 |
| w4 | 4.02 | 0.54 | 0.134 |
| w3 | 4.04 | 0.47 | 0.115 |
| w2 | 4.05 | 0.49 | 0.122 |
| w1 | 4.12 | 0.50 | 0.122 |

As apparent from the standard deviation and CV value with respect to the thickness of the quantum well layer of Examples 8, 9 and 12 and Comparative Example 1, when Fp is small in the steps B and C, the standard deviation and variation coefficient with respect to the thickness in the Y-axis direction can be made large. The average values of standard deviation and variation coefficient with respect to the thickness in the Y-axis direction of each example are shown together in Table 6.

TABLE 6

| | Standard Deviation (nm) | | | Variation coefficient (average value) | | |
|---|---|---|---|---|---|---|
| Sample | Minimum Value | Average Value | Maximum Value | Minimum Value | Average Value | Maximum Value |
| Example 8 | 0.21 | 0.28 | 0.31 | 0.059 | 0.076 | 0.085 |
| Example 9 | 0.51 | 0.57 | 0.73 | 0.107 | 0.118 | 0.143 |
| Example 12 | 0.64 | 0.71 | 0.82 | 0.132 | 0.146 | 0.171 |
| Comparative Example 1 | 0.46 | 0.49 | 0.54 | 0.115 | 0.125 | 0.142 |

As seen from Table 6, in the sample of Example 8, the average standard deviation of thickness is 0.28 and the average variation coefficient is 0.076, indicating that the thickness fluctuation is extremely small compared with samples of Examples 9 and 12 and Comparative Example 1. A small standard deviation of thickness and a small variation coefficient are preferred in view of internal quantum efficiency. This is clearly seen also from Table 7 later. Accordingly, in order to obtain a relatively high internal quantum efficiency of the quantum well active layer structure part, the standard deviation is preferably 0.45 nm or less, and the variation coefficient is preferably 0.1 or less.

Example 13

In this Example, the light emission characteristics of a multi-quantum well (MQW) layer produced by various crystal growth methods were evaluated by the photoluminescence (PL) method.

FIG. 3(D) is a diagram illustrating the stack structure of the sample used in this Example, and FIG. 2(I) is a diagram for explaining a sequence of the crystal growth method of the sample. In this sample, an InGaN/GaN multi-quantum well active layer structure 13 where the number of periods is 5, is provided in the uppermost layer.

A (1-100) plane (m-plane) oriented standing GaN substrate was used as the base. The substrate size was 4.1 mm in the c-axis direction and 18 mm in the a-axis direction. The substrate was doped with Si, and the Si concentration was $6.2\times10^{17}$ $cm^{-3}$. As for the electrical characteristics, the substrate was n-type and the carrier density was $6.5\times10^{17}$ $cm^{-3}$. According to X-ray diffraction analysis, the half-width of a rocking curve in (10-12) reflection was 32.2 arcsec, the OFF angle in the c(+) direction was −0.125°, and the OFF angle in the a direction was 0.02°. Also, the dislocation density was $5.0 \times 10^6$ cm$^{-2}$.

The m-plane standing GaN substrate was placed on a tray (susceptor) in a horizontal quartz-made reacting furnace where normal conditions are growth under atmospheric pressure, and a quantum well structure was produced.

The pressure in the reacting furnace was set to 100±2 kPa in all steps.

The temperature rise step (step A) was performed in the same manner as in Example 9.

The first growth step (step B) was performed in the same manner as in Example 9.

The second growth step (step C) was performed in the same manner as in Example 9 except for changing the thickness of the second semiconductor layer (Si-doped n-type GaN layer) to 2.5 μm.

The step D in the third step was performed in the same manner as in Example 9.

The step E in the third step was not performed.

After the completion of these growth steps, the substrate temperature was lowered, the gases in the reacting furnace were completely replaced with N$_2$ gas, and then, the substrate was taken out and evaluated.

When the surface of the thus-produced substrate was measured by a contact step meter, Ra=185 nm and roughness to such an extent that interaction with the emission wavelength is liable to occur and a scattering function is expected to develop was naturally formed. As for the PL characteristics evaluated at room temperature by exciting the substrate with laser light at a wavelength of 325 nm, the peak wavelength was 397 nm, and the integrated intensity thereof was 37 in terms of relative value. The internal quantum efficiency and PL emission lifetime of the sample were evaluated in the following manner.

The PL characteristics of the sample having the above-described structure were evaluated. The setup of the optical system used for the evaluation was the same as that described in Example 17. First, the internal quantum efficiency was evaluated by performing CW-PL measurement and time-resolved PL measurement when pulsed light was irradiated.

The optical system was as shown in FIG. 12. Similarly to Example 17, the sample temperature was set to from 13 K to 300 K, and the laser power per unit area on the sample surface was 150 W/cm$^2$. The photoexcited constantly excess carrier density under these conditions was estimated to be from $1 \times 10^{16}$ to $1 \times 10^{17}$ cm$^{-3}$.

Based on the results of this CW-PL measurement, assuming that the integrated intensity I(13K) obtained by integrating the PL intensities from the multi-quantum well at 13 K with respect to the emission energy is 1, the same integrated intensity I(300K) at 300 K was 39% of I(13K).

Subsequently, time-resolved PL measurement (without a polarizing filter) was performed using the setup shown in FIG. 14.

The pulse repetition frequency was 1 kHz, and the pulse width was 120 fs. The wavelength of the tunable pulsed laser was 370 nm, and the pulse energy density per unit area was 510 nJ/cm$^2$.

Based on the results of the time-resolved PL measurement, the PL intensity was determined by time-integrating the transient response of PL emission from the multi-quantum well at 4 K and further integrated with respect to the emission energy and assuming that the resulting integrated intensity I(4K) is 1, the same integrated intensity I(300K) at 300 K was 27% of I(4K).

Also, the PL lifetime was determined from the transient response (decay curve) of the PL intensity after pulse excitation with respect to time, which was obtained by the time-resolved PL measurement (without a polarizing filter) where the pulse energy density per unit area was set to 510 nJ/cm$^2$ at 300 K. The PL lifetime τ(PL) was 1.8 nsec. Also, the emissive recombination lifetime τ(R) was 6.7 ns, and the non-emissive recombination lifetime τ(NR) was 2.4 ns. As a result, τ(R)>τ(NR).

Example 14

In this Example, the light emission characteristics of a multi-quantum well (MQW) layer produced by various crystal growth methods were evaluated by the photoluminescence (PL) method.

FIG. 3(F) is a diagram illustrating the stack structure of the sample used in this Example, and FIG. 2(J) is a diagram for explaining a sequence of the crystal growth method of the sample. In this sample, an InGaN/GaN multi-quantum well active layer structure 13 where the number of periods is 5, is provided in the uppermost layer.

A (1-100) plane (m-plane) oriented standing GaN substrate was used as the base. The substrate size was 4.5 mm in the c-axis direction and 20 mm in the a-axis direction. The substrate was doped with Si, and the Si concentration was $6.2 \times 10^{17}$ cm$^{-3}$. As for the electrical characteristics, the substrate was n-type and the carrier density was $6.5 \times 10^{17}$ cm$^{-3}$. According to X-ray diffraction analysis, the half-width of a rocking curve in (10-12) reflection was 35 arcsec, the OFF angle in the c(+) direction was −0.095°, and the OFF angle in the a direction was 0.03°. Also, the dislocation density was $5.0 \times 10^6$ cm$^{-2}$.

The m-plane standing GaN substrate was placed on a tray (susceptor) in a horizontal quartz-made reacting furnace where normal conditions are growth under atmospheric pressure, and a quantum well structure was produced.

The pressure in the reacting furnace was set to 100±2 kPa in all steps.

The temperature rise step (step A) was performed in the same manner as in Example 12.

The first growth step (step B) was performed in the same manner as in Example 12.

The second growth step (step C) was performed in the same manner as in Example 12 except for changing the thickness of the second semiconductor layer (Si-doped n-type GaN layer) to 2.46 μm.

The step D in the third step was performed in the same manner as in Example 12 except for changing the number of periods in the MQW layer to 5.

The step E in the third step was not performed.

After the completion of these growth steps, the substrate temperature was lowered, the gases in the reacting furnace were completely replaced with N$_2$ gas, and then, the substrate was taken out and evaluated.

When the surface of the thus-produced substrate was measured by a contact step meter, Ra=230 nm and roughness to such an extent that interaction with the emission wavelength is liable to occur and a scattering function is expected to develop was naturally formed. As for the PL characteristics evaluated at room temperature by exciting the substrate with laser light at a wavelength of 325 nm, the peak wavelength was 455 nm, and the integrated intensity thereof was 6 in terms of relative value.

The PL characteristics of the sample having the above-described structure were evaluated. The setup of the optical system used for the evaluation was the same as that described in Example 17. First, the internal quantum efficiency was evaluated by performing CW-PL measurement and time-resolved PL measurement when pulsed light was irradiated.

An optical system shown in FIG. 12 was used. Similarly to Example 16, the sample temperature was set to from 13 K to 300 K, and the laser power per unit area on the sample surface was 150 W/cm$^2$.

The photoexcited constantly excess carrier density under these conditions was estimated to be from $1\times10^{16}$ to $1\times10^{17}$ cm$^{-3}$.

Based on the results of this CW-PL measurement, assuming that the integrated intensity I(13K) obtained by integrating the PL intensities from the multi-quantum well at 13 K with respect to the emission energy is 1, the same integrated intensity I(300K) at 300 K was 46% of I(13K).

Subsequently, time-resolved PL measurement (without a polarizing filter) was performed using the setup shown in FIG. 14.

The pulse repetition frequency was 1 kHz, and the pulse width was 120 fs. The wavelength of the tunable pulsed laser was 370 nm, and the pulse energy density per unit area was 510 nJ/cm$^2$.

Based on the results of the time-resolved PL measurement, the PL intensity was determined by time-integrating the transient response of PL emission from the multi-quantum well at 4 K and further integrated with respect to the emission energy and assuming that the resulting integrated intensity I(4K) is 1, the same integrated intensity I(300K) at 300 K was 36% of I(4K).

Also, the PL lifetime was determined from the transient response (decay curve) of the PL intensity after pulse excitation with respect to time, which was obtained by the time-resolved PL measurement (without a polarizing filter) where the pulse energy density per unit area was set to 510 nJ/cm$^2$ at 300 K. The PL lifetime $\tau$(PL) was 1.7 nsec. Also, the emissive recombination lifetime $\tau$(R) was 4.8 ns, and the non-emissive recombination lifetime $\tau$(NR) was 2.7 ns. As a result, $\tau(R)>\tau(NR)$.

Comparative Example 2

In this Comparative Example, the light emission characteristics of a multi-quantum well (MQW) layer produced by various crystal growth methods were evaluated by the photoluminescence (PL) method.

FIG. 3(F) is a diagram illustrating the stack structure of the sample used in this Comparative Example, and FIG. 2(K) is a diagram for explaining a sequence of the crystal growth method of the sample. In this sample, an InGaN/GaN multi-quantum well active layer structure 13 where an Mg-doped layer is not formed on the MQW structure and the number of periods is 5, is provided in the uppermost layer.

A (1-100) plane (m-plane) oriented standing GaN substrate was used as the base. The substrate size was 4.0 mm in the c-axis direction and 19 mm in the a-axis direction. The substrate was doped with Si, and the Si concentration was $6.2\times10^{17}$ cm$^{-3}$. As for the electrical characteristics, the substrate was n-type and the carrier density was $6.5\times10^{17}$ cm$^{-3}$. According to X-ray diffraction analysis, the half-width of a rocking curve in (10-12) reflection was 31 arcsec, the OFF angle in the c(+) direction was −0.085°, and the OFF angle in the a direction was 0.05°. Also, the dislocation density was $4.9\times10^6$ cm$^{-2}$.

The m-plane standing GaN substrate was placed on a tray (susceptor) in a horizontal quartz-made reacting furnace where normal conditions are growth under atmospheric pressure, and a quantum well structure was produced. The pressure in the reacting furnace was set to 100±2 kPa in all steps. Also, the temperature rise step (step A) was performed in the same manner as in Comparative Example 1.

In the cleaning step, similarly to Comparative Example 1, NH$_3$ and H$_2$ were continuously supplied at 10 L/min and 30 L/min, respectively, after the substrate temperature reached 1,000° C. and by waiting for 15 minutes in this state, cleaning of the substrate surface was effected. The subflow here was N$_2$ gas at 20 L/min and the growth-irrelevant gas for purging or the like was N$_2$ at 19 L/min in total. At this time, Fp=0.0.

The first growth step (step B) was performed in the same manner as in Comparative Example 1.

The second growth step (step C) was performed in the same manner as in Comparative Example 1.

The step D in the third step was performed in the same manner as in Comparative Example 1 except for changing the number of periods in MQW to 5.

The step E in the third step was not performed.

After the completion of these growth steps, the substrate temperature was lowered, the gases in the reacting furnace were completely replaced with N$_2$ gas, and then, the substrate was taken out and evaluated.

When the surface of the thus-produced substrate was measured by a contact step meter, Ra=78 nm and the formed unevenness was small, indicating that the roughness can hardly interact with general light in near ultraviolet or visible region and the light extraction effect of LED fabricated may not be much expected. As for the PL characteristics evaluated by exciting the substrate at room temperature with laser light at a wavelength of 325 nm, the peak wavelength was 433 nm, and the integrated intensity thereof was 3, which reveals very low PL intensity.

The PL characteristics of the sample having the above-described structure were evaluated. The setup of the optical system used for the evaluation was the same as that described in Example 16. First, the internal quantum efficiency was evaluated by performing CW-PL measurement and time-resolved PL measurement when pulsed light was irradiated.

An optical system shown in FIG. 12 was used. Similarly to Example 11, the sample temperature was set to from 13 K to 300 K, and the laser power per unit area on the sample surface was 150 W/cm$^2$.

The photoexcited constantly excess carrier density under these conditions was estimated to be from $1\times10^{16}$ to $1\times10^{17}$ cm$^{-3}$.

Based on the results of this CW-PL measurement, assuming that the integrated intensity I(13K) obtained by integrating the PL intensities from the multi-quantum well at 13 K with respect to the emission energy is 1, the same integrated intensity I(300K) at 300 K was 10% of I(13K).

Subsequently, time-resolved PL measurement (without a polarizing filter) was performed using the setup shown in FIG. 14.

The pulse repetition frequency was 1 kHz, and the pulse width was 120 fs. The wavelength of the tunable pulsed laser was 370 nm, and the pulse energy density per unit area was 510 nJ/cm$^2$.

Based on the results of the time-resolved PL measurement, the PL intensity was determined by time-integrating the transient response of PL emission from the multi-quantum well at 4 K and further integrated with respect to the emission energy and assuming that the resulting integrated intensity I(4K) is 1, the same integrated intensity I(300K) at 300 K was 16% of I(4K).

Also, the PL lifetime was determined from the transient response (decay curve) of the PL intensity after pulse excitation with respect to time, which was obtained by the time-resolved PL measurement (without a polarizing filter) where the pulse energy density per unit area was set to 510 nJ/cm$^2$ at 300 K. The PL lifetime τ(PL) was 0.66 nsec. Also, the emissive recombination lifetime τ(R) was 4.1 ns, and the non-emissive recombination lifetime τ(NR) was 0.78 ns. As a result, τ(R)>τ(NR).

Reference Example 2

In Reference Example 2, the light emission characteristics of a multi-quantum well (MQW) layer produced on a conventionally employed c-plane were evaluated by the photoluminescence (PL) method.

FIG. 3(D) is a diagram illustrating the stack structure of the sample used in this Reference Example, and FIG. 2(L) is a diagram for explaining a sequence of the crystal growth method of the sample. In this sample, an InGaN/GaN multi-quantum well active layer structure 13 where an Mg-doped layer is not formed on the MQW structure and the number of periods is 5, is provided in the uppermost layer. Incidentally, the substrate used for the stack structure shown in FIG. 3(D) is also denoted by reference numeral 10, similarly to the GaN substrate with the principal surface being m-plane.

A (0001) plane (c-plane) oriented standing GaN substrate 10 was used as the base. The substrate size was 48 mm in diameter. The substrate was doped with Si, and the Si concentration was 1.5×10$^{17}$ cm$^{-3}$. As for the electrical characteristics, the substrate was n-type and the carrier density was 1.5×10$^{17}$ cm$^{-3}$. According to X-ray diffraction analysis, the half-width of a rocking curve in (10-12) reflection was 45 arcsec, the OFF angle in the m direction was 0.205°, and the OFF angle in the a direction was 0.310°. Also, the dislocation density was 7.0×10$^6$ cm$^{-2}$.

The c-plane standing GaN substrate was placed on a tray (susceptor) in a horizontal quartz-made reacting furnace where normal conditions are growth under atmospheric pressure, and a quantum well structure was produced.

The temperature rise step (step A) was performed in the same manner as in Example 13.

The first growth step (step B) was performed in the same manner as in Example 13.

The second growth step (step C) was performed in the same manner as in Example 13 except for changing the thickness of the second semiconductor layer (Si-doped n-type GaN layer) to 4 μm.

The step D in the third step was performed in the same manner as in Example 13 except for changing the substrate temperature to 780° C.

The step E in the third step was not performed.

After the completion of these growth steps, the substrate temperature was lowered, the gases in the reacting furnace were completely replaced with N$_2$ gas, and then, the substrate was taken out and evaluated. Incidentally, according to the studies by the present inventors, the growth by such a sequence is a crystal growth method exhibiting best characteristics in the growth on a c-plane GaN substrate.

When the surface of the thus-produced substrate was measured by a contact step meter, Ra=12 nm and the surface was extremely. As for the PL characteristics measured at room temperature by exciting the substrate with laser light at a wavelength of 325 nm, the peak wavelength was 405 nm, and the integrated intensity thereof was 16 in terms of relative value, revealing low PL intensity.

The PL characteristics of the sample having the above-described structure were evaluated. The setup of the optical system used for the evaluation was the same as that described in Example 11. First, the internal quantum efficiency was evaluated by performing CW-PL measurement and time-resolved PL measurement when pulsed light was irradiated.

An optical system shown in FIG. 12 was used. Similarly to Example 16, the sample temperature was set to from 13 K to 300 K, and the laser power per unit area on the sample surface was 150 W/cm$^2$.

The photoexcited constantly excess carrier density under these conditions was estimated to be from 1×10$^{16}$ to 1×10$^{17}$ cm$^{-3}$.

Based on the results of this CW-PL measurement, assuming that the integrated intensity I(13K) obtained by integrating the PL intensities from the multi-quantum well at 13 K with respect to the emission energy is 1, the same integrated intensity I(300K) at 300 K was 9% of I(13K).

Subsequently, time-resolved PL measurement (without a polarizing filter) was performed using the setup shown in FIG. 14.

The pulse repetition frequency was 1 kHz, and the pulse width was 120 fs. The wavelength of the tunable pulsed laser was 370 nm, and the pulse energy density per unit area was 510 nJ/cm$^2$.

Based on the results of the time-resolved PL measurement, the PL intensity was determined by time-integrating the transient response of PL emission from the multi-quantum well at 4 K and further integrated with respect to the emission energy and assuming that the resulting integrated intensity I(4K) is 1, the same integrated intensity I(300K) at 300 K was 5% of I(4K).

Also, the PL lifetime was determined from the transient response (decay curve) of the PL intensity after pulse excitation with respect to time, which was obtained by the time-resolved PL measurement (without a polarizing filter) where the pulse energy density per unit area was set to 510 nJ/cm$^2$ at 300 K. The PL lifetime τ(PL) was 1.2 nsec. Also, the emissive recombination lifetime τ(R) was 21.9 ns, and the non-emissive recombination lifetime τ(NR) was 1.3 ns. As a result, τ(R)>τ(NR).

The measurement results of PL samples (MQW) of Examples 11, 13 and 14, Comparative Example 2 and Reference Example 2 are shown together in Table 7 below. With respect to a pair of Example 11 and Example 8, a pair of Example 13 and Example 9, a pair of Example 14 and Example 12, and a pair of Comparative Example 2 and Comparative Example 1, the former is a sample where a stack up to the quantum well active layer structure part was produced, and the latter is a sample where an LED structure containing a stack up to a layer of another conductivity type, that is, a layer grown by doping Mg, was fabricated. Here, the paired samples, that is, a sample where a stack up to a quantum well active layer structure part was produced, and a sample where an LED structure was fabricated, are samples produced fundamentally under the same growth conditions, though some portions such as the total number of quantum well layers are different.

TABLE 7

| PL Sample (MQW) | Internal Quantum Efficiency, CW: % | Internal Quantum Efficiency, pulse: % | PL Lifetime τ(PL): ns | Emissive Recombination Lifetime τ(R): ns | Non-Emisive Recombination Lifetime τ(NR): ns |
|---|---|---|---|---|---|
| Example 11 | 58 | 60 | 2.5 | 4.1 | 6.3 |
| Example 13 | 39 | 27 | 1.8 | 6.7 | 2.4 |
| Example 14 | 46 | 36 | 1.7 | 4.8 | 2.7 |
| Comparative Example 2 | 10 | 16 | 0.66 | 4.1 | 0.78 |
| Reference Example 2 | 9 | 5 | 1.2 | 21.9 | 1.3 |

As seen from Table 7, in Examples 11, 13 and 14, the internal quantum efficiency was 58%, 39% and 46%, respectively, in the CW measurement, and 60%, 27% and 36%, respectively, in the pulse measurement, whereas in Comparative Example 2 and Reference Example 2, the internal quantum efficiency was as low as 10% and 9%, respectively. These results indicate that in the crystal growth sequence of the present invention, the portion related to the growth start time greatly affects even the characteristics of the active layer formed subsequently. For enhancing the LED characteristics, higher internal quantum efficiency is better and when it is 20% or more, LED having good characteristics can be realized. Also, the PL lifetime (τ(PL)) is very long in Examples 11, 13 and 14 compared with Comparative Example 2 and Reference Example 2. This is also a result of reflecting good optical quality. The PL lifetime is preferably 1.5 nanoseconds (ns) or more.

The τ(R) is roughly about 4 ns and there is no large difference among Examples and Comparative Example using m-plane except for Example 13, but τ(R) on c-plane is extremely long. This is because an electron and a hole, contributing to light emission, are spatially separated due to the QCSE effect, which is disadvantageous in view of emission efficiency. This result indicates that by using the nonpolar m-plane for the substrate, radiation is efficiently realized. That is, in order to obtain high emission efficiency of a light-emitting element fabricated, it is effective to grow a nitride semiconductor crystal on a nonpolar principal nitride surface.

Furthermore, τ(NR) of Example 11 is extremely long among Examples and Comparative Example using m-plane. This indicates that the number of carriers annihilated without contributing to light emission is small. As for the magnitude relationship between τ(R) and τ(NR) in Examples and Comparative Example, a relationship of τ(R)<τ(NR) is established only in Example 16, and this indicates that carriers generated effectively contribute to light emission. That is, for realizing a quantum well active layer structure part having high internal quantum efficiency, τ(R)<τ(NR) is preferred.

The results obtained by measuring the samples of Examples, Comparative Example, Reference Examples and the like described above for the surface roughness by means of a contact step meter to determine the centerline average roughness (Ra), and the relative values of the integrated intensity in the PL characteristics evaluated by exciting the substrate with laser light at a wavelength of 325 nm, are summarized here.

As for the pair of Example 8 and Example 11, the pair of Example 9 and Example 13, the pair of Example 12 and Example 14, and the pair of Comparative Example 2 and Comparative Example 1, the former is a sample where an LED structure containing a stack up to a layer of another conductivity type, that is, a layer grown by doping Mg, was fabricated, and the latter is a sample where a stack up to the quantum well active layer structure part was produced. Here, the "paired" samples, that is, a sample where an LED structure was fabricated, and a sample where a stack up to a quantum well active layer structure part was produced, are samples produced fundamentally under the same growth conditions, though some portions such as the total number of quantum well layers are different. Also, some results of Reference Example are shown together.

The results of epitaxial growth of an LED structure are shown together in Table 8, and the results of growth up to a quantum well active layer structure part are shown together in Table 9.

TABLE 8

| (LED) | Ra | PL Intensity |
|---|---|---|
| Example 8 | 4.7 nm | 89 |
| Example 9 | 210 nm | 11 |
| Example 12 | 244 nm | 10 |
| Comparative Example 1 | 85 nm | 1 |

TABLE 9

| (MQW) | Ra | PL Intensity |
|---|---|---|
| Example 11 | 4.8 nm | 195 |
| Example 13 | 185 nm | 37 |
| Example 14 | 230 nm | 6 |

As for the results in Tables 8 and 9, each result is understood as follows.

The results of Example 8 and Example 11 are understood that in the case of obtaining a relatively high internal quantum efficiency of the quantum well active layer structure part, because of excellent surface flatness of the epitaxial layer, it is difficult to intentionally form adequate unevenness in a self-forming manner on the nitride semiconductor layer surface or the like, as a result, Ra takes a relatively small value.

In general, as shown in FIG. 16, regarding the internal quantum efficiency, as the excitation density is higher, that is, as the density of excess carriers produced or injected in the quantum well is higher, the emissive recombination efficiency increases. High internal quantum efficiency exhibited in a weak excitation state indicates remarkably excellent crystal quality, but considering that the current injection for actually driving LED creates an environment having a very high injected carrier density far more than $1\times10^{20}$ $(cm^{-3})$, even when the internal quantum efficiency under low excitation density condition is remarkably excellent, this has a moderate effect on the enhancement of emission efficiency of LED. Accordingly, the characteristics required of the quantum well structure or epitaxial layer are considered to ensure crystal quality not lower than the minimum.

For example, in the case of forming a reflective p-side electrode on the epitaxial layer surface to fabricate a flip chip-type LED or the like or in the case of fabricating a vertical conduction-type LED or the like having one electrode on the side with no epitaxial layer of a nitride nonpolar plane base and another electrode on the side with an epitaxial layer of the nonpolar plane base and having a portion where current injection is performed nearly perpendicularly to the stack plane of the active layer structure part, the effect of high internal quantum efficiency or PL intensity is clearly recognized. However, even when the internal quantum efficiency is markedly excellent, this has a moderate effect on the enhancement of emission efficiency of LED fabricated using the epitaxial layer, and the level of the effect on the emission efficiency of LED is considered to be limited.

In view of light extraction, it is understood as follows. Light falling within the critical angle of light determined by the refractive index difference between a surrounding medium and a medium containing a light-emitting portion can be extracted, but the effect of scattering or the like is small on a flat surface and therefore, the light extraction efficiency is considered to be in a moderate level.

Accordingly, the overall emission efficiency of LED fabricated using such a nitride semiconductor is considered to be in a moderate level.

The results of Example 9 and Example 13 and the results of Example 12 and Example 14 are considered to be obtained because adequate unevenness can be intentionally formed in a self-forming manner on the nitride semiconductor layer surface while keeping the internal quantum efficiency of the quantum well active layer structure part to an appropriate range.

When Tables 7, 8 and 9 are comprehensively reviewed, the results of Examples 9, 12, 13 and 14 show a sufficiently good value in terms of internal quantum efficiency or PL intensity, compared with Comparative Examples 1 and 2 where the stack is formed on a nonpolar plane. The value is good even when compared with the results on a polar plane of Reference Example 2. Accordingly, it is understood that the crystal quality not lower than the minimum, which is required of the epitaxial layer when fabricating LED, is sufficiently ensured. For example, in Table 7, the internal quantum efficiency of Example 14 is larger than that in Comparative Example 2 or Reference Example 2.

Therefore, for example, in the case of forming a reflective p-side electrode on the epitaxial layer surface to fabricate a flip chip-type LED or the like or in the case of fabricating a vertical conduction-type LED or the like having one electrode on the side with no epitaxial layer of a nitride nonpolar plane base and another electrode on the side with an epitaxial layer of the nonpolar plane base and having a portion where current injection is performed nearly perpendicularly to the stack plane of the active layer structure part, it can be said that such a quantum well layer is assured of sufficient quality.

On the other hand, in view of light extraction, it is understood as follows. In Examples 9, 12, 13 and 14, the nitride semiconductor layer surface has unevenness of approximately from 150 to 250 nm, and this unevenness can successfully interact with the wavelength of general light in the near ultraviolet or visible region and develop a scattering function. In particular, the unevenness is close in its physical size to near ultraviolet light in a wavelength region preferably usable in the present invention, specifically, light at a wavelength from near 370 nm to about 430 nm, and is expected to advantageously develop a high scattering effect.

Accordingly, the overall emission efficiency of LED fabricated using such a nitride semiconductor is considered to be high.

Finally, as for the results of Comparative Examples 1 and 2, the thickness of the second nitride semiconductor layer is as thin as 45 nm and therefore, it is understood that sufficient unevenness is not formed and at the same time, the internal quantum efficiency or PL intensity is low.

Using such a nitride semiconductor, for example, in the case of forming a reflective p-side electrode on the epitaxial layer surface to fabricate a flip chip-type LED or the like or forming a transmissive p-side electrode to fabricate a vertical conduction-type LED or the like, even when the density of excess carriers produced or injected in the quantum well is high, the quality thereof is understood to be insufficient. Also, unevenness formed is small and can hardly interact with general light in the ultraviolet, near ultraviolet or visible region, and the light extraction effect of LED fabricated cannot be much expected.

Accordingly, the overall emission efficiency of LED fabricated using such a nitride semiconductor is considered to be low.

Example 15

This Example is an example where gallium nitride-based semiconductor thin films were grown in a stacked manner by the MOCVD method to fabricate a near ultraviolet light-emitting LED. The outline of a series of crystal growth processes is as shown in FIG. 2(M). Also, FIG. 3(G) schematically shows the configuration of layers grown.

A (1-100) plane (m-plane) oriented standing GaN substrate was used as the base. The substrate size was 3.8 mm in the c-axis direction and 22 mm in the a-axis direction. As for the electrical characteristics, the substrate was n-type and the carrier density was $6.5 \times 10^{17}$ cm$^{-3}$.

According to X-ray diffraction analysis, the half-width of a rocking curve in (10-12) reflection was 34.2 arcsec, the OFF angle in the c(+) direction was 0.25°, and the OFF angle in the a direction was 0.03°. Also, the dislocation density was $5.0 \times 10^6$ cm$^{-2}$.

The m-plane standing GaN substrate was placed on a tray (susceptor) in a horizontal quartz-made reacting furnace where normal conditions are growth under atmospheric pressure. The pressure in the reacting furnace was set to 100±2 kPa in all steps.

The temperature rise step (step A) was performed in the same manner as Example 1.

In the first growth step (step B), NH$_3$ was supplied at 10 L/min as a gas constituting the first main flow. Also, as gases constituting the second main flow, N$_2$ at 29.0 L/min, H$_2$ at 1.0 L/min, and TMGa (0.0018 L/min on the condition of a concentration of 100%) with a carrier gas of H$_2$ (0.5 L/min) forming a part of the main flow were supplied into the reacting furnace. Furthermore, Cp$_2$Mg ($7 \times 10^{-6}$ L/min on the condition of a concentration of 100%) with a carrier gas of H$_2$ (0.5 L/min) forming a part of the main flow was supplied into the reacting furnace. By supplying these gases of the main flow, an Mg-doped GaN layer (first nitride semiconductor layer) with a doping concentration of $2 \times 10^{19}$ cm$^{-3}$ was grown to a thickness of 40 nm.

At this time, the subflow was a mixed gas (20.5 L/min) of NH$_3$ (0.5 L/min) and N$_2$ (20 L/min) and the growth-irrelevant gas for purging or the like was N$_2$ at 19 L/min. The flow rate ratio Fp of the active gas component to all gases constituting the main flow during the growth of the first nitride semiconductor layer was 0.72500.

The second growth step (step C), the step D in the third step, and the step E in the third step were performed under the same conditions as those in Example 1.

The surface of the thus-produced substrate was very flat. The surface was measured by a contact step meter to determine the average roughness or centerline average roughness (Ra) indicative of the degree of unevenness. As a result, Ra of the substrate of this Example was 4.9 nm. As for the PL characteristics evaluated by exciting the substrate with laser light at a wavelength of 325 nm, the peak wavelength was 391 nm, the integrated intensity thereof was as very high as 86 in terms of relative value, and the standard deviation of wavelength distribution in plane was as small as 0.8%.

Example 16

This Example is an example where gallium nitride-based semiconductor thin films were grown in a stacked manner by the MOCVD method to fabricate a near ultraviolet light-emitting LED. The outline of a series of crystal growth processes is as shown in FIG. 2(N). Also, FIG. 3(A) schematically shows the configuration of layers grown.

A (1-100) plane (m-plane) oriented standing GaN substrate was used as the base. The substrate size was 4.0 mm in the c-axis direction and 21 mm in the a-axis direction. As for the electrical characteristics, the substrate was n-type and the carrier density was $6.4 \times 10^{17}$ cm$^{-3}$. According to X-ray diffraction analysis, the half-width of a rocking curve in (10-12) reflection was 41.0 arcsec, the OFF angle in the c(+) direction was 0.09°, and the OFF angle in the a direction was 0.02°. Also, the threading dislocation density was $5.0 \times 10^6$ cm$^{-2}$.

The m-plane standing GaN substrate was placed on a tray (susceptor) in a horizontal quartz-made reacting furnace where normal conditions are growth under atmospheric pressure. The pressure in the reacting furnace was set to 100±2 kPa in all steps.

The temperature rise step (step A) was performed in the same manner as in Example 4.

Subsequently, the first growth step (step B), the second growth step (step C), the step D in the third step, and the step E in the third step were performed all in the same manner as in Example 4 except for changing TMGa to TEGa at the same flow rate.

After the completion of these growth steps, the substrate temperature was lowered, the gases in the reacting furnace were completely replaced with N$_2$ gas, and then, the substrate was taken out and evaluated.

The surface of the thus-produced substrate was very flat. The surface was measured by a contact step meter to determine the average roughness or centerline average roughness (Ra) indicative of the degree of unevenness.

As a result, Ra of the substrate of this Example was 3.0 nm. As for the PL characteristics evaluated by exciting the substrate with laser light at a wavelength of 325 nm, the peak wavelength was 391 nm, the integrated intensity thereof was as very high as 95 in terms of relative value, and the standard deviation of wavelength distribution in plane was as small as 0.4%.

Example 17

This Example is an example where only a single layer of gallium nitride-based semiconductor thin film was grown by the MOCVD method, and this is performed to exactly evaluate the growth temperature dependency of flatness of the epitaxial layer. The outline of a series of crystal growth processes is as shown in FIG. 2(O). Also, FIG. 3(H) schematically shows the configuration of layers grown.

Two sheets of (1-100) plane (m-plane) oriented standing GaN substrate were used as the base. These are designated as Sample X and Sample Y.

The size of the substrate used for production of Sample X was 4.1 mm in the c-axis direction and 12 mm in the a-axis direction. As for the electrical characteristics, the substrate was n-type and the carrier density was $6.6 \times 10^{17}$ cm$^{-3}$. According to X-ray diffraction analysis, the half-width of a rocking curve in (10-12) reflection was 34.2 arcsec, the OFF angle in the c(+) direction was 0.25°, and the OFF angle in the a direction was 0.03°. Also, the dislocation density was $5.0 \times 10^6$ cm$^{-2}$.

The size of the substrate used for production of Sample Y was 4.1 mm in the c-axis direction and 12 mm in the a-axis direction. As for the electrical characteristics, the substrate was n-type and the carrier density was $6.6 \times 10^{17}$ cm$^{-3}$. According to X-ray diffraction analysis, the half-width of a rocking curve in (10-12) reflection was 34.2 arcsec, the OFF angle in the c(+) direction was 0.25°, and the OFF angle in the a direction was 0.03°. Also, the dislocation density was $5.0 \times 10^6$ cm$^{-2}$.

Each of these m-plane standing GaN substrates was placed on a tray (susceptor) in a horizontal quartz-made reacting furnace where normal conditions are growth under atmospheric pressure. The pressure in the reacting furnace was set to 100±2 kPa in all steps.

As for Sample X, the growth was performed in the same manner as Example 1 except for changing the thickness of the first nitride semiconductor layer in the first growth step to 0.25 µm and completing the epitaxial growth only by the first growth step. As for Sample Y, the growth was performed in the same manner as Example 1 except for setting the achieving temperature in the temperature rise step to 920° C., changing the thickness of the first nitride semiconductor layer in the first growth step to 0.25 µm, and completing the epitaxial growth only by the first growth step.

Figure 17A:
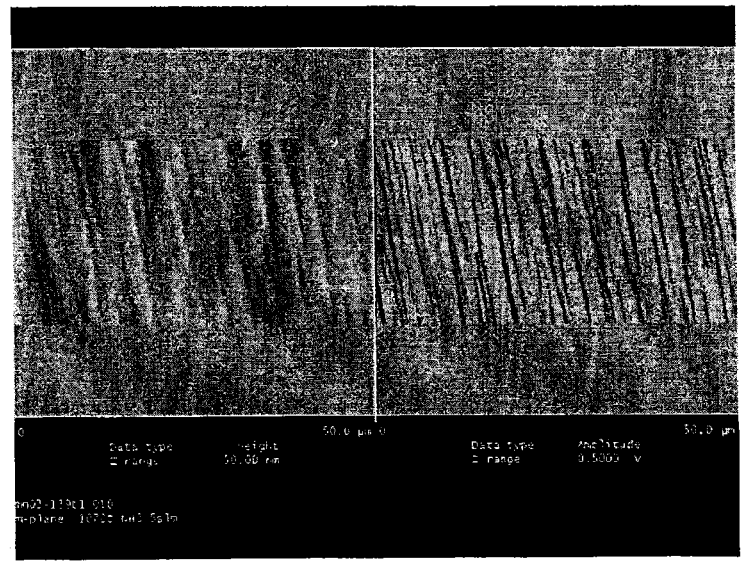
FIG. 17(A) A surface AFM (atomic force microscopy) image of Nitride Semiconductor Sample X in Example 17.
Figure 17B:
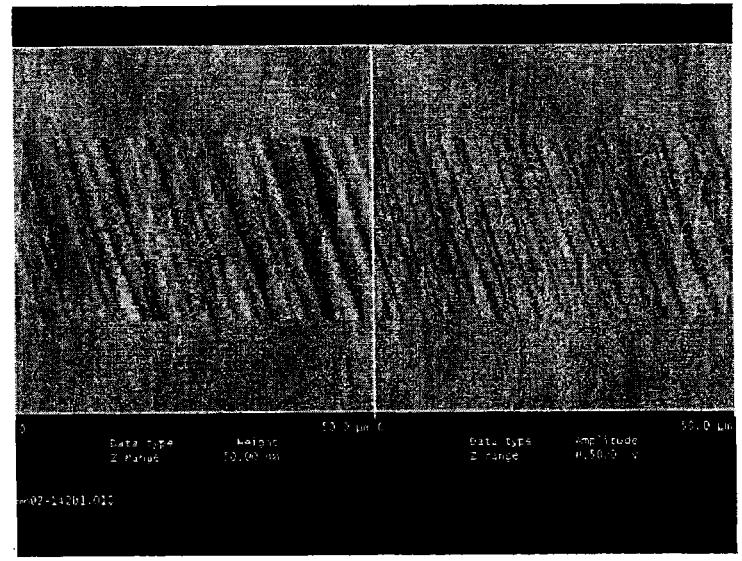
FIG. 17(B) A surface AFM (atomic force microscopy) image of Nitride Semiconductor Sample Y in Example 17.

The surface of each of the thus produced Samples X and Y was observed by an optical microscope and found to be very flat in both samples. In order to closely examine the surface flatness of two samples, the surface morphology was evaluated using AFM (atomic force microscope). FIGS. 17(A) and 17(B) show the results. FIG. 17(A) is the AFM image of Sample X, and FIG. 17(B) is the AFM image of Sample Y. As apparent from these AFM images, Sample Y is superior in the surface flatness. The Ra (centerline average roughness) value required by AFM and indicative of the degree of unevenness was a moderate value of 1.303 in Sample X and was an extremely small value of 0.093 nm in Sample Y. Also, the Rmax (maximum height) value was a moderate value of 7.469 nm in Sample X and was an extremely small value of 0.851 nm in Sample Y.

Example 18

In this Example, with respect to a near ultraviolet light-emitting LED fabricated by the crystal growth technique of the present invention, light emission of the multi-quantum well active layer structure in the epitaxial layer was compared between before and after performing heat annealing as a post-temperature-drop-step activation step, by PL measurement. Specifically, PL immediately after the completion of the third step was measured, the epitaxial wafer formed on a nonpolar plane was subjected to heat annealing as a post-temperature-drop-step activation step so as to cause a part of the doped Mg atom to act as an acceptor, and then, PL measurement was performed. The annealing conditions were 700° C. and 5 minutes in an $N_2$ atmosphere.

Three samples were used here. The growth conditions were the same as those in Example 1 except for the achieving temperature in the temperature rise of the step A and the temperature and thickness of InGaN quantum well in the steps B and C. The surface morphology of these samples was extremely flat. The achieving temperature in temperature rise of the step A, and the growth temperature and thickness of InGaN quantum well layer in the steps B and C are as shown in Table 10 below.

TABLE 10

| Sample | Achieving Temperature in Temperature Rise of Step A (° C.) | Substrate Temperature in Steps B and C (° C.) | Width of InGaN Quantum Well (nm) |
|---|---|---|---|
| Sample X | 1000 | 1000 | 4 |
| Sample Y | 920 | 920 | 4 |
| Sample Z | 920 | 920 | 12 |

Figure 18:
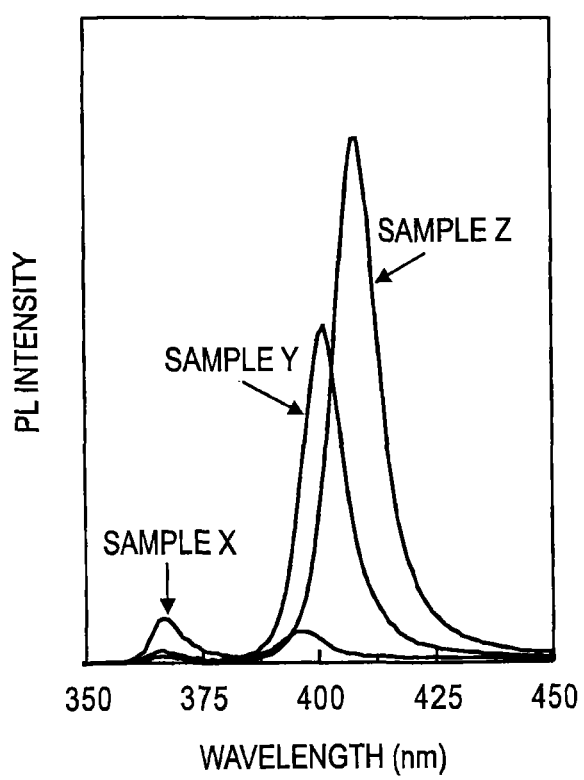
FIG. 18 Results of the PL measurement in Example 18.

FIG. 18 shows PL spectra of Samples X, Y and Z after heat annealing performed as a post-temperature-rise-step activation step. In all of samples X, Y, and Z, the PL intensity is reduced due to annealing. The cause of the reduction in the PL intensity induced by the thermal annealing process includes both effects of change in the band structure and deterioration of the crystallinity, which occur in the vicinity of the active layer structure upon activation of Mg. In this case, the former effect is on the same level and therefore, the extent of reduction in the PL intensity is thought to be more strongly reflecting the latter effect. The extent of reduction increases in the order of Z, Y and X. Particularly, in Sample X, the PL emission from the quantum well layer is significantly decreased after annealing but the band-edge emission at near 365 nm from the GaN bulk layer is instead outstanding, whereas in Samples Y and Z, a good PL spectrum shape is maintained.

Usually, the growth temperature most suitable for growing i-GaN or n-GaN to a large thickness on a c-plane GaN crystal is in the vicinity of 1,000° C., and crystal growth at a lower temperature than that involves reduction in the crystallinity and further in the emission intensity of the active layer structure formed thereon. However, as described above, in the case of growing a crystal on a base having a nonpolar principal surface, when a thick-film crystal is grown at a temperature (920° C.) 100° C. or more lower than in general conditions, not only the emission intensity can be greatly increased but also reduction in the PL intensity due to annealing can be suppressed. In addition, by the method according to the present invention where a first nitride semiconductor layer, a second nitride semiconductor layer, furthermore, a quantum well active layer structure and a nitride semiconductor layer containing a dopant capable of p-type conversion are formed in a very flat manner on a nonpolar plane, the quantum well layer can be increased in the thickness and thanks to the synergistic effect with annealing, an epitaxial layer having excellent optical characteristics can be formed.

In this connection, an epitaxial growth structure formed on a nonpolar plane and experienced annealing was subjected to a device fabrication process and fabricated into LED having an emission wavelength of about 410 nm. The results obtained are shown together in Table 11.

TABLE 11

| Sample | Ratio of Total Radiant Flux of LED |
|---|---|
| Sample X | 1 |
| Sample Y | 1.4 |
| Sample Z | 2 |

As seen in Table 11, the relative ratio of total radiant flux compared by introducing the same current value is 1.4 in Sample Y and 2 in Sample Z, on the assumption that the ratio in Sample X is 1. The growth temperature most suitable for growing i-GaN or n-GaN to a large thickness on a c-plane GaN crystal is in the vicinity 1,000° C., and crystal growth at a lower temperature than that involves reduction in the crystallinity and further in the emission intensity of the active layer structure formed thereon.

However, as described above, in the case of growing a crystal on a base having a nonpolar principal surface, when a thick-film crystal is grown at a temperature (920° C.) 100° C. or more lower than in general conditions, not only the emission intensity can be greatly increased but also reduction in the PL intensity due to annealing can be suppressed, as a result, the device characteristics of LED are remarkably enhanced. Furthermore, in the case of growing a crystal on a base with the principal surface being a nonpolar plane according to the present invention, the threading dislocation density of the epitaxial layer is overwhelmingly lower than in the case of other methods and therefore, good optical characteristics can be realized also in an InGaN/GaN multiquantum well active layer structure with a relatively low In concentration.

In addition, it is considered that thanks to a nonpolar plane and a region with a relatively low In concentration, the InGaN quantum well layer can be increased in the thickness and the characteristics of LED having a film thickness exceeding 10 nm can be strikingly good. Moreover, because of an epitaxial layer produced by such a method, good activation of Mg is thought to be realized even under annealing conditions involving serious deterioration in other structures.

Example 19

This Example is an example where gallium nitride-based semiconductor thin films were grown in a stacked manner by the MOCVD method to fabricate a near ultraviolet light-emitting LED. The outline of a series of crystal growth processes is as shown in FIG. 2(A), and the configuration of layers grown is as shown in FIG. 3(A).

A (1-100) plane (m-plane) oriented standing GaN substrate was used as the base. The substrate size was 4.4 mm in the c-axis direction and 23 mm in the a-axis direction. As for the electrical characteristics, the substrate was n-type and the carrier density was $4.5 \times 10^{17}$ $cm^{-3}$. According to X-ray diffraction analysis, the half-width of a rocking curve in (10-12) reflection was 43.3 arcsec, the OFF angle in the c(+) direction was 0.04°, and the OFF angle in the a direction was 0.02°. Also, the threading dislocation density was $5.0 \times 10^6$ $cm^{-2}$.

The m-plane standing GaN substrate was placed on a tray (susceptor) in a horizontal quartz-made reacting furnace where normal conditions are growth under atmospheric pressure. The pressure in the reacting furnace was set to 100±2 kPa in all steps.

The temperature rise step (step A), the first growth step (step B), the second growth step (step C), and the step D in the third step were performed in the same manner as those for Sample Z in Example 18.

In the subsequent step E of the third step, first, the substrate temperature was set to 980° C. and an Mg-doped $Al_{0.1}Ga_{0.9}N$ layer was formed to a thickness of 100 nm. At this time, the gas constituting the first main flow was $NH_3$ (10 L/min).

Also, the gases constituting the second main flow were $H_2$ (80 L/min), trimethylaluminum (TMAl) (0.0001 L/min) with a carrier gas of $H_2$ (0.5 L/min) forming a part of the main flow, TMGa (0.0018 L/min) with a carrier gas of $H_2$ (0.5 L/min) forming a part of the same main flow, and cyclopentadienyl magnesium ($Cp_2Mg$) ($4 \times 10^{-6}$ L/min) with a carrier gas of $H_2$ (0.5 L/min) forming a part of the same main flow.

On the Mg-doped $Al_{0.1}Ga_{0.9}N$ layer, an Mg-doped $Al_{0.03}Ga_{0.97}N$ layer was further epitaxially grown to a thickness of 15 nm. The growth of this GaN layer was performed by reducing the rate of TMAl among the gases in the main flow to 0.00003 L/min.

In the step E, the subflow was a mixed gas at 50.5 L/min of $NH_3$ (0.5 L/min) and $N_2$ (50 L/min) and the growth-irrelevant gas for purging or the like was $N_2$ (19 L/min). The flow rate ratio Fp of the inactive gas component to all gases constituting the main flow was 0.0.

After the completion of these growth steps, TMGa, TMAl, $Cp_2Mg$ and $H_2$ in the main flow were cut off, and $N_2$ was introduced at 20 L/min. At the same time, the flow rate of $NH_3$ was reduced from 10 L/min to 50 cc/min. Also, $NH_3$ in the subflow was cut off, and the flow rate of $N_2$ was set to 10 L/min. The growth-irrelevant flow was not changed.

Simultaneously with changeover of these gases, the heater power for heating the substrate was shut off, and the substrate was forcibly cooled by the gas introduced. When the substrate temperature was lowered to 930° C., $NH_3$ in the main flow was cut off, and the substrate was continuously cooled to 100° C. or less in the $N_2$ atmosphere. After the substrate was sufficiently cooled, the substrate was taken out and evaluated.

The surface of the thus-produced substrate had good flatness, though there was very slight unevenness. The surface was measured by a contact step meter to determine the centerline average roughness (Ra). As a result, Ra of the substrate of this Example was 8.8 nm. As for the PL characteristics evaluated by exciting the substrate with laser light at a wavelength of 325 nm, the peak wavelength was 410 nm, the integrated intensity thereof was as very high as 93 in terms of relative value, and the standard deviation of wavelength distribution in plane was as small as 0.7%.

Thereafter, the epitaxially grown layer on a nonpolar plane prepared by the method above was processed to fabricate an LED. Both the light emission characteristics and the current-voltage characteristics of the device were satisfied, and it was confirmed that good optical characteristics and sufficient Mg activation were realized by the post-temperature-drop-step activation step.

Example 20

In this Example, with respect to the near ultraviolet light-emitting LED structure which was fabricated by the crystal growth method of the present invention and observed in Example 10, observation by an ultrahigh voltage transmission electron microscope was performed a large number of times to determine the threading dislocation density in the epitaxial layer and active layer structure formed on a nonpolar GaN substrate. At this time, the sample was prepared so that 8 visual field portions could be observed. The observed samples and observation conditions were prepared in the same manner as in Example 9 except that a region of 12.6 μm along the substrate surface was observed and the thickness of the thin section in the observation visual field was set to about 1.0 μm. The observation was performed by electron beam transmission of 1,000 KV.

As a result, five dislocations propagating in the m-axis direction were recognized in total in the epitaxial growth portion including the active layer portion. Based on this result, the average threading dislocation density according to the present invention was estimated to be $5/(12.6 \text{ μm} \times 1.0 \text{ μm} \times 8) = 4.96 \times 10^6$ ($cm^{-2}$).

In one visual field, a sample in which the dislocation was not recognized at all and a sample in which maximally three dislocations were recognized, were mixed. Therefore, in the present invention, even by envisaging a highest threading dislocation density, the dislocation density realized in an epitaxial layer is estimated to be $3/(12.6 \text{ μm} \times 1.0 \text{ μm}) = 2.42 \times 10^7$ ($cm^{-2}$). As a result, it can be said that the density of threading dislocations existing in the epitaxial layer of the present invention is preferably $3 \times 10^7$ ($cm^{-2}$) or less, more preferably $5.0 \times 10^6$ ($cm^{-2}$) or less.

In the foregoing specification, the present invention has been described by referring to Examples, but these Examples are exemplary only for carrying out the present invention and the present invention is not limited thereto. In Examples, AlN, InN, BN or a mixed crystal thereof may substitute for GaN. Also, the growth temperature, the supplied amount of each raw material, the film thicknesses of each layer, and the like may be changed according to purpose.

Although Examples above include a sample where unevenness is recognized on the surface of a nitride semiconductor layer obtained by crystal growth and the surface morphology itself is not necessarily good, the surface unevenness to such an extent is considered to enhance the light extraction efficiency and emission efficiency of a light-emitting device fabricated. That is, such a morphology is not in a level deviating from the scope of the allowable range. With respect to this point, as described above, the present inventors understand that the emission efficiency is dependent not only on the internal quantum efficiency but also on the light extraction efficiency. In other words, it is considered that while the crystallinity of a nitride semiconductor layer having surface unevenness is generally in a moderate level and tends to decrease the internal quantum efficiency, this surface unevenness produces an effect of effectively scattering light from an active layer region and in turn, enhancing the emission efficiency.

In the step of epitaxially growing the above-described stack structure containing an active layer, when introducing a dopant capable of p-type conversion into a part of the stack structure, the portion into which the dopant is introduced can be appropriately set and, for example, may be the entire stack structure or may be only an upper, lower or central part. Examples of the dopant capable of p-type conversion include magnesium, zinc, carbon and beryllium.

In addition, the epitaxial growth step of the stack structure containing an active layer may be performed under the conditions in which the dopant capable of p-type conversion is activated, or following the epitaxial growth step of the stack structure containing an active layer, at least either one processing step of heat annealing or electron beam irradiation for activating the dopant capable of p-type conversion may be further performed.

The base for use in the present invention may be a substrate obtained by depositing a nitride crystal with the principal surface being a nonpolar plane, on a sapphire substrate, a ZnO substrate, an Si substrate, an SiC substrate, a GaAs substrate, a GaP substrate, a $Ga_2O_3$ substrate, a Ge substrate, an MgO substrate or the like.

It is evident from the foregoing description that various modifications of these Examples are included in the scope of the present invention and various other Examples can be made within the scope of the present invention.

This application is based on Japanese Patent Application (Japanese Patent Application No. 2008-297177) filed on Nov. 20, 2008, the contents of which are incorporated herein by way of reference.

INDUSTRIAL APPLICABILITY

According to the present invention, a high-quality nitride semiconductor ensuring good optical characteristics and high emission efficiency of a light-emitting element fabricated is provided.

DESCRIPTION OF REFERENCE NUMERALS AND SIGNS

1 Quartz reaction tube
2 Susceptor
3 Base
4 Stainless-made chamber
10 GaN Substrate
11 First nitride semiconductor layer (GaN layer)
12 Second nitride semiconductor layer (Si-doped n-type GaN layer)
13 InGaN/GaN Multi-quantum well active layer structure
14 Mg-Doped AlGaN layer
15 Mg-Doped GaN layer
101 He—Cd Laser
102 ND Filter
103 Cryostat
104 Sample
105 λ/4 Wavelength plate
106 Spectroscope
107 Light amplifier
108 Control computer
109 Pulsed laser light source
110 Polarizing filter
111 Depolarizer
112 Streakscope

The invention claimed is:

1. A nitride semiconductor comprising:
a nitride semiconductor part having a first conductivity;
a quantum well active layer structure part; and
a nitride semiconductor part having a second conductivity, said second conductivity being a conductivity opposite of said first conductivity, which are stacked in this order on a nitride principal surface of a base,
wherein the principal nitride surface of the base is a nonpolar nitride surface,
wherein said nitride semiconductor part having a first conductivity comprises a first nitride semiconductor layer and a second nitride semiconductor layer, which are stacked in this order,
wherein said second nitride semiconductor layer has a thickness of 400 nm to 20 µm and has a nonpolar outermost surface,
wherein a photoluminescence lifetime (τ(PL)) of said quantum well active layer structure part, as determined by time-resolved PL measurement at room temperature under low excitation density condition, is 1.0 ns or more, and
wherein said base is a GaN self-supporting substrate.

2. The nitride semiconductor as claimed in claim 1, wherein the photoluminescence lifetime (τ(PL)) is 1.5 ns or more.

3. The nitride semiconductor as claimed in claim 1, wherein the internal quantum efficiency of said quantum well active layer structure part, as determined by CW-PL measurement under low excitation density condition, is 20% or more.

4. The nitride semiconductor as claimed in claim 1, wherein the internal quantum efficiency of said quantum well active layer structure part, as determined by pulsed PL measurement under low excitation density condition, is 20% or more.

5. The nitride semiconductor as claimed in claim 1, wherein said first conductivity is n-type conductivity and said second conductivity is p-type conductivity.

6. The nitride semiconductor as claimed in claim 1, wherein the nitride principal surface of said base is a crystal plane with ±10° or less from the (1-100) plane (m-plane).

7. The nitride semiconductor as claimed in claim 1, wherein the silicon (Si) concentration in said first nitride semiconductor layer is $1 \times 10^{21}$ cm$^{-3}$ or less.

8. The nitride semiconductor as claimed in claim 1, wherein the silicon concentration in said second nitride semiconductor layer is from $1 \times 10^{17}$ to $6 \times 10^{19}$ cm$^{-3}$.

9. The nitride semiconductor as claimed in claim 1, wherein the thickness $L_1$ of said first nitride semiconductor layer is from 0.1 to 300 nm.

10. The nitride semiconductor as claimed in claim 1, wherein a first internal quantum efficiency of said quantum well active layer structure part, as determined by CW-PL measurement under low excitation density condition, is 30% or more.

11. The nitride semiconductor as claimed in claim 1, wherein a first internal quantum efficiency of said quantum well active layer structure part, as determined by CW-PL measurement under low excitation density condition, is 35% or more.

12. The nitride semiconductor as claimed in claim 1, wherein a second internal quantum efficiency of said quantum well active layer structure part, as determined by pulsed PL measurement under low excitation density condition, is 20% or more.

13. The nitride semiconductor as claimed in claim 1, wherein a second internal quantum efficiency of said quantum well active layer structure part, as determined by pulsed PL measurement under low excitation density condition, is 25% or more.

14. The nitride semiconductor as claimed in claim 1, wherein the photoluminescence lifetime (τ(PL)) is more than 1.8 ns.

* * * * *